(12) United States Patent
Lin et al.

(10) Patent No.: US 11,587,905 B2
(45) Date of Patent: Feb. 21, 2023

(54) MULTI-CHIP PACKAGE AND MANUFACTURING METHOD THEREOF

(71) Applicant: Industrial Technology Research Institute, Hsinchu (TW)

(72) Inventors: Yu-Min Lin, Hsinchu County (TW); Ang-Ying Lin, Tainan (TW); Sheng-Tsai Wu, Taoyuan (TW); Chao-Jung Chen, Hsinchu County (TW); Tzu-Hsuan Ni, Hsinchu (TW); Shin-Yi Huang, Hsinchu County (TW); Yuan-Yin Lo, Kaohsiung (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 17/065,527

(22) Filed: Oct. 8, 2020

(65) Prior Publication Data
US 2021/0111153 A1    Apr. 15, 2021

Related U.S. Application Data

(60) Provisional application No. 62/912,664, filed on Oct. 9, 2019.

(30) Foreign Application Priority Data

Dec. 31, 2019  (TW) .................................. 108148493
Sep. 3, 2020  (TW) .................................. 109130122

(51) Int. Cl.
*H01L 25/065*    (2006.01)
*H01L 23/31*    (2006.01)
(Continued)

(52) U.S. Cl.
CPC ........ *H01L 25/0652* (2013.01); *H01L 21/563* (2013.01); *H01L 23/3128* (2013.01);
(Continued)

(58) Field of Classification Search
CPC ....... H01L 25/065–0657; H01L 23/538; H01L 23/5383–5384; H01L 24/97; H01L 2224/97; H01L 23/481
See application file for complete search history.

(56) References Cited

U.S. PATENT DOCUMENTS 8,946,900 B2  2/2015  Qian et al.
9,190,380 B2  11/2015  Teh et al.
(Continued)

FOREIGN PATENT DOCUMENTS

| CN | 104900613 | 9/2015 |
|---|---|---|
| TW | M546016 | 7/2017 |
| WO | 2019032322 | 2/2019 |

OTHER PUBLICATIONS

Zhiguo Qian, et al., "Electrical Analysis of EMIB Packages." 2018 IEEE 27th Conference on Electrical Performance of Electronic Packaging and Systems, Oct. 14-17, 2018, pp. 7-9.
(Continued)

*Primary Examiner* — Bradley Smith
*Assistant Examiner* — William Henry Anderson
(74) *Attorney, Agent, or Firm* — JCIPRNET

(57) ABSTRACT

A multi-chip package and a manufacturing method thereof are provided. The multi-chip package includes a redistribution circuit structure; a first semiconductor chip disposed on the redistribution structure and having a first active surface on which a first conductive post is disposed; a second semiconductor chip disposed above the first semiconductor chip and having a second active surface on which a first conductor is disposed; and a first encapsulant disposed on the redistribution circuit structure and encapsulating at least the first semiconductor chip, wherein the first conductive post and the first conductor are aligned and bonded to each
(Continued)

other to electrically connect the first semiconductor chip and the second semiconductor chip.

8 Claims, 81 Drawing Sheets

(51) Int. Cl.
    *H01L 25/00*     (2006.01)
    *H01L 21/56*     (2006.01)
    *H01L 23/538*     (2006.01)

(52) U.S. Cl.
    CPC .......... *H01L 23/5383* (2013.01); *H01L 25/50* (2013.01); *H01L 2225/06548* (2013.01)

(56) References Cited

U.S. PATENT DOCUMENTS

| | | |
|---|---|---|
| 10,217,720 B2 | 2/2019 | Wang et al. |
| 11,018,080 B2 * | 5/2021 | Weerasekera ........... H01L 25/50 |
| 2013/0062761 A1 | 3/2013 | Lin et al. |
| 2014/0353823 A1 * | 12/2014 | Park .................... H01L 23/3128 |
| | | 257/737 |
| 2015/0357318 A1 * | 12/2015 | Chen ....................... H01L 25/50 |
| | | 438/107 |
| 2017/0053897 A1 * | 2/2017 | Lai ....................... H01L 23/5385 |
| 2018/0061741 A1 | 3/2018 | Beyne |
| 2018/0068978 A1 | 3/2018 | Jeng et al. |
| 2018/0286824 A1 * | 10/2018 | Jeng ........................ H01L 24/20 |
| 2018/0350737 A1 | 12/2018 | Starkston et al. |
| 2018/0374825 A1 * | 12/2018 | Seo ...................... H01L 23/3185 |
| 2020/0035591 A1 * | 1/2020 | Hu ............................ G01R 3/00 |
| 2020/0286847 A1 * | 9/2020 | Liu ......................... H01L 24/19 |

OTHER PUBLICATIONS

Ravi Mahajan, et al., "Embedded Multi-die Interconnect Bridge (EMIB)—A High Density, High Bandwidth Packaging Interconnect." 2016 IEEE 66th Electronic Components and Technology Conference, May 31-Jun. 3, 2016, pp. 557-565.

Office Action of Taiwan Counterpart Application, dated Apr. 29, 2021, pp. 1-7.

\* cited by examiner

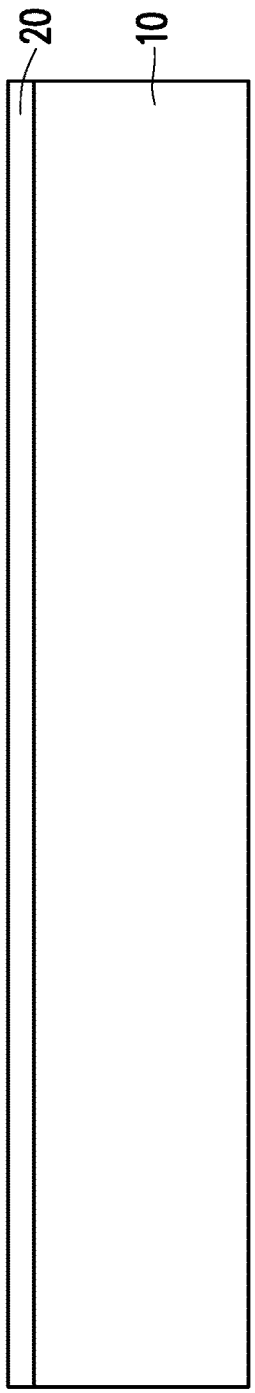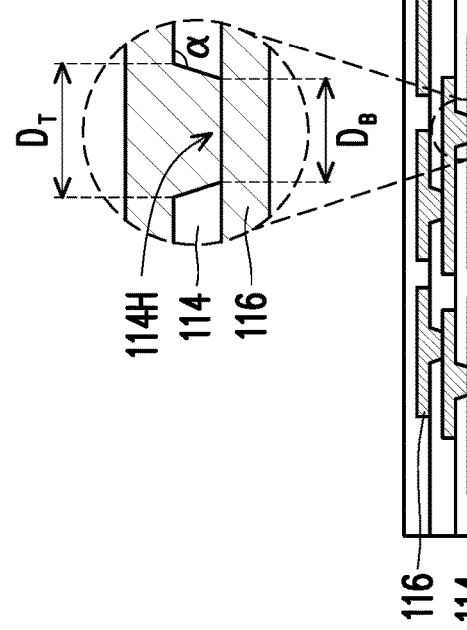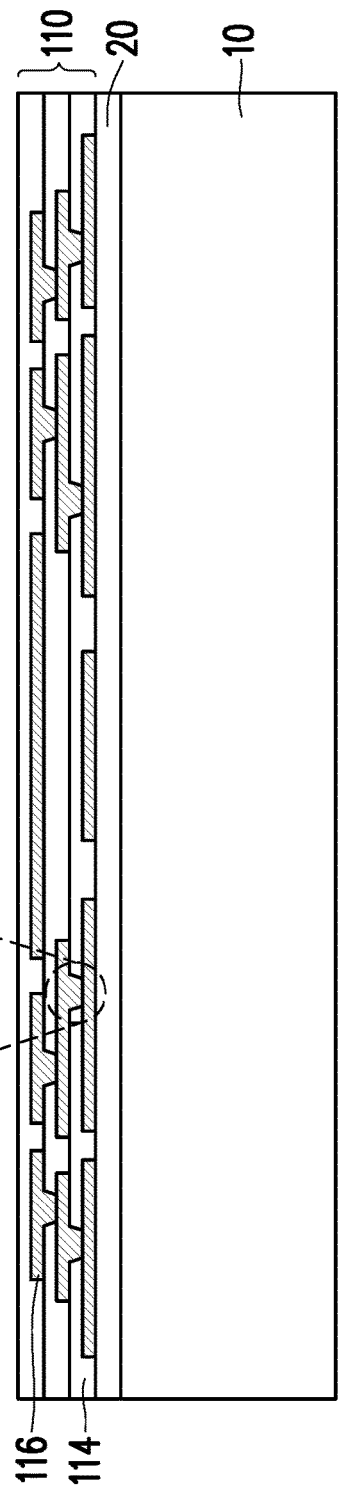

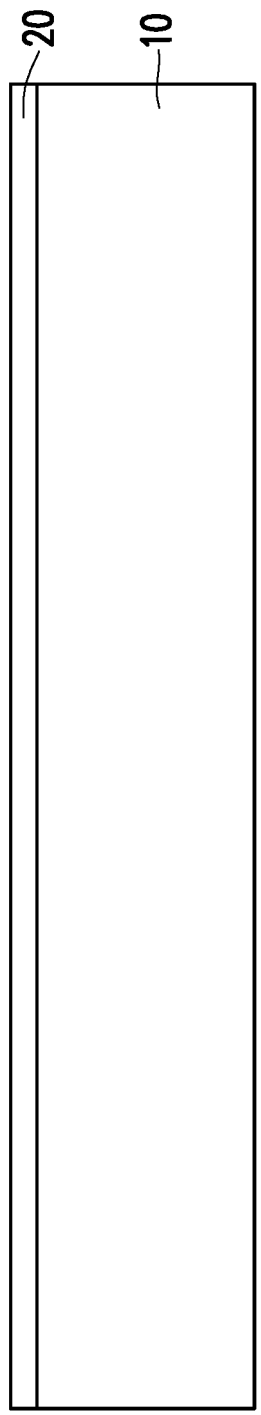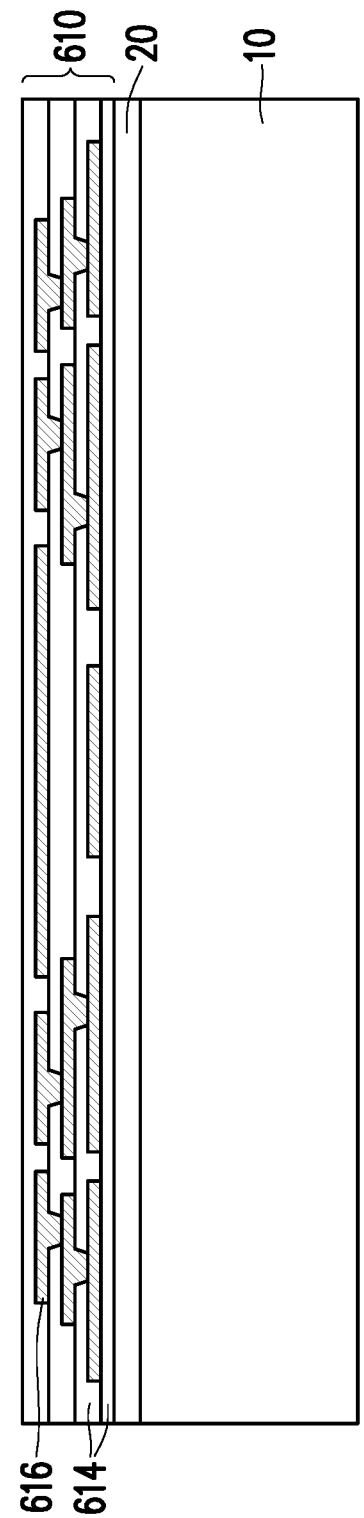
FIG. 9A
FIG. 9B

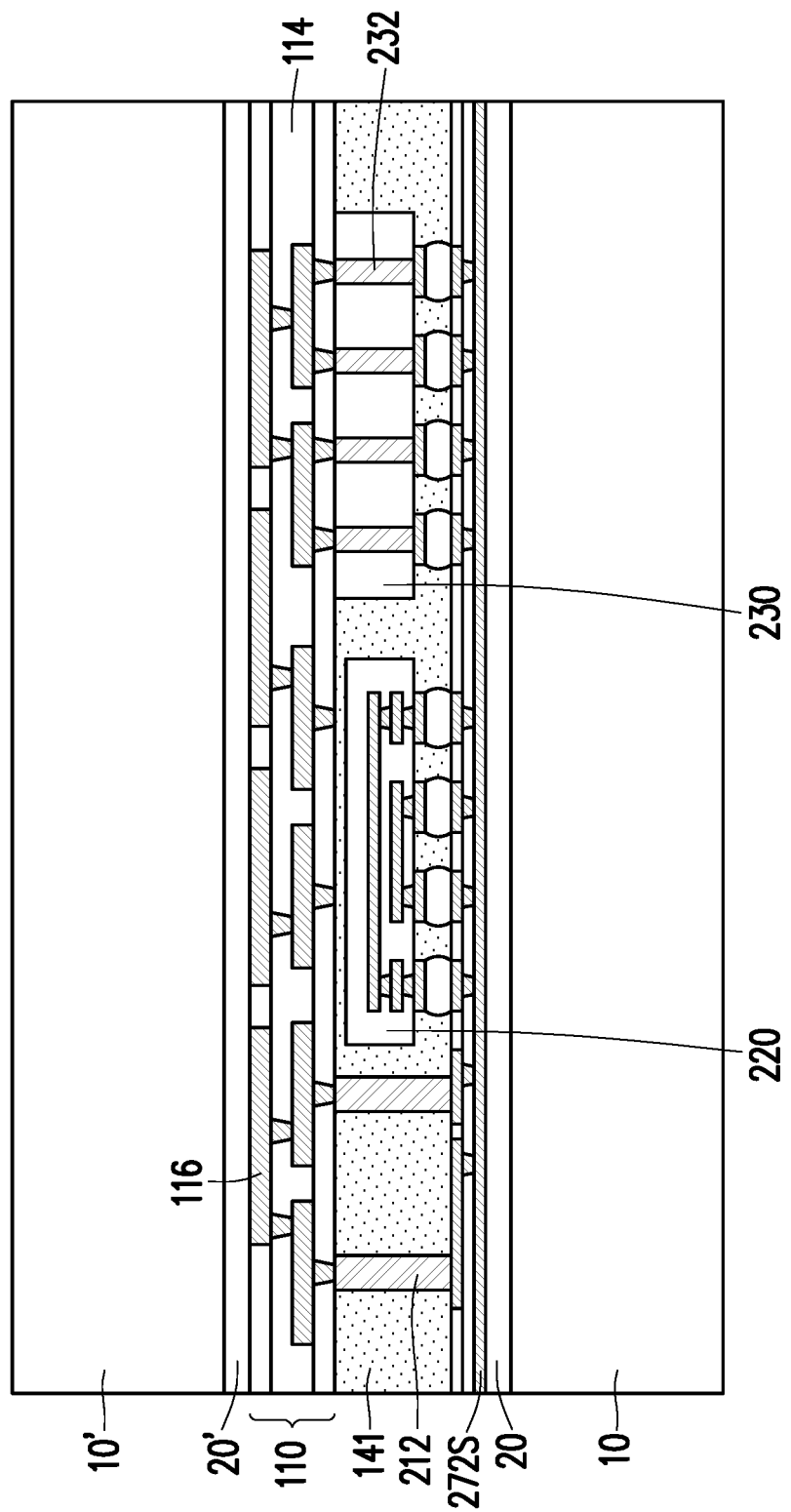

MULTI-CHIP PACKAGE AND MANUFACTURING METHOD THEREOF

CROSS-REFERENCE TO RELATED APPLICATION

This application claims the priority benefits of U.S. provisional application Ser. No. 62/912,664, filed on Oct. 9, 2019, Taiwan application serial no. 108148493, filed on Dec. 31, 2019, and Taiwan application serial no. 109130122, filed on Sep. 3, 2020. The entirety of each of the above-mentioned patent applications is hereby incorporated by reference herein and made a part of this specification.

TECHNICAL FIELD

The disclosure relates to a semiconductor package and a manufacturing method thereof, and relates to a multi-chip package and a manufacturing method thereof.

BACKGROUND

In order for the semiconductor package to have a thin and light volume and high-performance at the same time, current packaging technology has tried to integrate multiple semiconductor chips into a single semiconductor package to form a multi-chip package or to stack multiple semiconductor packages with 3D stacking technology to form a package on package (PoP) structure. However, the speed of signal communication between multiple semiconductor chips in conventional multi-chip package is limited, so the overall performance of the semiconductor package still needs to be further improved.

SUMMARY

The disclosure provides a multi-chip package including a redistribution circuit structure, a first semiconductor chip, a second semiconductor chip, and a first encapsulant. The first semiconductor chip has a first active surface and a first back surface opposite to the first active surface. A first conductive post is disposed on the first active surface. The first semiconductor chip is disposed on the redistribution circuit structure and the first back surface faces the redistribution circuit structure. The second semiconductor chip is disposed above the first semiconductor chip and has a second active surface. A first conductor is disposed on the second active surface. The first conductor overlaps with the first semiconductor chip in a direction perpendicular to the second active surface. The first encapsulant is disposed on the redistribution circuit structure and encapsulates at least the first semiconductor chip, wherein the first conductive post and the first conductor are aligned and bonded to each other to electrically connect the first semiconductor chip and the second semiconductor chip.

The disclosure provides a multi-chip package including a first redistribution circuit structure, multiple lower semiconductor chips, an upper semiconductor chip, a first encapsulant, and a second encapsulant. The multiple lower semiconductor chips respectively have a first active surface and a first back surface opposite to the first active surface. A first conductor is disposed on the first active surface. The multiple lower semiconductor chips are disposed side by side on the first redistribution circuit structure. The first back surface faces the first redistribution circuit structure. The upper semiconductor chip is disposed above the multiple lower semiconductor chips and has a second active surface disposed with a first conductive post. The first conductive post of the upper semiconductor chip and the first conductor of the multiple lower semiconductor chips are aligned and bonded. The first conductor overlaps with the upper semiconductor chip in a direction perpendicular to the second active surface. The first encapsulant is disposed on the first redistribution circuit structure and encapsulates at least a portion of the multiple lower semiconductor chips. The second encapsulant is disposed on the first encapsulant and encapsulates the upper semiconductor chip.

The disclosure provides a multi-chip package including an interposer connection structure, a conductive post, a first lower semiconductor chip, a second lower semiconductor chip, a first upper semiconductor chip, and a second upper semiconductor chip. The interposer connection structure has a first surface and a second surface opposite to the first surface and includes a conductive pattern. The conductive post is disposed on the first surface of the interposer connection structure and is electrically connected to the conductive pattern. The first lower semiconductor chip and the second lower semiconductor chip are disposed side by side on the first surface of the interposer connection structure and are electrically connected to the conductive pattern. The first upper semiconductor chip and the second upper semiconductor chip are disposed side by side on the second surface of the interposer connection structure and are electrically connected to the conductive pattern. The first upper semiconductor chip overlaps with the first lower semiconductor chip and the conductive post in a direction perpendicular to the first surface of the interposer connection structure, and the second upper semiconductor chip overlaps with both of the first lower semiconductor chip and the second lower semiconductor chip in the direction perpendicular to the first surface of the interposer connection structure.

The disclosure provides a manufacturing method of a multi-chip package, which includes the following steps. A first semiconductor chip is disposed on the redistribution circuit structure so that a first active surface of the first semiconductor chip is opposite to a surface of the first semiconductor chip immediately adjacent to the redistribution circuit structure. A first conductive post is disposed on the first active surface of the first semiconductor chip. A first encapsulant is disposed on the redistribution circuit structure to encapsulate the first semiconductor chip. A portion of the first encapsulant is removed so that the first conductive post is exposed from the first encapsulant. A second semiconductor chip is disposed above the first semiconductor chip so that a first conductor on the second active surface of the second semiconductor chip and the first conductive post are aligned and bonded, wherein the first conductor overlaps with the first semiconductor chip in a direction perpendicular to the second active surface.

The disclosure provides a manufacturing method of a multi-chip package, which includes the following steps. A first semiconductor chip is disposed on a carrier substrate so that a first active surface of the first semiconductor chip is opposite to a surface of the first semiconductor chip immediately adjacent to the carrier substrate. A first conductor and a second conductor are disposed on the first active surface of the first semiconductor chip. A first encapsulant is disposed on the carrier substrate to encapsulate the first semiconductor chip. A portion of the first encapsulant is removed so that the first conductor and the second conductor are exposed from the first encapsulant. A second semiconductor chip is disposed above the first semiconductor chip so that a first conductive post on a second active surface of the second semiconductor chip and the first conductor are aligned and bonded. The first conductor overlaps with the second semiconductor chip in a direction perpendicular to the second active surface. An underfill is disposed between the first encapsulant and the second active surface of the second semiconductor chip to encapsulate the first conductive post. A second encapsulant is disposed on the first encapsulant to encapsulate the second semiconductor chip. A portion of the second encapsulant is removed to expose a surface of the second semiconductor chip opposite to the second active surface. A redistribution circuit structure is disposed on the second encapsulant. Finally, the carrier substrate is removed.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 1A to FIG. 1I are cross-sectional views of steps of a manufacturing process for manufacturing a multi-chip package according to an embodiment of the disclosure.

FIG. 9A to FIG. 9I are cross-sectional views of steps of a manufacturing process for manufacturing a multi-chip package according to an embodiment of the disclosure.

DETAILED DESCRIPTION OF DISCLOSED EMBODIMENTS

Figure 1C:
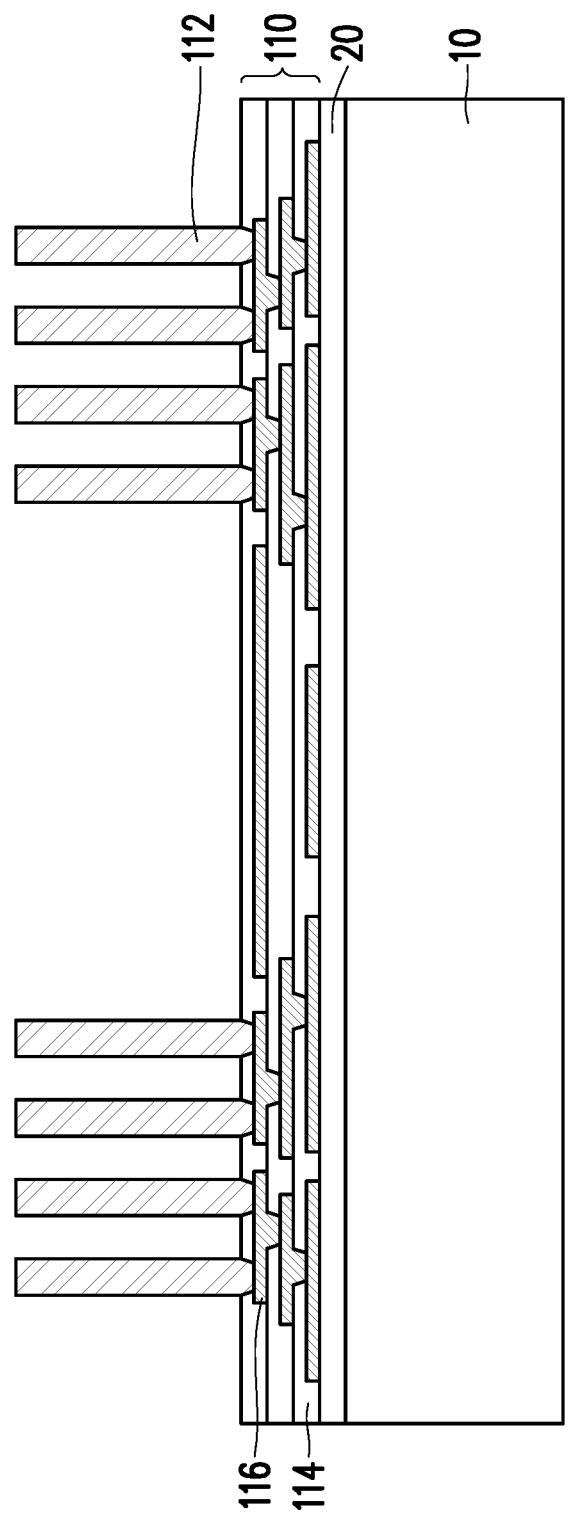

The embodiments are exemplified in detail below with the accompanying drawings, but the embodiments provided are not intended to limit the scope of the disclosure. In addition, the drawings are for illustration purposes only and are not drawn according to the original size. Also, different film layers or regions may be enlarged or reduced to be displayed in a single drawing. Moreover, although the text uses "first", "second", etc. to describe different elements, regions and/or components, the elements, regions and/or components should not be limited by the terms. Rather, the terms are only used to distinguish one element, region, or component from another element, region, or component. Therefore, a first element, region, or component discussed below may be referred to as a second element, region, or component without departing from the teachings of the embodiments. The same or similar reference numerals indicate the same or similar elements, which will not be reiterated in the following paragraphs.

In the text, spatially relative terms such as "upper" and "lower" are defined with reference to the drawings. Therefore, it should be understood that the term "upper surface" may be used interchangeably with the term "lower surface". Also, when an element such as a layer or film is described as being disposed on another element, the element may be directly placed on the other element or an intermediate element may be present between the two elements. On the other hand, when an element is described as being directly disposed on another element, there is no intermediate element between the two elements. Similarly, when an element is described as being connected to another element, the element may be directly connected to the other element or an intermediate element may be present between the two elements. On the other hand, when an element is described as being directly connected to another element, there is no intermediate element between the two elements.

FIG. 1A to FIG. 1I are cross-sectional views of steps of a manufacturing process for manufacturing a multi-chip package according to an embodiment of the disclosure. FIG. 2 is a cross-sectional view illustrating a multi-chip package according to an embodiment of the disclosure.

Referring to FIG. 1A, a carrier 10 is provided. A release film 20 is formed on the carrier 10. The carrier 10 may be a supporting substrate used during a semiconductor chip packaging process. The material of the carrier 10 may include glass, ceramic, semi-conductor, etc. Although it is shown in the drawing that a single multi-chip package is packaged on the carrier 10, the carrier 10 may also be a large-size wafer type carrier. In other words, multiple multi-chip packages may be formed on the carrier 10 at the same time. The release film 20 may be formed from an adhesive (for example, an ultra-violet (UV) glue, a light-to-heat conversion (LTHC) glue, or other types of adhesives). Taking the release film 20 formed from the UV glue as an example, an UV light may be irradiated on the release film 20, so that viscosity of the release film 20 is lost or reduced, thereby enabling the carrier 10 and the release film 20 to be separated from a structure formed in subsequent steps. Taking the LTHC glue as an example, light of appropriate energy may be irradiated on the release film 20, so that the release film 20 is decomposed under the heat energy of the light and viscosity of the release film 20 is lost or reduced, thereby enabling the carrier 10 and the release film 20 to be separated from the structure formed in subsequent steps.

Referring to FIG. 1B, a redistribution circuit structure 110 is formed by forming a redistribution circuit layer 116 and a dielectric layer 114 on the release film 20 by thin film processes.

The redistribution circuit layer 116 may be formed by a build-up process. For example, the process of forming the redistribution circuit layer 116 includes the following steps. First, a seed layer is sputtered or deposited on the release film 20, wherein the material of the seed layer may be, for example, a conductive material such as titanium, copper, etc. Next, a patterned photoresist layer is formed on the seed layer to expose the seed layer. A conductive material is formed on the seed layer exposed by the patterned photoresist layer by an electroplating process. The conductive material may include copper (Cu), silver (Ag), palladium (Pd), aluminum (Al), nickel (Ni), titanium (Ti), gold (Au), platinum (Pt), tungsten (W), or an alloy thereof. Next, the photoresist layer and the portion of the seed layer not covered by the conductive material are removed to form the redistribution circuit layer 116.

The method for forming the dielectric layer 114 may include spin coating, chemical vapor deposition (CVD), plasma-enhanced chemical vapor deposition (PECVD), etc. The material of the dielectric layer 114 may include polyimide, epoxy resin, acrylic resin, phenolic resin, bismaleimide-trizine (BT) resin, or any other suitable polymer dielectric material and a silicon oxide layer, a silicon nitride layer, a silicon oxynitride layer, or other suitable silicon dielectric materials. The dielectric layer 114 may be a photosensitive insulating layer including a photosensitive insulating resin.

The redistribution circuit structure 110 may include a multi-layer or single-layer redistribution circuit layer 116. When the redistribution circuit structure 110 includes the multi-layer redistribution circuit layer 116, a process of forming the upper layer of the redistribution circuit layer 116 includes the following steps. First, an opening 114H is formed in the dielectric layer 114 to expose the redistribution circuit layer 116 thereunder, wherein the method for forming the opening 114H in the dielectric layer 114 may be different depending on the material of the dielectric layer 114. When the dielectric layer 114 is a photosensitive insulating layer including a photosensitive insulating resin, the dielectric layer 114 may be patterned by a lithography process to form the opening 114H. When the dielectric layer 114 is a non-photosensitive insulating layer, the dielectric layer 114 may be patterned by a lithography/etching process, a laser drilling process, or a mechanical drilling process to form the opening 114H. Referring to the enlarged view in FIG. 1B, an upper width DT of the opening 114H formed in the dielectric layer 114 may be greater than a lower width DB. In other words, an actuated angle α between tapered sidewalls of the opening 114H and an upper surface of the dielectric layer 114 may be greater than 90°. Then, the upper layer of the redistribution circuit layer 116 is formed by the same method as the aforementioned method of forming the redistribution circuit layer 116 to be connected to the redistribution circuit layer 116 exposed by the opening 114H of the electric layer 114. Although in the drawings, the redistribution circuit structure 110 is shown as including three layers of the dielectric layer 114 and three layers of the redistribution circuit layer 116, the disclosure is not limited thereto. The redistribution circuit structure 110 may include more or less layers of the dielectric layer 114 and the redistribution circuit layer 116 than the drawing.

Figure 2:
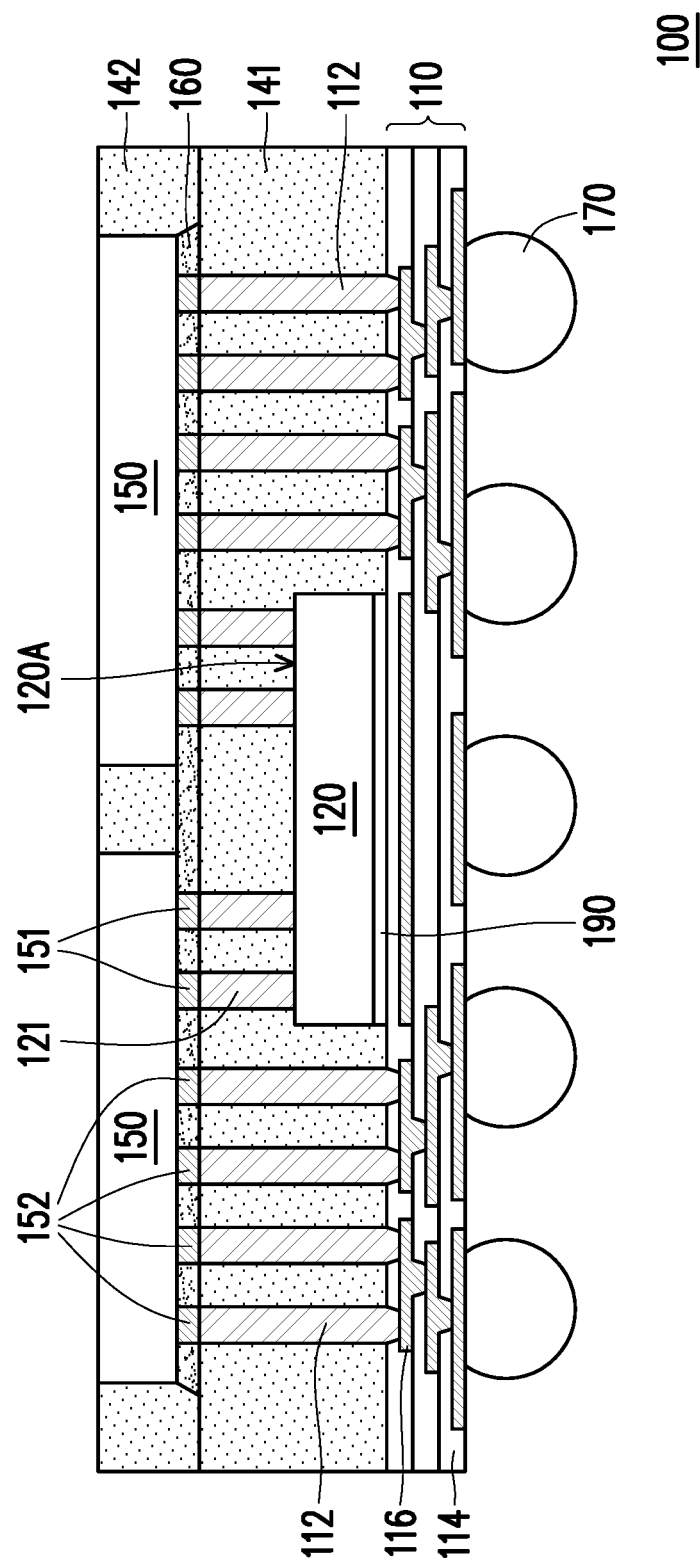
FIG. 2 is a cross-sectional view illustrating a multi-chip package according to an embodiment of the disclosure.

Referring to FIG. 1C, a second conductive post 112 may be formed on the redistribution circuit structure 110. For example, the process of forming the second conductive post 112 includes the following steps. First, an opening is formed in the dielectric layer 114 of the redistribution circuit structure 110 to expose the redistribution circuit layer 116, wherein the method for forming the opening in the dielectric layer 114 may be different depending on the material of the dielectric layer 114. When the dielectric layer 114 is a photosensitive insulating layer including a photosensitive insulating resin, the dielectric layer 114 may be patterned by a lithography process to form the opening. When the dielectric layer 114 is a non-photosensitive insulating layer, the dielectric layer 114 may be patterned by a lithography/etching process, a laser drilling process, or a mechanical drilling process to form the opening. The upper width of the opening may be greater than the lower width. In other words, an actuate angle between the tapered sidewalls of the opening and the upper surface of the dielectric layer 114 may be greater than 90°. After that, a seed layer is formed on surfaces of the dielectric layer 114 and the redistribution circuit layer 116 exposed by the opening. The material of the seed layer may be, for example, a conductive material such as titanium, copper, etc. Next, a patterned photoresist layer is formed on the seed layer. The patterned photoresist layer may be formed by a lithography and/or etching process. The opening of the patterned photoresist layer exposes a surface of the seed layer on the redistribution circuit layer 116. Then, multiple conductive post-shape structures may be formed in the opening of the patterned photoresist layer. The method for forming the conductive post-shape structures may be, for example, printing, electroplating, electroless plating, or a combination thereof. After that, the patterned photoresist layer and a portion of the seed layer are removed to form the second conductive post 112. The material of the second conductive post 112 may be formed using a metal or an alloy thereof having excellent electrical characteristics, such as copper (Cu), silver (Ag), palladium (Pd), aluminum (Al), nickel (Ni), titanium (Ti), gold (Au), platinum (Pt), tungsten (W), or an alloy thereof.

Figure 1D:
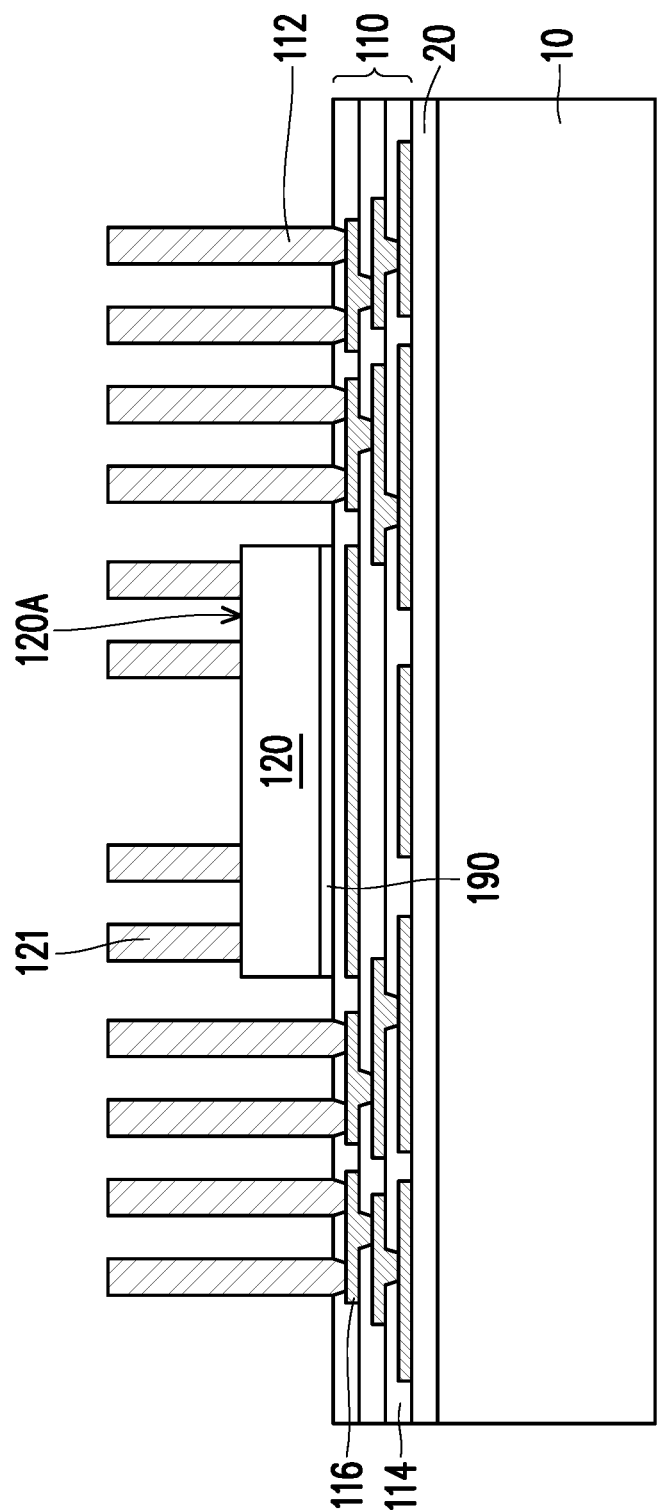
Figure 1D:
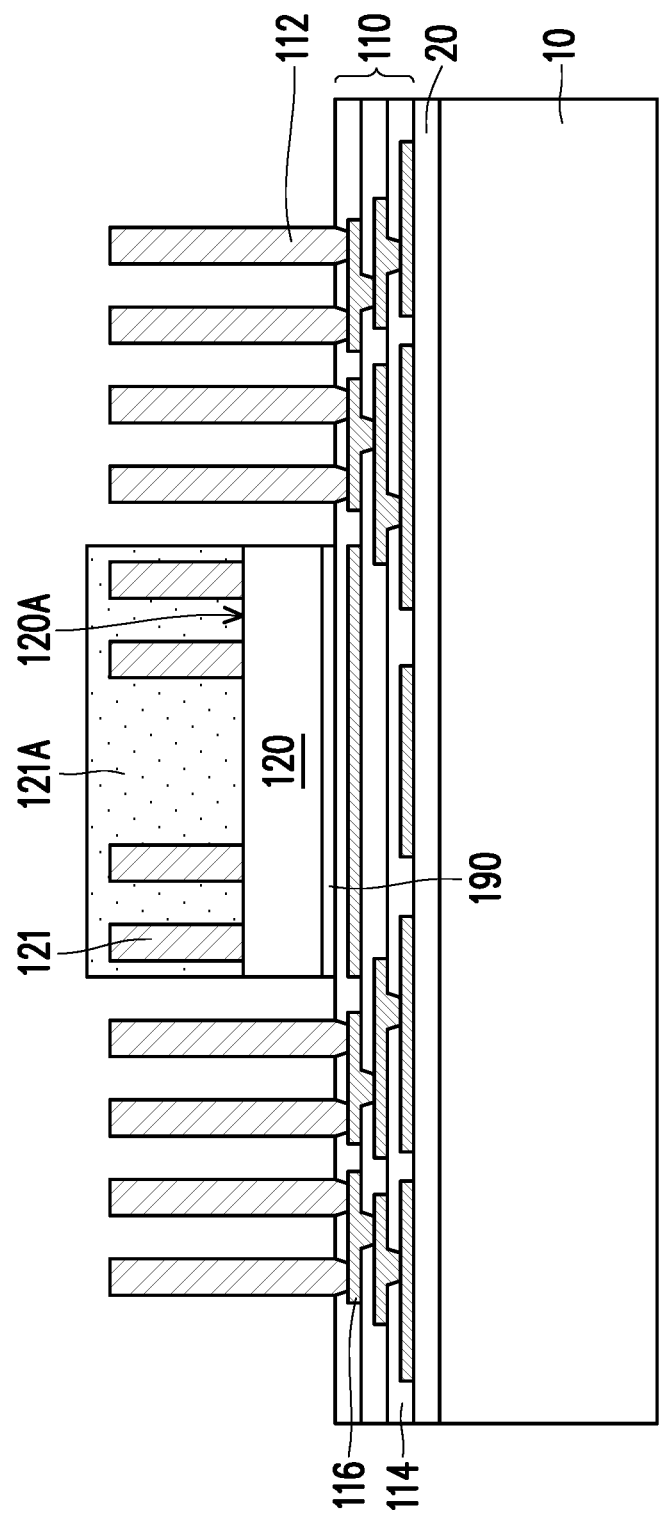

Referring to FIG. 1D(a), a lower semiconductor chip 120 may be attached onto the redistribution circuit structure 110 with a back surface by an adhesive layer 190 such as a die attach film (DAF), etc. The lower semiconductor chip 120 may be a semiconductor chip, such as a memory chip, a logic chip, a digital chip, an analog chip, a sensor chip, an artificial intelligence (AI) chip, a wireless and radio frequency chip, a voltage regulator chip, etc., formed with a semiconductor integrated circuit. The sensor chip may be an image sensor chip, including at least a charge coupled device (CCD) or a complementary metal-oxide-semiconductor (CMOS) image sensor. Although not shown in the drawings, in some embodiments, the lower semiconductor chip 120 may have a conductive through-via structure such as a through silicon via (TSV) or a through glass via (TGV) to form a vertical connection path in the lower semiconductor chip 120. In other words, the lower semiconductor chip 120 may be electrically connected to other components from an active surface 120A and/or a surface opposite to the active surface 120A by the conductive through-via structure. For example, the lower semiconductor chip 120 may also be electrically connected to the redistribution circuit structure 110 by the conductive through-via structure. The lower semiconductor chip 120 has a first conductive post 121 on the active surface 120A. The material of the first conductive post 121 may include, for example, copper (Cu), silver (Ag), palladium (Pd), aluminum (Al), nickel (Ni), titanium (Ti), gold (Au), platinum (Pt), tungsten (W), or other metals or alloys thereof having excellent electrical characteristics. Referring to FIG. 1D(b), in another embodiment, the lower semiconductor chip 120 may include a protective layer 121A on the active surface 120A to protect the first conductive post 121. For example, the first conductive post 121 may be embedded in the protective layer 121A. In other words, the protective layer 121A may completely encapsulate the first conductive post 121. The material of the protective layer 121A may include an organic insulating material such as a molding compound, a molding underfill, a resin, an epoxy molding compound (EMC), etc. The material and configuration of the protective layer 121A of the disclosure are not limited thereto. For example, the protective layer 121A may also encapsulate a portion of the first conductive post 121. The protective layer 121A may also be omitted as required.

Figure 1E:
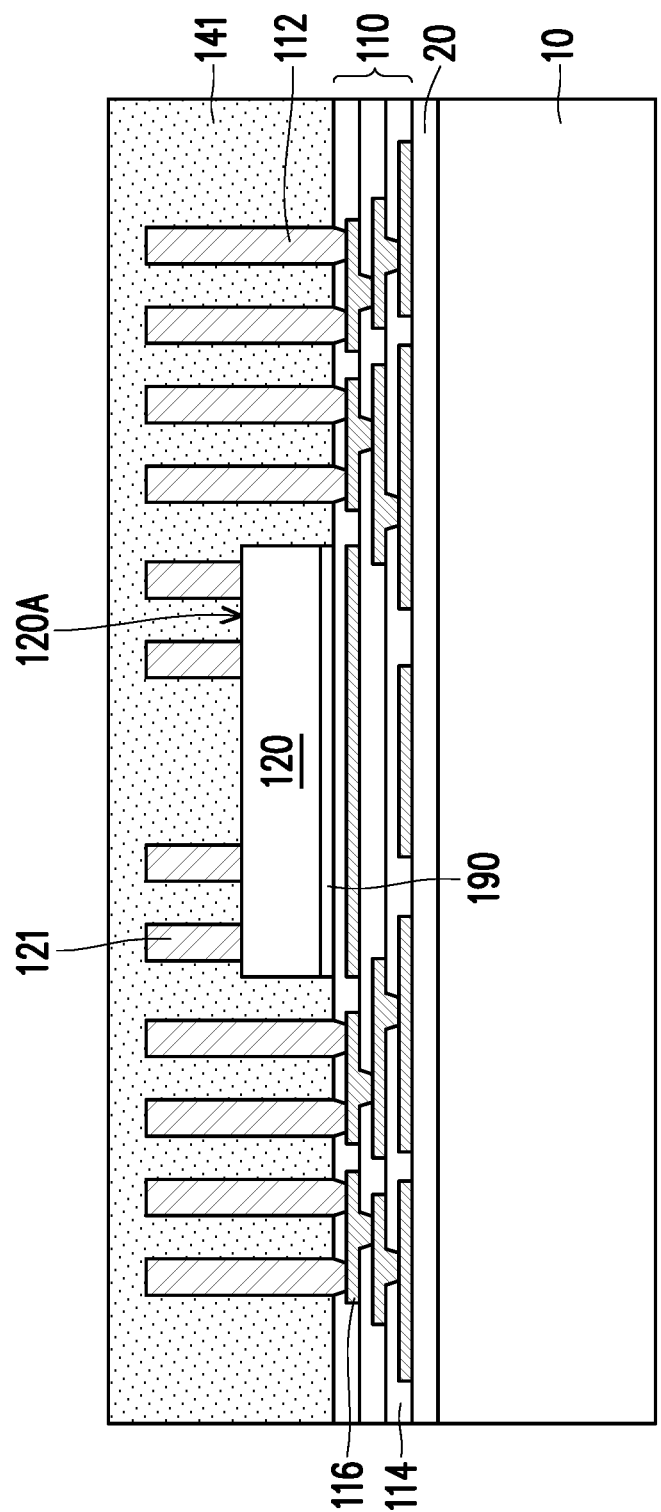
Figure 1F:
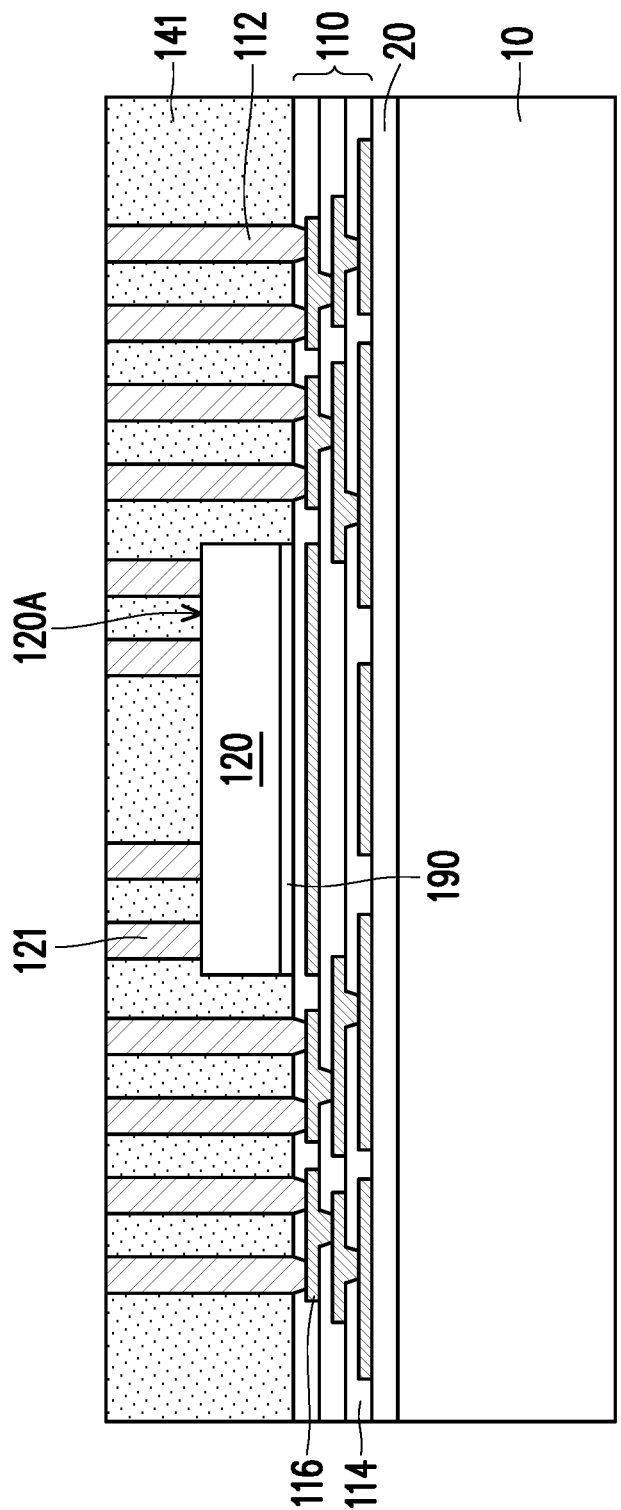

Referring to FIG. 1E and FIG. 1F, a first encapsulant 141 is formed. The first encapsulant 141 encapsulants the lower semiconductor chip 120 and the second conductive post 112. The material of the first encapsulant 141 may include a molding compound, a molding underfill, a resin, an EMC, etc. The first encapsulant 141 may be doped with an inorganic filler as required. The method for forming the first encapsulant 141 includes the following steps. An encapsulant material layer covering the redistribution circuit structure 110, the lower semiconductor chip 120, and the second conductive post 112A is formed on the carrier 10 by a suitable process (such as a molding process or a deposition process). Thereafter, a wafer grinding process or surface planarization process is executed so that surfaces of the first conductive post 121 and the second conductive post 112 (as shown in FIG. 1F) are exposed. In other words, the upper surfaces of the first conductive post 121 and the second conductive post 112 are located on the same horizontal height. In other words, the upper surfaces of the first conductive post 121, the second conductive post 112, and the first encapsulant 141 are coplanar. The first conductive post 121 and the second conductive post 112 may also slightly protrude from the upper surface of the first encapsulant 141. The first conductive post 121 and the second conductive post 112 may also be slightly recessed from the upper surface of the first encapsulant 141. In the case where the upper surfaces of the first conductive post 121 and the second conductive post 112 are slightly recessed from the upper surface of the first encapsulant 141, it is beneficial for the first conductive post 121 and the second conductive post 112 to align and bond with an upper semiconductor chip 150 in subsequent steps.

In the text, the height of the first conductive post 121 refers to the vertical distance from the active surface 120A of the lower semiconductor chip 120 to the upper surface of the first conductive post 121, and the height of the second conductive post 112 refers to the vertical distance from a surface of the redistribution circuit structure 110 immediately adjacent to the lower semiconductor chip 120 to the upper surface of the second conductive post 112. The height of the second conductive post 112 may be greater than the height of the first conductive post 121. The width of the first conductive post 121 and the width of the second conductive post 112 may be the same as each other. Alternatively, the width of the first conductive post 121 and the width of the second conductive post 112 may be different from each other. For example, the height of the first conductive post 121 may be, for example, 12 μm to 25 μm, and the aspect ratio of the first conductive post 121 may be between 0.3 and 1.2. The height of the second conductive post 112 may be, for example, 130 μm to 300 μm, and the aspect ratio of the second conductive post 112 may be between 1.2 and 3.

Figure 1G:
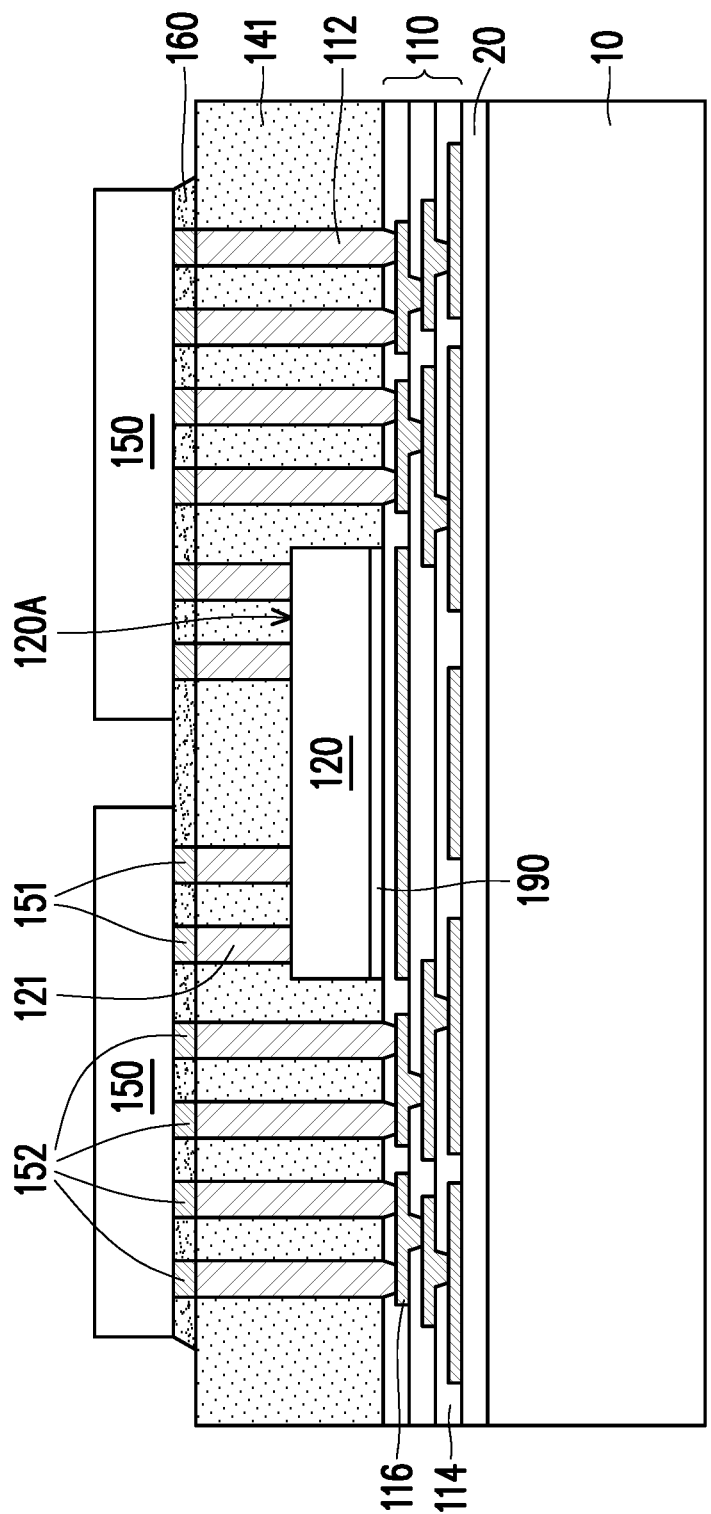

Referring to FIG. 1G, the upper semiconductor chip 150 is provided onto the first encapsulant 141 so that a first conductor 151 and the first conductive post 121 on an active surface of the upper semiconductor chip 150 are aligned and connected to each other, and a second conductor 152 and the second conductive post 112 on the active surface of the upper semiconductor chip 150 are aligned and connected to each other, so that the upper semiconductor chip 150, the lower semiconductor chip 120, and the redistribution circuit structure 110 are electrically connected to each other. In other words, the electrical connection between the first conductor 151 and the first conductive post 121 of the upper semiconductor chip 150 and the electrical connection between the second conductor 152 and the second conductive post 112 of the upper semiconductor chip 150 are not achieved by the redistribution circuit structure. In this case, not only the packaging process may be simplified, but also the electrical connection path between the upper semiconductor chip 150 and the first conductive post 121 and the second conductive post 112 may be effectively shortened, thereby improving the communication efficiency between the upper semiconductor chip 150 and the lower semiconductor chip 120.

The first conductor 151 of the upper semiconductor chip 150 overlaps with the lower semiconductor chip 120 in a direction perpendicular to the active surface 120A of the lower semiconductor chip 120, and the second conductor 152 of the upper semiconductor chip 150 does not overlap with the lower semiconductor chip 120 in a direction perpendicular to the active surface 120A of the lower semiconductor chip 120. The materials of the first conductor 151 and the second conductor 152 may include conductive materials such as copper (Cu), silver (Ag), palladium (Pd), aluminum (Al), nickel (Ni), titanium (Ti), gold (Au), and platinum (Pt), Tungsten (W), an alloy thereof, etc. The shapes of the first conductor 151 and the second conductor 152 may include various shapes such as a post shape, a stud bump, etc. The methods of connecting the first conductor 151 and the first conductive post 121 and connecting the second conductor 152 and the second conductive post 112 may be, for example, direct bonding by heating or bonding using a bonding metal. For example, a bonding metal such as solder alloy, copper, gold, silver, indium, palladium, titanium, manganese, cobalt, an alloy thereof, etc. may be disposed between the first conductor 151 and the first conductive post 121 and between the second conductor 152 and the second conductive post 112. The first conductor 151 and the first conductive post 121 are bonded, and the second conductor 152 and the second conductive post 112 are bonded by heating the same. The connection between the first conductor 151 and the first conductive post 121, and the connection between the second conductor 152 and the second conductive post 112 may also be performed without using a solder. In other words, the connection between the first conductor 151 and the first conductive post 121, and the connection between the second conductor 152 and the second conductive post 112 may be performed without using a solder alloy. The bonding metal may be a low-temperature bonding metal having a melting point of less than 200° C. For example, the low-temperature bonding metal may include twin crystal copper, twin crystal silver, or other nano-twin materials, an indium tin alloy, a tin bismuth alloy, porous gold, or a combination thereof. Compared to traditional solder balls or solders, which usually require a reflow temperature of higher than or equal to 250° C., the use of the low-temperature bonding metal enables the connection structure to achieve stable bonding at a relatively lower heating temperature (for example, at a temperature below 200° C. or below 150° C.) and meets the reliability requirement of electrical connection requirement.

Continuing back to FIG. 1G, FIG. 1G illustrates that the multi-chip package includes two upper semiconductor chips 150, but the disclosure is not limited thereto. The upper semiconductor chip 150 may include a single upper semiconductor chip 150 or multiple upper semiconductor chips 150 disposed side by side on the first encapsulant 141. The functions of the multiple upper semiconductor chips 150 may be the same as each other. Alternatively, the functions of the multiple upper semiconductor chips 150 may be different from each other. The upper semiconductor chip 150 may be a semiconductor chip formed with a semiconductor integrated circuit, such as a memory chip, a logic chip, a digital chip, an analog chip, a sensor chip, an AI chip, a wireless and radio frequency chip, a voltage regulator chip, etc. The sensor chip may be an image sensor chip, including at least a CCD or a CMOS image sensor.

Referring again to FIG. 1G, an underfill 160 may be applied onto the first encapsulant 141 to encapsulate the first conductor 151 and the second conductor 152. The underfill 160 may fill a space between the upper semiconductor chip 150 and the first encapsulant 141 and encapsulate the first conductor 151 and the second conductor 152. As shown in FIG. 1G, the underfill 160 has tapered sidewalls. The upper width of the underfill 160 is, for example, smaller than the lower width of the underfill 160. In some embodiments, the width of the underfill 160 gradually changes, and the width of the underfill 160 gradually decreases from one end closer to the first encapsulant 141 toward the other end closer to the upper semiconductor chip 150.

Figure 1H:
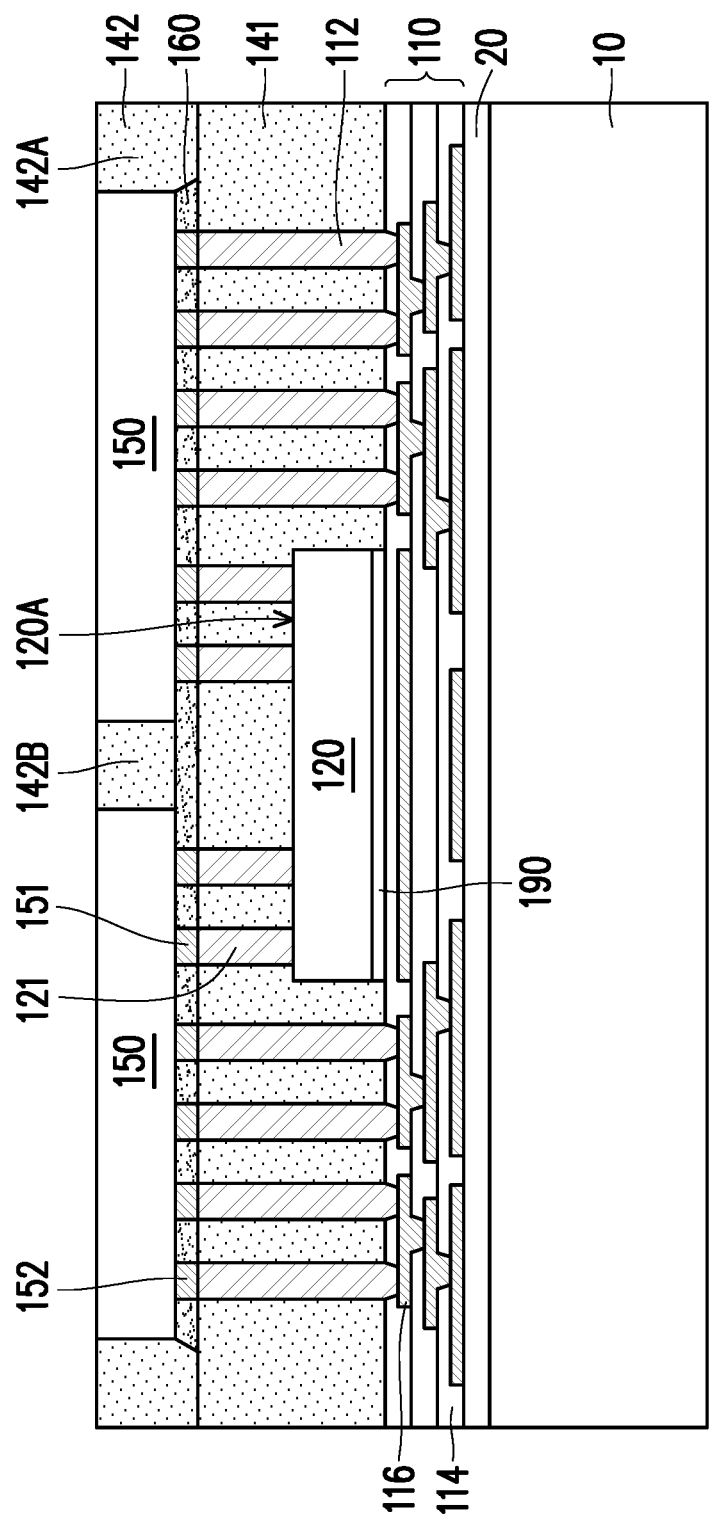

Referring to FIG. 1H, a second encapsulant 142 is formed. The encapsulant 142 encapsulates the upper semiconductor chip 150. The material of the second encapsulant 142 may include a molding compound, a molding underfill, a resin, an EMC, etc. The second encapsulant 142 may be doped with an inorganic filler as required. The method for forming the second encapsulant 142 includes the following steps. An encapsulant material layer covering the first encapsulant 141, the upper semiconductor chip 150, and the underfill 160 is formed on the carrier 10 by a suitable process (such as a molding process or a deposition process). Thereafter, a wafer grinding process or a surface planarization process is executed so that a surface of the upper semiconductor chip 150 is exposed. The material of the first encapsulant 141 and the material of the second encapsulant 142 may be the same as each other. Alternatively, the material of the first encapsulant 141 and the material of the second encapsulant 142 may be different from each other. As shown in FIG. 1H, the second encapsulant 142 may include a portion 142A directly in contact with the first encapsulant 141 and a portion 142B separated from the first encapsulant 141 by the underfill 160.

Figure 1I:
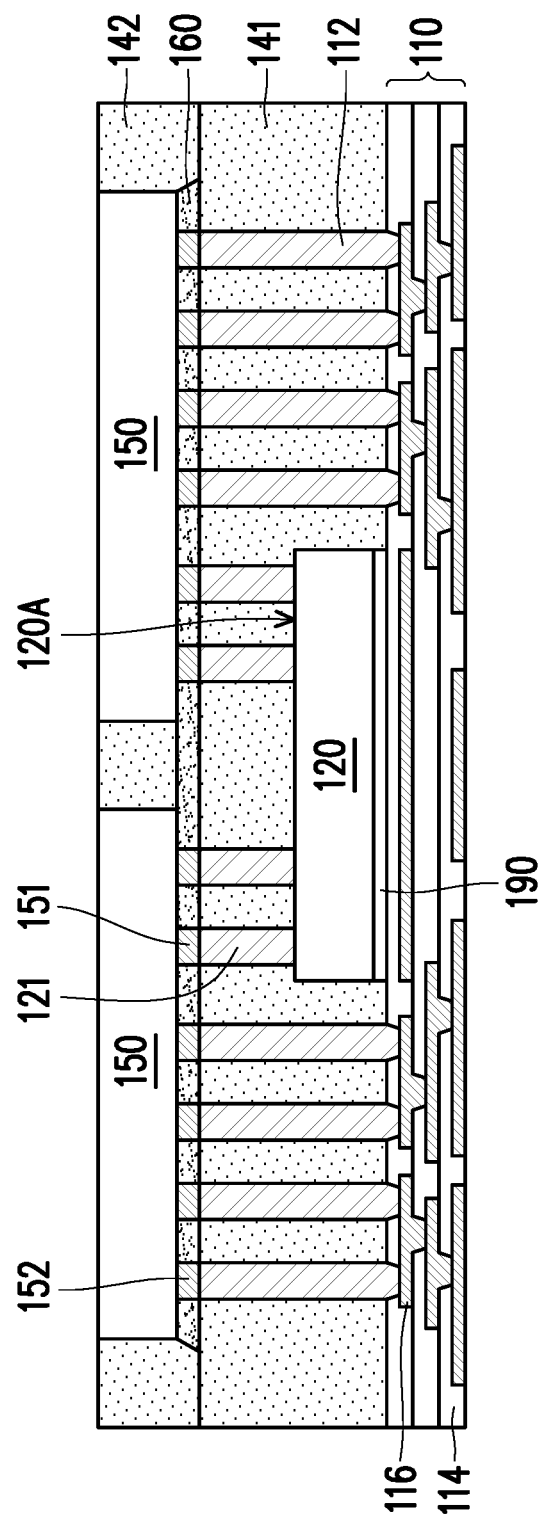

Referring to FIG. 1H and FIG. 1I, a release process is performed, so that the structure shown in FIG. 1I is separated from the carrier 10 and the release film 20. When the release film 20 is formed from an UV glue, the release process may irradiate an UV light on the release film 20, so that viscosity of the release film 20 is lost or reduced, thereby enabling the carrier 10 and the release film 20 to be separated from the structure shown in FIG. 1H. When the release film 20 is formed from a LTHC glue, the release process may irradiate light of appropriate energy on the release film 20, so that the release film 20 is decomposed under the heat energy of the light and viscosity of the release film 20 is lost or reduced, thereby enabling the carrier 10 and the release film 20 to be separated from the structure shown in FIG. 1I.

Referring to FIG. 2, multiple conductive terminals 170 may be formed on the redistribution circuit structure 110 to complete a multi-chip package 100 of the disclosure. The conductive terminal 170 is, for example, a solder ball, but the disclosure is not limited thereto. Multiple multi-chip packages 100 of the disclosure may be formed on a large-size wafer at the same time. Next, respective multi-chip package 100 is separated by a process such as cutting, etc. Therefore, a sidewall of the first encapsulant 141 and a sidewall of the second encapsulant 142 in the multi-chip package 100 of the disclosure may be aligned with a sidewall of the redistribution circuit structure 110.

In the multi-chip package 100 of the disclosure, the lower semiconductor chip 120 and the upper semiconductor chip 150 are connected to each other by the first conductive post 121 of the lower semiconductor chip 120 and the first conductor 151 of the upper semiconductor chip 150. In other words, no redistribution circuit structure is disposed between the lower semiconductor chip 120 and the upper semiconductor chip 150. Since the lower semiconductor chip 120 and the upper semiconductor chip 150 are not connected by the redistribution circuit structure and are directly connected by the first conductive post 121 of the lower semiconductor chip 120 and the first conductor 151 of the upper semiconductor chip 150, the power and/or signal transmission path between the lower semiconductor chip 120 and the upper semiconductor chip 150 may be shortened, thereby improving the transmission speed and quality of power and/or signal.

In the multi-chip package 100 of the disclosure, multiple side-by-side upper semiconductor chips 150 may be connected to each other by an internal circuit structure of the lower semiconductor chip 120. In general, multiple side-by-side semiconductor chips are connected to each other using a redistribution circuit structure or welding wires. In a conventional redistribution circuit structure, the line width and the line spacing are both about 2 μm, the width of a via is about 5 μm, the width of a connection pad is about 7 μm, and the number of layers is generally 3 layers. In the internal circuit structure of the semiconductor chip, the line width and the line spacing are both about 0.4 μm, the width of the via is about 0.4 μm, the width of the connection pad is about 0.7 μm, and the number of layers is generally 4 layers. In other words, the internal circuit structure of the semiconductor chip has a higher line density and a larger number of layers. In the embodiment, a lower semiconductor chip 120 having high-density and multi-layer connection capability is used for connection, Therefore, compared with using a conventional redistribution circuit structure for connection, the multi-chip package 100 of the embodiment can implement high bandwidth signal connection.

In the multi-chip package 100 of the disclosure, the redistribution circuit structure 110 and the upper semiconductor chip 150 may be connected to each other by the second conductive post 112 and the second conductor 152 of the upper semiconductor chip 150. Therefore, the aspect ratio of the second conductive post 112 may be adjusted to provide the transmission path for other signals and large current (such as ground) between the redistribution circuit structure 110 and the upper semiconductor chip 150.

In the multi-chip package 100 of the disclosure, the signal transmission path of the lower semiconductor chip 120 may be connected to external signals by the first conductive post 121, the upper semiconductor chip 150, the second conductive post 112, the redistribution circuit structure 110, and then by the conductive terminal 170. Therefore, making of the TSV may be eliminated, thereby reducing the production cost of the multi-chip package 100.

Figure 3:
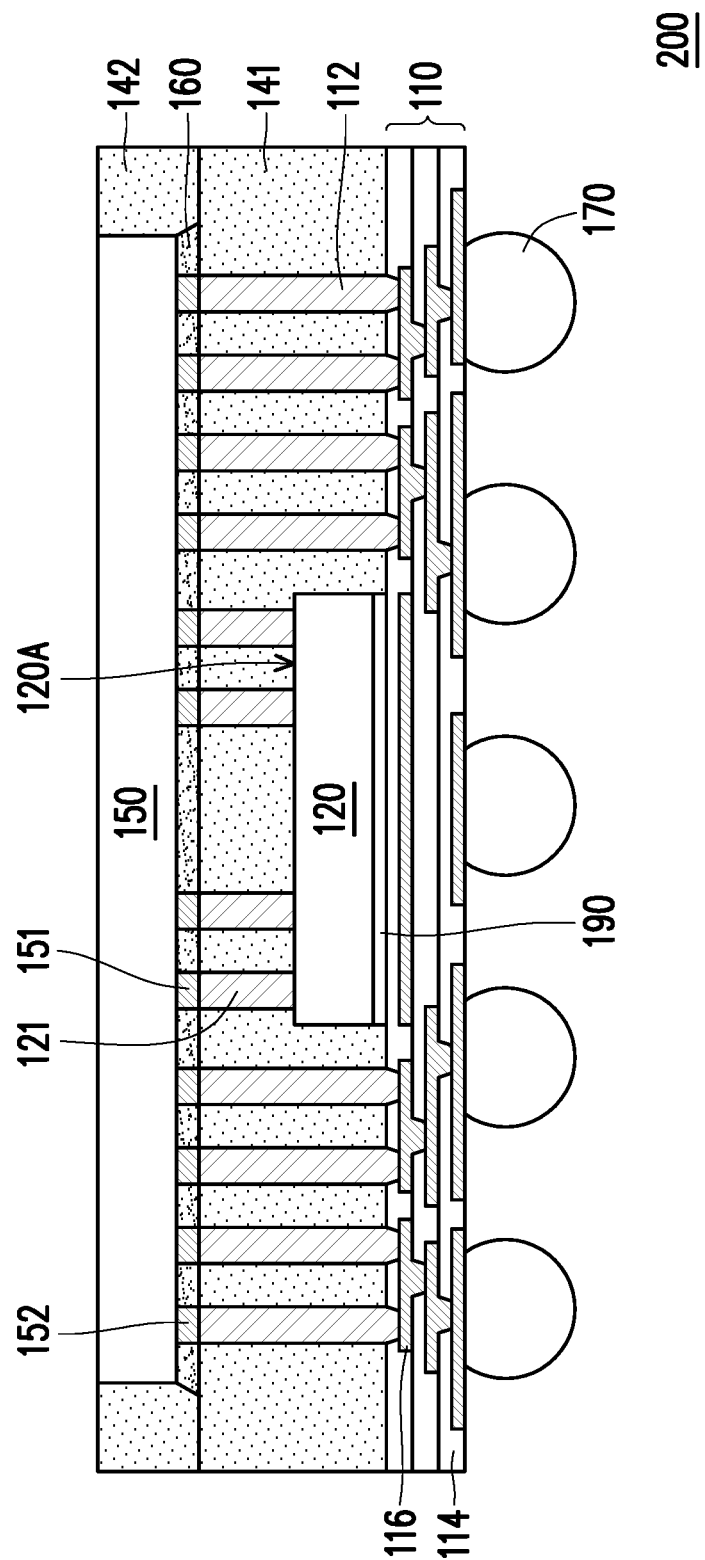
FIG. 3 is a cross-sectional view illustrating a multi-chip package according to another embodiment of the disclosure.

FIG. 3 is a cross-sectional view illustrating a multi-chip package according to another embodiment of the disclosure.

Referring to FIG. 3, other than only including one upper semiconductor chip 150, the rest of the structural relationships and configurations of a multi-chip package 200 according to another embodiment of the disclosure are similar to the structural relationships and configurations of the multi-chip package 100 shown in FIG. 2. In other words, the number of the upper semiconductor chip 120 and the lower semiconductor chip 150 of the multi-chip package of the disclosure is not particularly limited. The multi-chip package of the disclosure may include one or more upper semiconductor chip 120 and one or more lower semiconductor chip 150 as required. The one or more upper semiconductor chip 120 and the one or more lower semiconductor chip 150 may perform the same function or different functions from each other. Unless there are other obviously contradictory or obviously different descriptions, the related descriptions of the components with the same reference numerals in the multi-chip package 100 are also applicable to the components with the same reference numerals in the multi-chip package 200, which will not be reiterated here.

Figure 4:
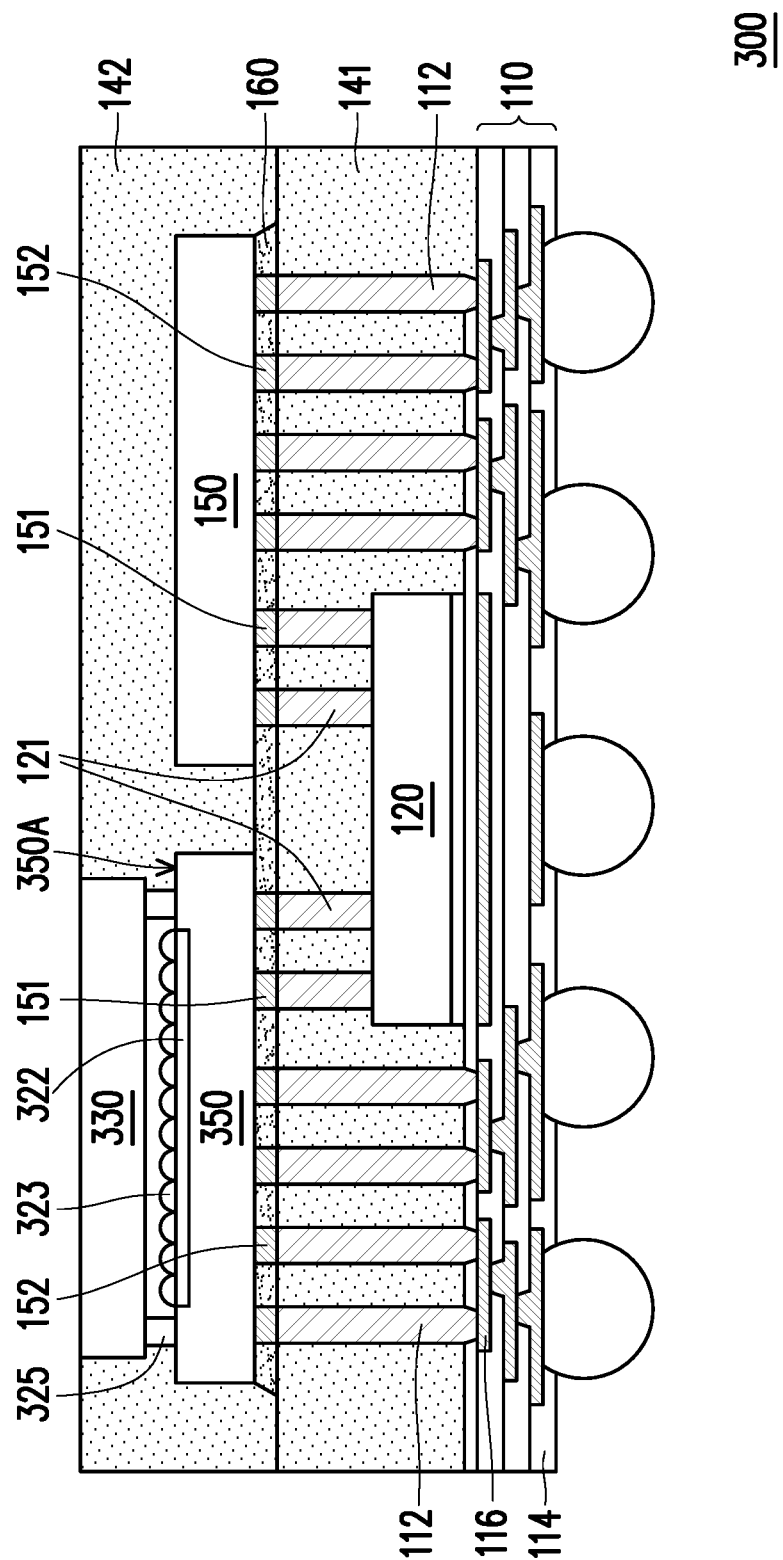
FIG. 4 is a cross-sectional view illustrating a multi-chip package according to another embodiment of the disclosure.

FIG. 4 is a cross-sectional view illustrating a multi-chip package according to another embodiment of the disclosure.

Referring to FIG. 4, a multi-chip package 300 according to another embodiment of the disclosure is an image sensor package. In the multi-chip package 300 of the disclosure, an image sensor chip 350 and other upper semiconductor chip 150 are arranged side by side. The image sensor chip 350 may be a CMOS image sensor chip. However, the disclosure does not limit the type of the image sensor chip 350, which may be other appropriate types of image sensor chips. The image sensor chip 350 may have a micro lens 323 on a sensor surface 350A. A sensing area 322 of the image sensor chip 350 is below the micro lens 323. A cover 330 is covered above the micro lens 323. The cover 330 may be, for example, a transparent glass substrate. A sealing structure 325, such as a sealant, is formed between the cover 330 and the micro lens 323 to separate the cover 330 and the micro lens 323 from each other. In addition, the sealing structure 325 may be used to define a space between the cover 330 and the image sensor chip 350. A first conductor 151 and a second conductor 152 are disposed on a surface of the image sensor chip 350 opposite to the sensing surface 350A. The first conductor 151 is connected to a first conductive post 121 of a lower semiconductor chip 120 so that the image sensor chip 350 and the lower semiconductor chip 120 are electrically/signally connected to each other. A second conductor 152 is connected to a second conductive post 112 so that the image sensor chip 350 and a redistribution circuit structure 110 are electrically/signally connected to each other. In the multi-chip package 300 of the disclosure, the image sensor chip 350 and the side-by-side upper semiconductor chip 150 may be connected to each other by an internal circuit structure of the lower semiconductor chip 120, rather than by welding wires or a redistribution circuit structure. Therefore, the multi-chip package 300 of the disclosure can implement high bandwidth signal connection. Unless there are other obviously contradictory or obviously different descriptions, the related descriptions of the components with the same reference numerals in the multi-chip packages 100 and 200 are also applicable to the components with the same reference numerals in the multi-chip package 300, which will not be reiterated here.

Figure 5:
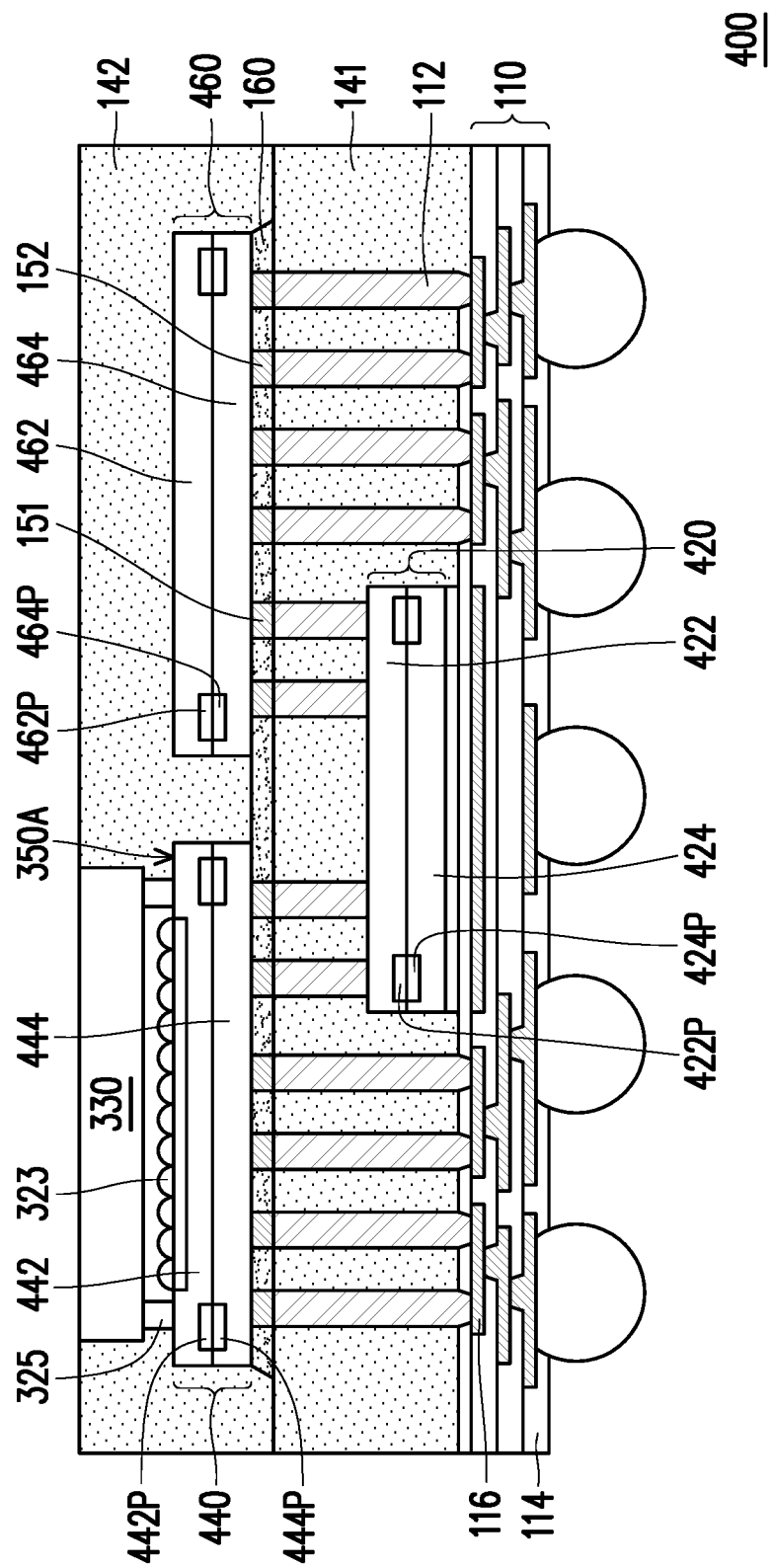
FIG. 5 is a cross-sectional view illustrating a multi-chip package according to another embodiment of the disclosure.

FIG. 5 is a cross-sectional view illustrating a multi-chip package according to another embodiment of the disclosure.

Referring to FIG. 5, a multi-chip package 400 according to another embodiment of the disclosure is the same as the multi-chip package 300 shown in FIG. 4, except that the multi-chip package 400 respectively replaces the lower semiconductor chip 120, the image sensor chip 350, and the upper semiconductor chip 150 in the multi-chip package 300 with a lower semiconductor element 420, an image sensing semiconductor element 440, and an upper semiconductor element 460 combined of multiple chips. The lower semiconductor element 420, the image sensing semiconductor element 440, and the upper semiconductor element 460 may include multiple chips having the same or different functions. For example, the lower semiconductor element 420 may include a first semiconductor chip 422 and a second semiconductor chip 424 stacked on top of each other, the image sensing semiconductor element 440 may include a third semiconductor chip 442 and a fourth semiconductor chip 444 stacked on top of each other, and the upper semiconductor element 460 may include a fifth semiconductor chip 462 and a sixth semiconductor chip 464 stacked on top of each other. The first semiconductor chip 422, the second semiconductor chip 424, the third semiconductor chip 442, the fourth semiconductor chip 444, the fifth semiconductor chip 462, and the sixth semiconductor chip 464 may independently be a memory chip, a logic chip, a digital chip, an analog chip, a sensor chip, an AI chip, a wireless and radio frequency chip, a voltage regulator chip, etc. depending on the function of the multi-chip package 400. For example, the third semiconductor chip 442 may be an image sensor chip. The first semiconductor chip 422 and the second semiconductor chip 424 may be connected to each other by a first connection conductor 422P of the first semiconductor chip 422 and a second connection conductor 424P of the second semiconductor chip 424. The third semiconductor chip 442 and the fourth semiconductor chip 444 may be connected to each other by a third connection conductor 442P of the third semiconductor chip 442 and a fourth connection conductor 444P of the fourth semiconductor chip 444. The fifth semiconductor chip 462 and the sixth semiconductor chip 464 may be connected to each other by a fifth connection conductor 462P of the fifth semiconductor chip 462 and a sixth connection conductor 464P of the sixth semiconductor chip 464. Since the electrical paths between the first semiconductor chip 422 and the second semiconductor chip 424, between the third semiconductor chip 442 and the fourth semiconductor chip 444, and between the fifth semiconductor chip 462 and the sixth semiconductor chip 464 are short, fast signal transmission can be implemented. Meanwhile, since the multi-chip package 400 of the disclosure includes multiple chips, the multi-chip package 400 of the disclosure can perform more functions without significantly increasing the volume of the multi-chip package. Although FIG. 5 illustrates the multi-chip package 400 as replacing the lower semiconductor chip 120, the image sensor chip 350, and the upper semiconductor chip 150 in the multi-chip package 300 with the lower semiconductor element 420, the image sensing semiconductor element 440, and the upper semiconductor element 460 combined of multiple chips, the disclosure is not limited thereto. It is also possible to replace only a portion of the lower semiconductor chip 120, the image sensor chip 350, and the upper semiconductor chip 150. Unless there are other obviously contradictory or obviously different descriptions, the related descriptions of the components with the same reference numerals in the multi-chip packages 100, 200, and 300 also apply to the components with the same reference numerals in the multi-chip package 400, which will not be reiterated here.

FIG. 6A to FIG. 6I are cross-sectional views of steps of a manufacturing process for manufacturing a multi-chip package according to an embodiment of the disclosure. FIG. 7A to FIG. 7F are schematic views illustrating various embodiments of a connection method of a first conductor 151 and a first conductive post 121 of the disclosure. FIG. 8 is a cross-sectional view illustrating a multi-chip package according to an embodiment of the disclosure. Unless there are other obviously contradictory or obviously different descriptions, the related descriptions of the components with the same reference numerals in the above embodiments are also applicable to the components with the same reference numerals in this embodiment, which will not be reiterated here.

Figure 6A:
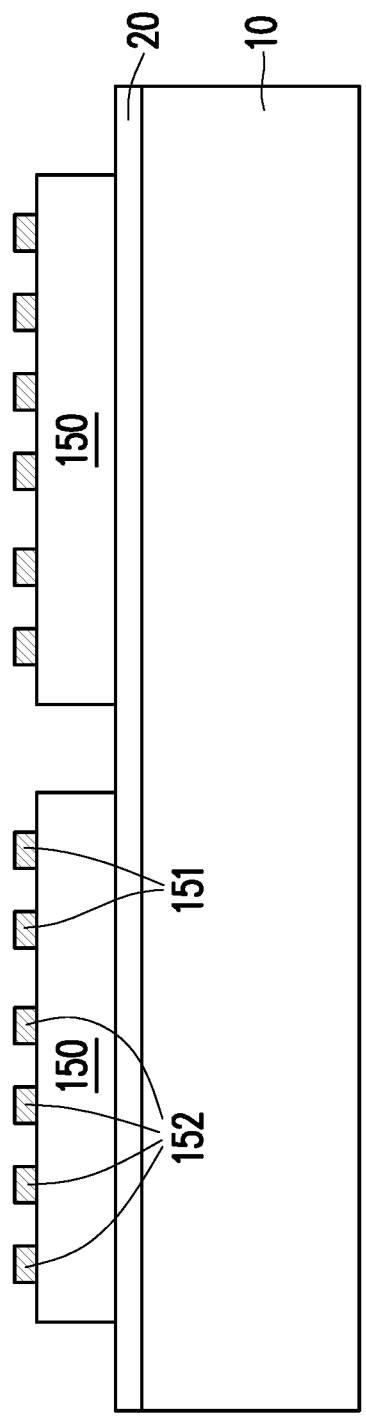
FIG. 6A to FIG. 6J are cross-sectional views of steps of a manufacturing process for manufacturing a multi-chip package according to an embodiment of the disclosure.

Referring to FIG. 6A, an upper semiconductor chip 150 having a first conductor 151 and a second conductor 152 disposed on an active surface is attached onto a carrier 10 having a release film 20.

Figure 6B:
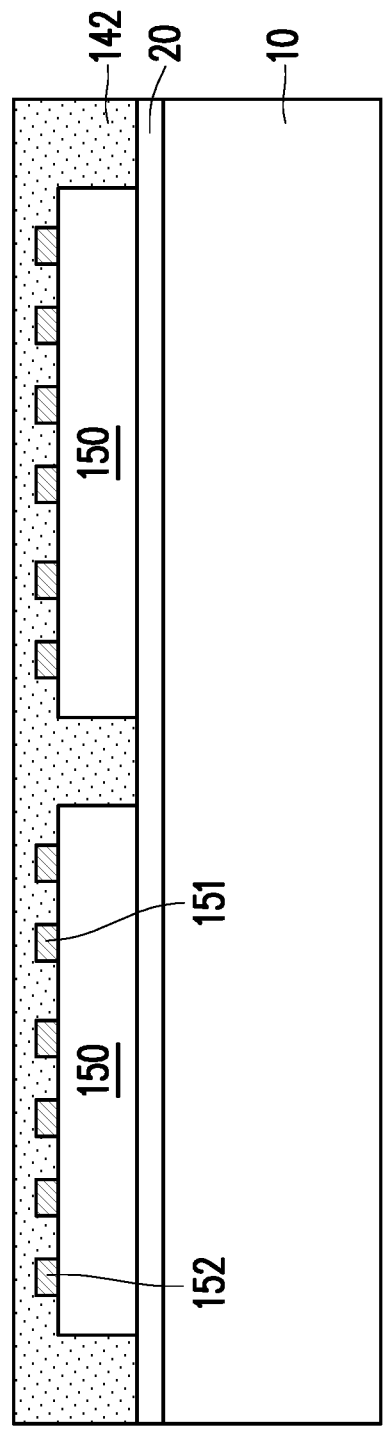
Figure 6C:
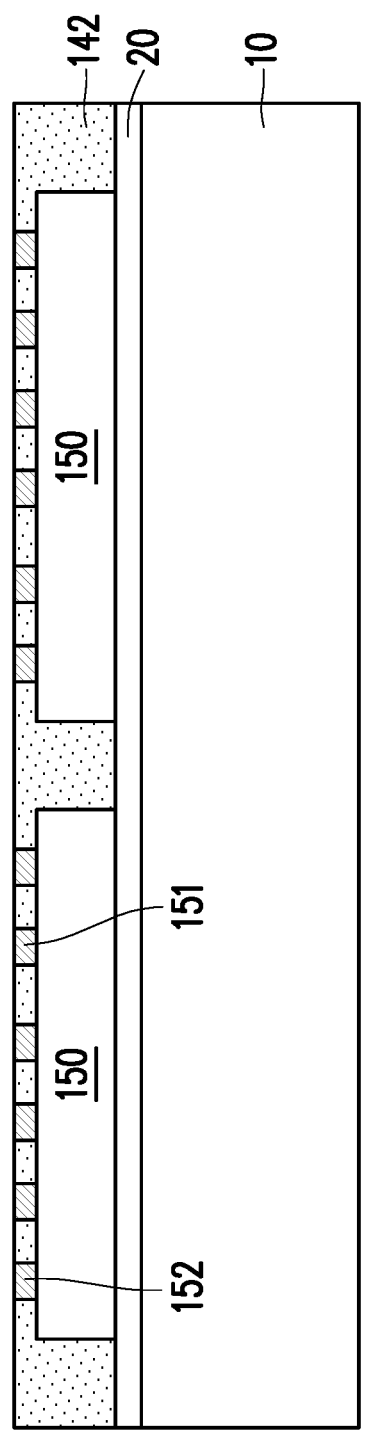

Referring to FIG. 6B and FIG. 6C, a second encapsulant 142 is formed. The second encapsulant 142 encapsulates the upper semiconductor chip 150. The method for forming the second encapsulant 142 includes the following steps. An encapsulant material layer covering the upper semiconductor chip 150 is formed on the carrier 10 by a suitable process (such as a molding process or a deposition process). Thereafter, a wafer grinding process or a surface planarization process is executed so that surfaces of the first conductor 151 and the second conductor 152 of the upper semiconductor chip 150 are exposed.

Figure 6D:
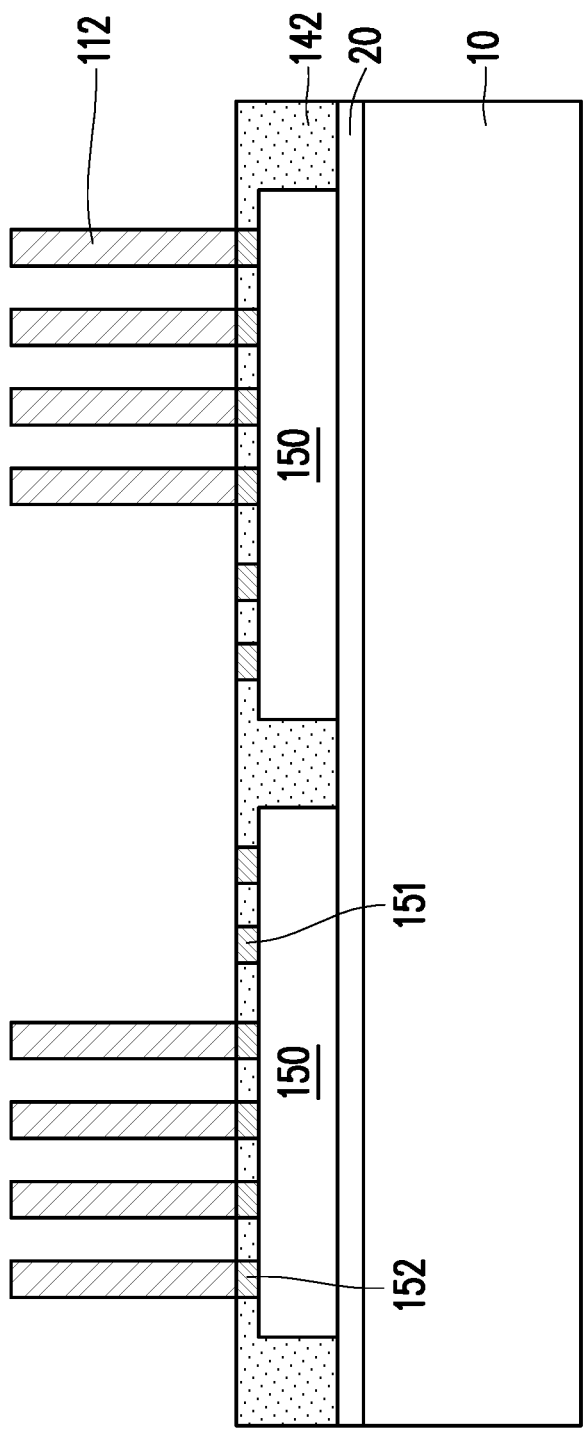

Referring to FIG. 6D, a second conductive post 112 is formed on the second conductor 152 of the upper semiconductor chip 150. For example, the process of forming the second conductive post 112 includes the following steps. First, a patterned photoresist layer is formed on the second encapsulant 142. The patterned photoresist layer may be formed by a lithography and/or etching process. An opening of the patterned photoresist layer exposes a surface of the second conductor 152. Then, multiple conductive post-shape structures may be formed in the opening of the patterned photoresist layer. The method for forming the conductive post-shape structures may be, for example, printing, electroplating, electroless plating, or a combination thereof. After that, the patterned photoresist layer is removed to form the second conductive post 112.

Figure 6E:
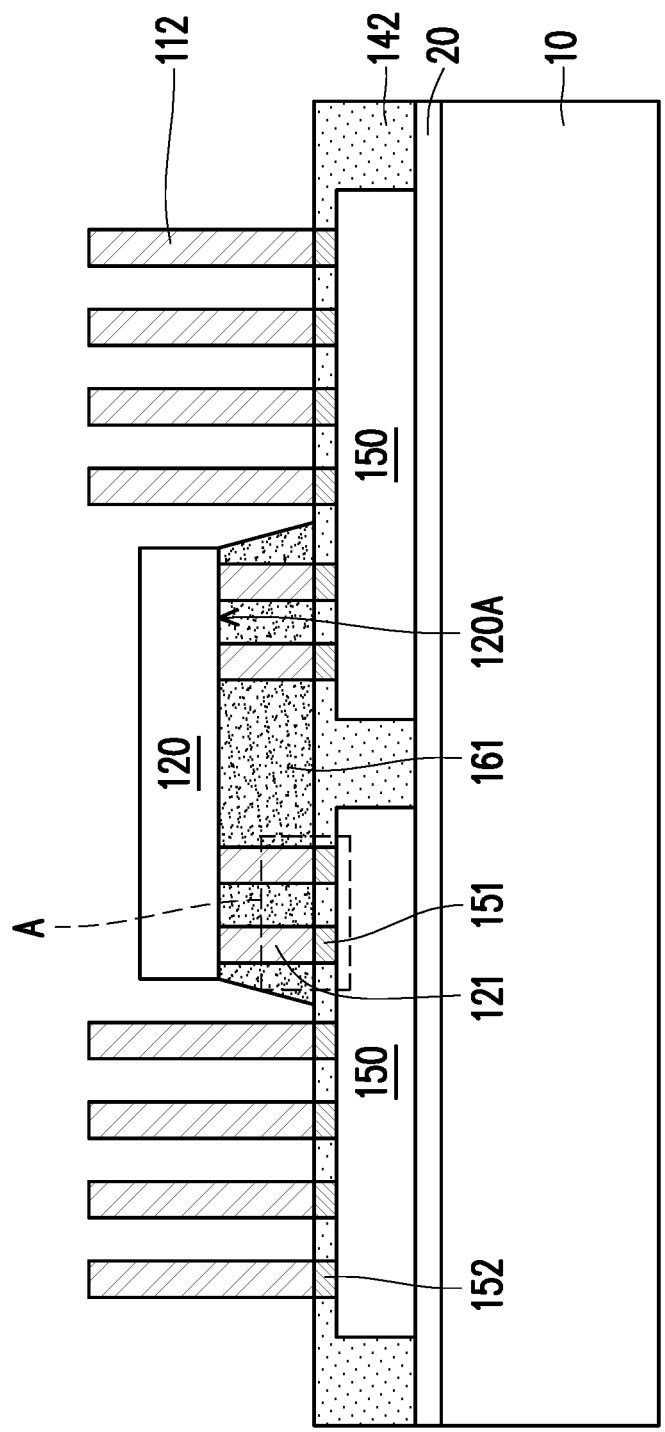
Figure 6F:
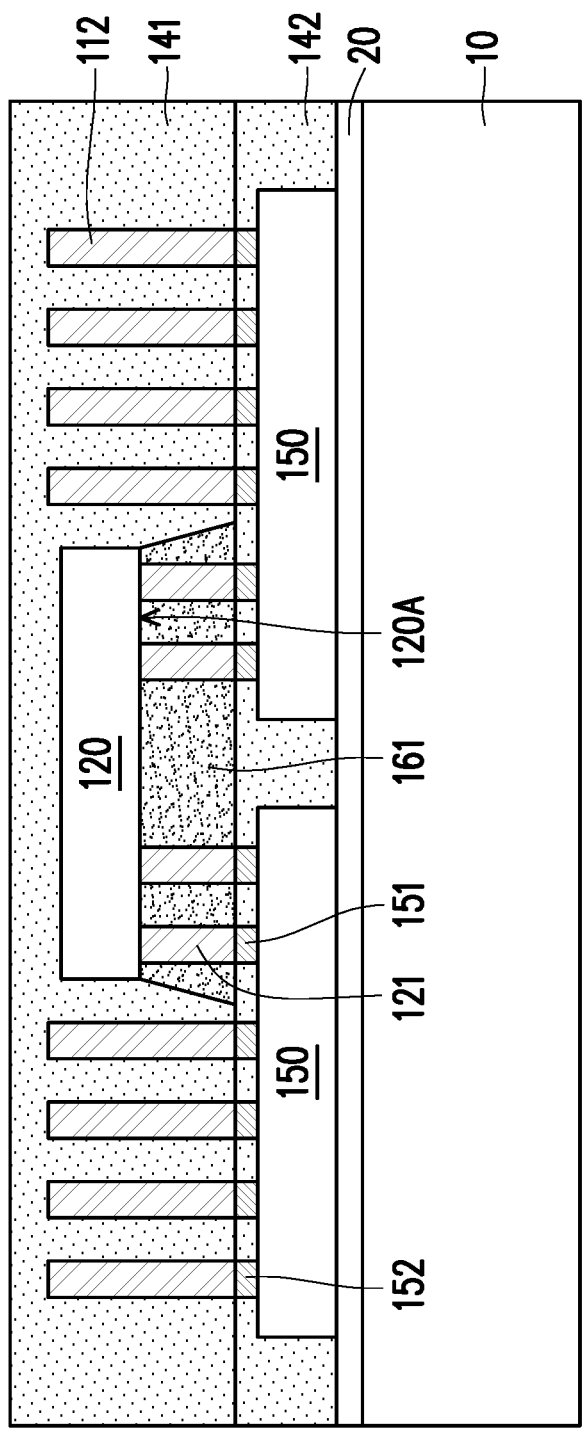
Figure 6G:
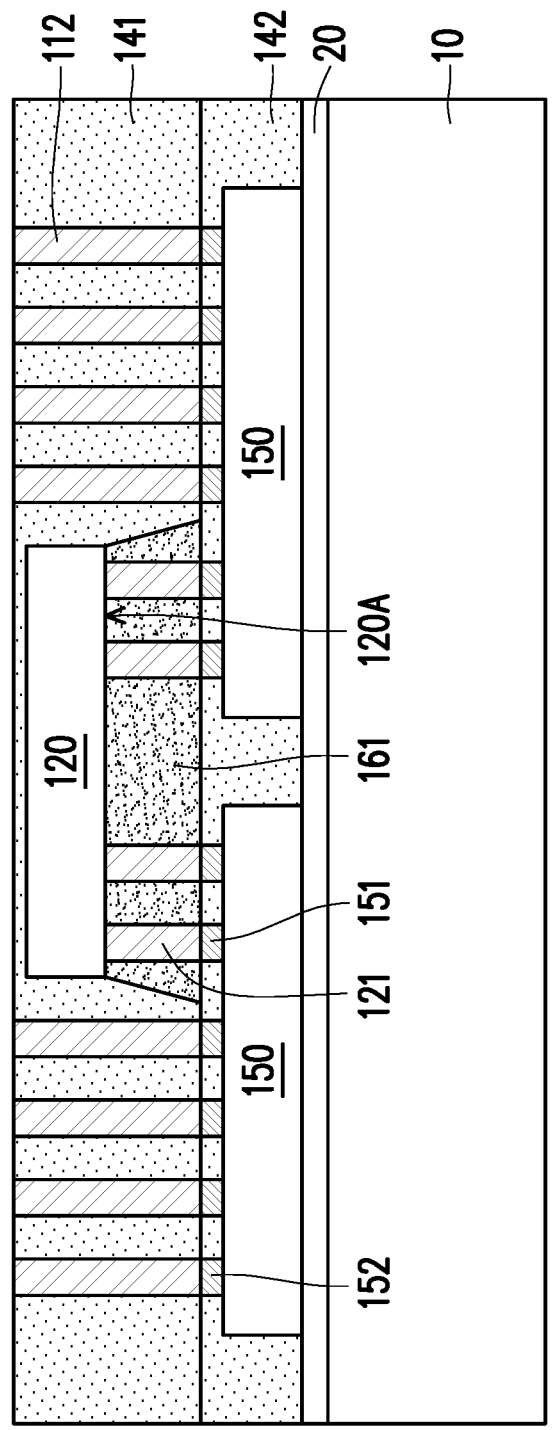

Referring to FIG. 6E, the lower semiconductor chip 120 is installed onto the second encapsulant 142 to connect the first conductive post 121 of the lower semiconductor chip 120 and the first conductor 151 of the upper semiconductor chip 150 to each other. Then, a first underfill 161 may be applied onto the second encapsulant 142 to encapsulate the first conductive post 121. The first underfill 161 may fill a space between the lower semiconductor chip 120 and the second encapsulant 142, and encapsulate the first conductive post 121. As shown in FIG. 6E, the first underfill 161 has tapered sidewalls. The upper width of the first underfill 161 is, for example, smaller than the lower width of the first underfill 161. In some embodiments, the width of the first underfill 161 gradually changes, and the width of the first underfill 161 gradually decreases from one end closer to the second encapsulant 142 toward the other end closer to the lower semiconductor chip 120.

Alternatively, the first underfill 161 is formed on the lower semiconductor chip 120 before the lower semiconductor chip 120 is installed onto the second encapsulant 142. In this case, the first conductive post 121 may be connected to the first conductor 151 with at least a portion being encapsulated by the first underfill 161. When the first conductive post 121 is connected to the first conductor 151 with at least the portion being encapsulated by the first underfill 161, the width change of the first underfill 161 may be reversed from as shown in FIG. 6E. In other words, the width of the first underfill 161 gradually increases from one end closer to the second encapsulant 142 toward the other end closer to the lower semiconductor chip 120 (not shown). FIG. 7A to FIG. 7H are schematic diagrams illustrating various embodiments of a connection method of the first conductive post 121 and the first conductor 151 in a case where at least the portion of the first conductive post 121 is encapsulated by the first underfill 161.

Figure 7A:
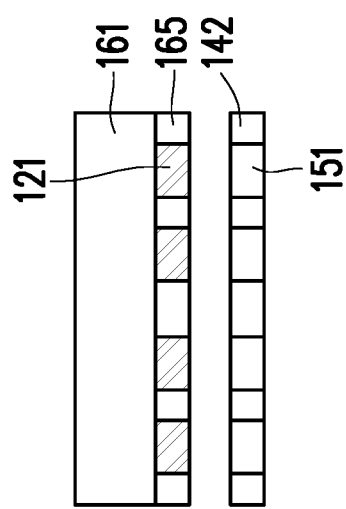
FIG. 7A to FIG. 7H are schematic views illustrating various embodiments of a connection method of a first conductor and a first conductive post of the disclosure.
Figure 7B:
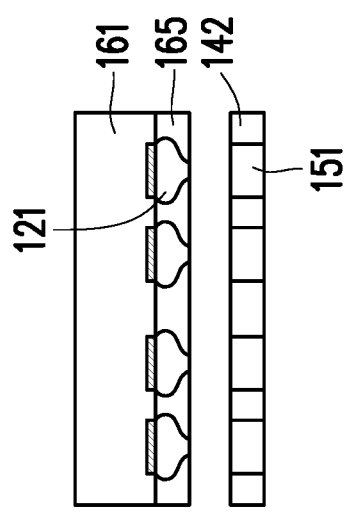
Figure 7C:
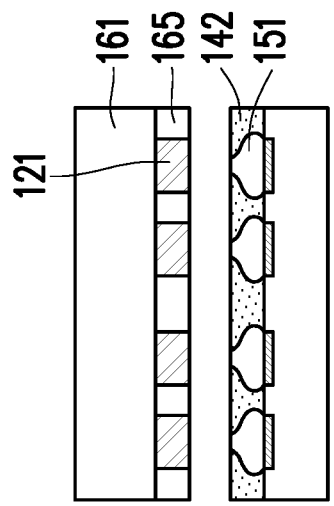
Figure 8:
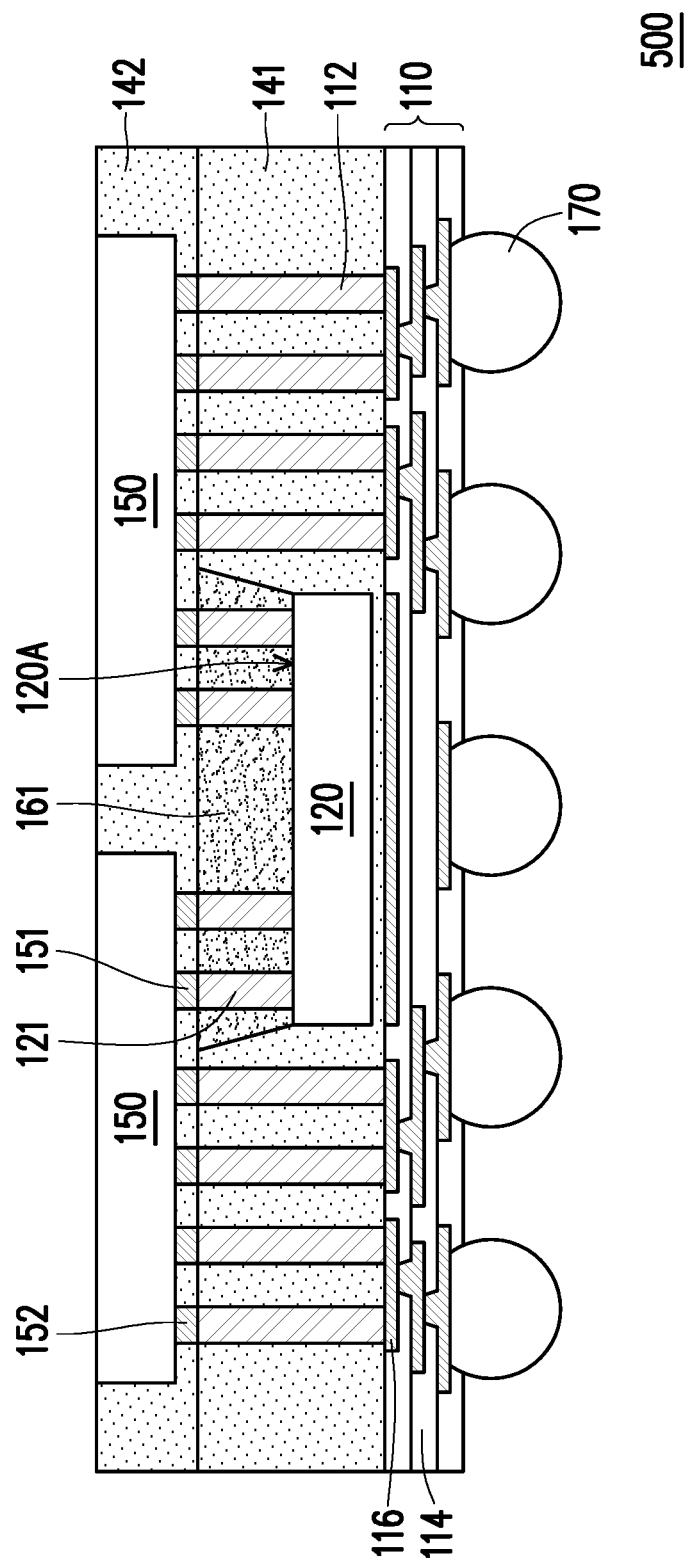
FIG. 8 is a cross-sectional view illustrating a multi-chip package according to an embodiment of the disclosure.

Referring to FIG. 7A to FIG. 7C, a protective layer 165 exposing a lower surface of the first conductive post 121 may be formed on the first underfill 161. The material of the protective layer 165 may be an organic material such as a resin, a non-conductive adhesive film, a dielectric material, etc. The shape of the first conductive post 121 may be a post shape as shown in FIG. 7A and FIG. 7C or a stud bump as shown in FIG. 7B. The shape of the first conductor 51 may be a post shape as shown in FIG. 7A and FIG. 7B or a stud bump as shown in FIG. 7C. In the embodiment of FIG. 7A to FIG. 7C, when the lower semiconductor chip 120 is installed onto the second encapsulant 142, a lower surface of the lower semiconductor chip 120 is a flat surface. In other words, a lower surface of the protective layer 165 of the lower semiconductor chip 120 and the lower surface of the first conductive post 121 are coplanar. Then, the first conductive post 121 and the first conductor 151 may be directly in contact and connected by heating. Since the first conductive post 121 of the lower semiconductor chip 120 is encapsulated by the first underfill 161 and the protective layer 165 and only the surface is exposed for connection, being damaged due to external force may be prevented. As such, the yield of the semiconductor process can be improved.

Figure 7E:
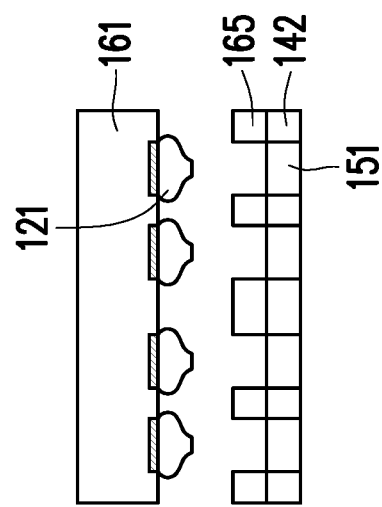
Figure 7D:
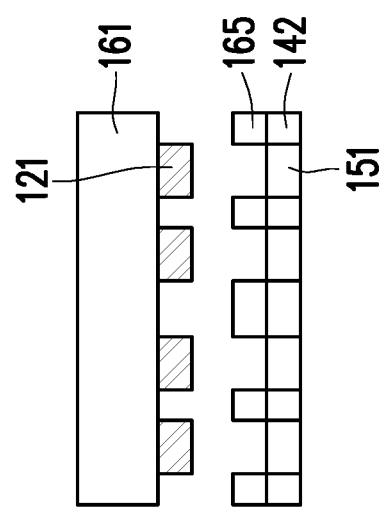

Referring to FIG. 7D and FIG. 7E, the protective layer 165 may be formed on the second encapsulant 142. The material of the protective layer 165 may be an organic material such as a resin, a non-conductive adhesive film, a dielectric material, etc. The protective layer 165 may not be formed on the upper surface of the first conductor 151. Therefore, the upper surface of the first conductor 151 may be slightly lower than the upper surface of the protective layer 165. The shape of the first conductive post 121 may be a post shape as shown in FIG. 7D or a stud bump as shown in FIG. 7E. In the embodiment of FIG. 7D and FIG. 7E, the first conductive post 121 protrudes from the first underfill 161 and the upper surface of the first conductor 151 is slightly lower than the upper surface of the protective layer 165. Therefore, the first conductive post 121 and the first conductor 151 of the lower semiconductor chip 120 may be easily aligned to be in contact with each other. The first conductive post 121 and the first conductor 151 may be directly bonded by heating after being directly in contact.

Figure 7F:
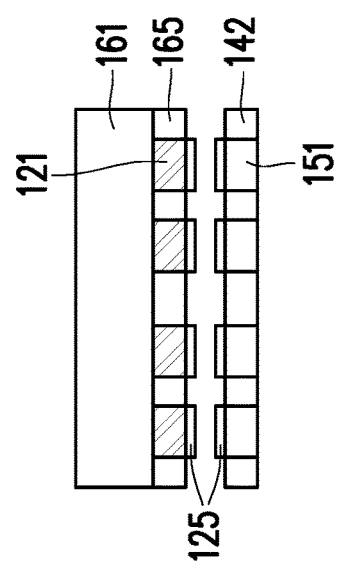

Referring to FIG. 7F, the embodiment shown in FIG. 7F is similar to the embodiment shown in FIG. 7A, except that the first conductive post 121 and the first conductor 151 are connected by a bonding metal 125. The bonding metal 125 may be, for example, a solder alloy, copper, gold, silver, indium, palladium, titanium, manganese, cobalt, an alloy thereof, etc. The first conductive post 121 and the first conductor 151 may be bonded by contacting the first conductive post 121, the first conductor 151, and/or the bonding metal 125 with each other and heating. The connection between the first conductive post 121 and the first conductor 151 may also be performed without using a solder. In other words, the connection between the first conductive post 121 and the first conductor 151 may be performed without using a solder alloy. The bonding metal 125 may be a low-temperature bonding metal with a melting point of less than 200° C. For example, the low-temperature bonding metal may include twin crystal copper, twin crystal silver, or other nano-twin materials, an indium tin alloy, a tin bismuth alloy, porous gold, or a combination thereof. Compared to traditional solder balls or solders, which usually require a reflow temperature of higher than or equal to 250° C., the use of the low-temperature bonding metal enables the connection structure to achieve stable bonding at a relatively lower heating temperature (for example, at a temperature below 200° C. or below 150° C.) and meets the reliability requirement of electrical connection requirement.

Figure 7G:
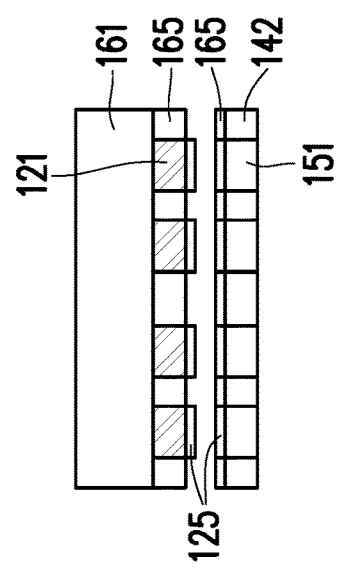

Referring to FIG. 7G, the embodiment shown in FIG. 7G is similar to the embodiment shown in FIG. 7F, except that the protective layer 165 is formed on the second encapsulant 142 and the first underfill 161 at the same time.

Figure 7H:
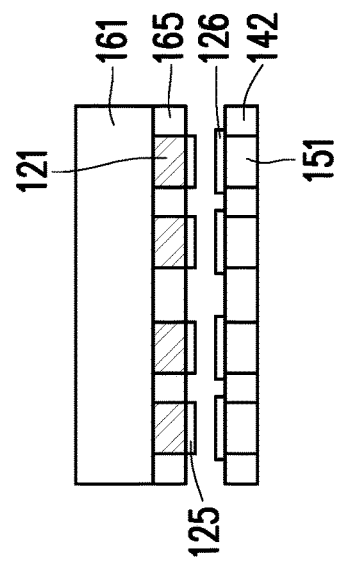

Referring to FIG. 7H, the embodiment shown in FIG. 7H is similar to the embodiment shown in FIG. 7F, except that the bonding metal 125 is not formed on the first conductor 151 but an oxidation protective layer 126 is formed. The material of the oxidation protective layer 126 may be, for example, an organic solderability preservative (OSP). The oxidation protective layer 126 may be removed using a cleaning process before bonding to the first conductive post 121 or bonded to the first conductive post 121 by a soldering flux.

Referring back to FIG. 6F and FIG. 6G, the first encapsulant 141 is formed. The first encapsulant 141 encapsulates the lower semiconductor chip 120. The method of forming the first encapsulant 141 includes the following steps. An encapsulant material layer covering the second encapsulant 142, the lower semiconductor chip 120, and the second conductive post 112 is formed on the carrier 10 by a suitable process (such as a molding process or a deposition process). Then, a wafer grinding process or a surface planarization process is executed, so that a surface of the second conductive post 112 is exposed.

Figure 6H:
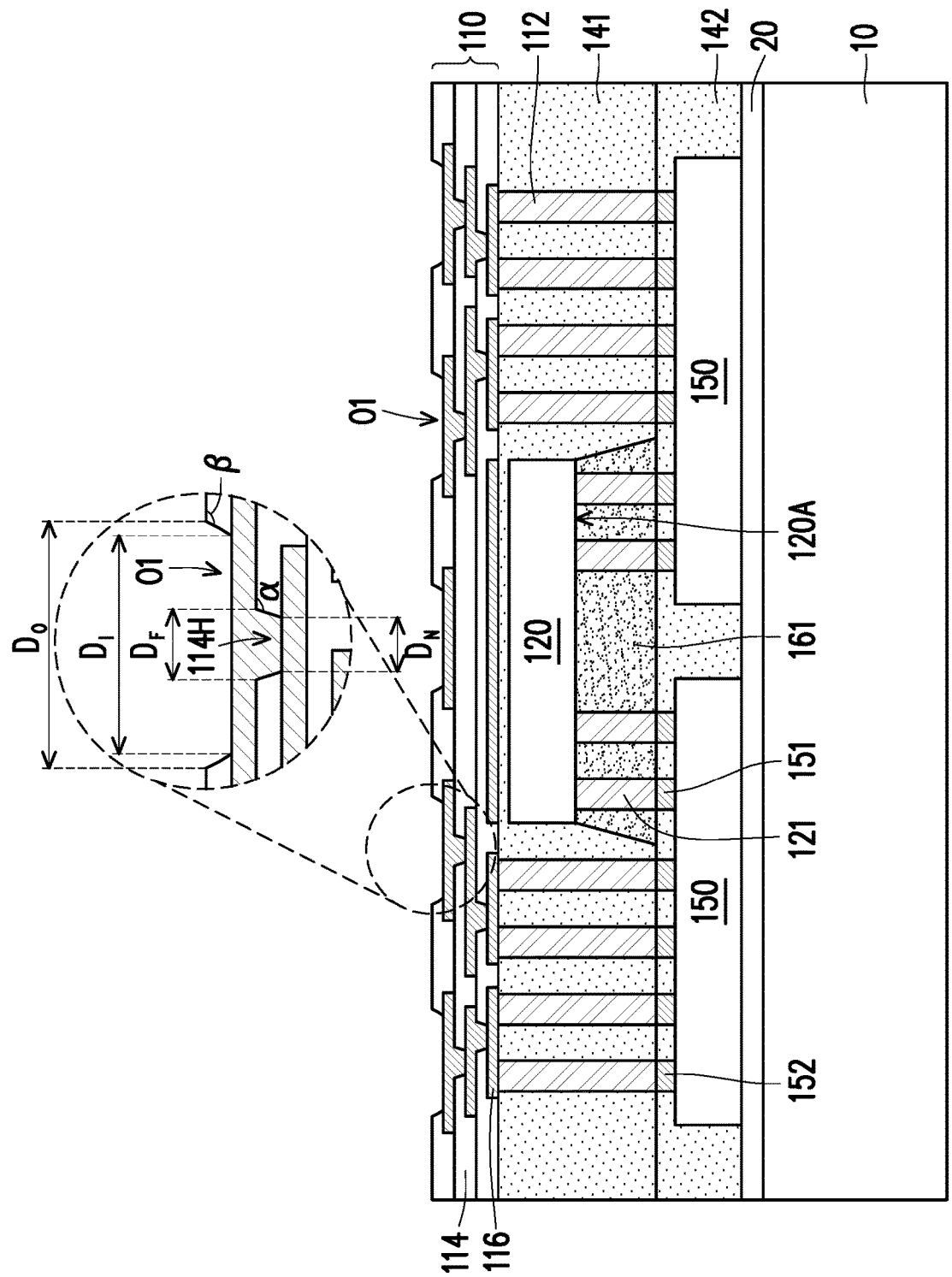

Referring to FIG. 6H, a redistribution circuit structure 110 including a redistribution circuit layer 116 and a dielectric layer 114 is formed on the first encapsulant 141 by thin film processes to be electrically connected to the second conductive post 112. The method for forming the redistribution circuit structure 110 here is similar to the method for forming the redistribution circuit structure 110 described with reference to FIG. 1B, except that a width $D_N$ of a portion closer to the lower semiconductor chip 120 of the opening 114H formed in the dielectric layer 114 may be smaller than a width $D_F$ of a portion farther from the lower semiconductor chip 120, as shown in the enlarged view in FIG. 6H. In other words, an actuated angle α between the tapered sidewalls of the opening 114H and the surface of the dielectric layer 114 may be greater than 90°. Next, an opening O1 is formed in the outermost dielectric layer 114 of the redistribution circuit structure 110 to expose the redistribution circuit layer 116. A width $D_I$ of a portion of the opening O1 closer to the lower semiconductor chip 120 may be smaller than a width $D_O$ of a portion farther from the lower semiconductor chip 120. In other words, an actuated angle β between the tapered sidewalls of the opening O1 and the surface of the dielectric layer 114 may be greater than 90°.

Figure 6I:
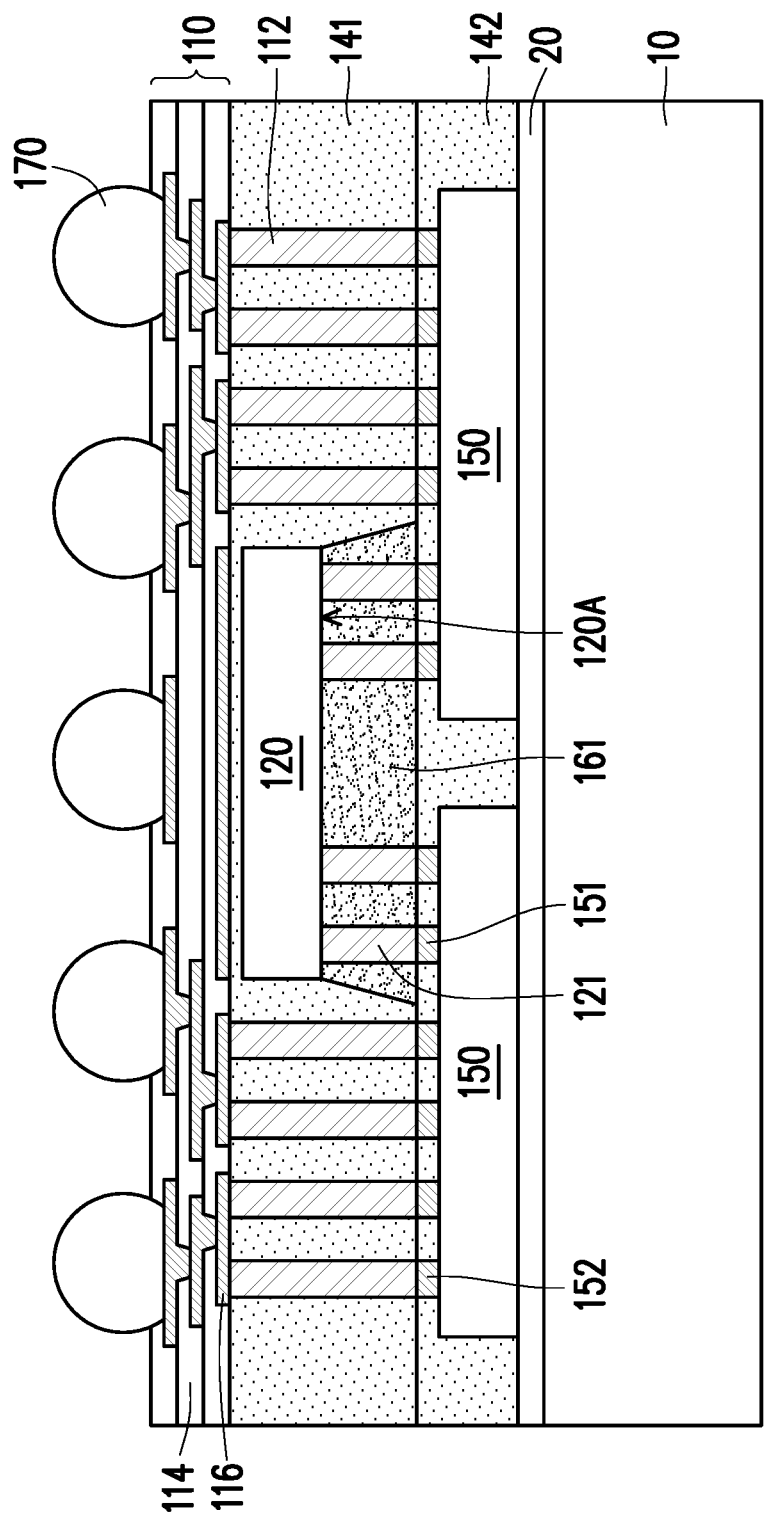

Referring to FIG. 6I, a conductive terminal 170 may be formed on the redistribution circuit structure 110. For example, the conductive terminal 170 may be placed in the opening O1 formed in the previous step by using a pick-up equipment so that the conductive terminal 170 and the redistribution circuit layer 116 are electrically connected. Then, the conductive terminal 170 and the redistribution circuit layer 116 are bonded by a reflow process.

Figure 6J:
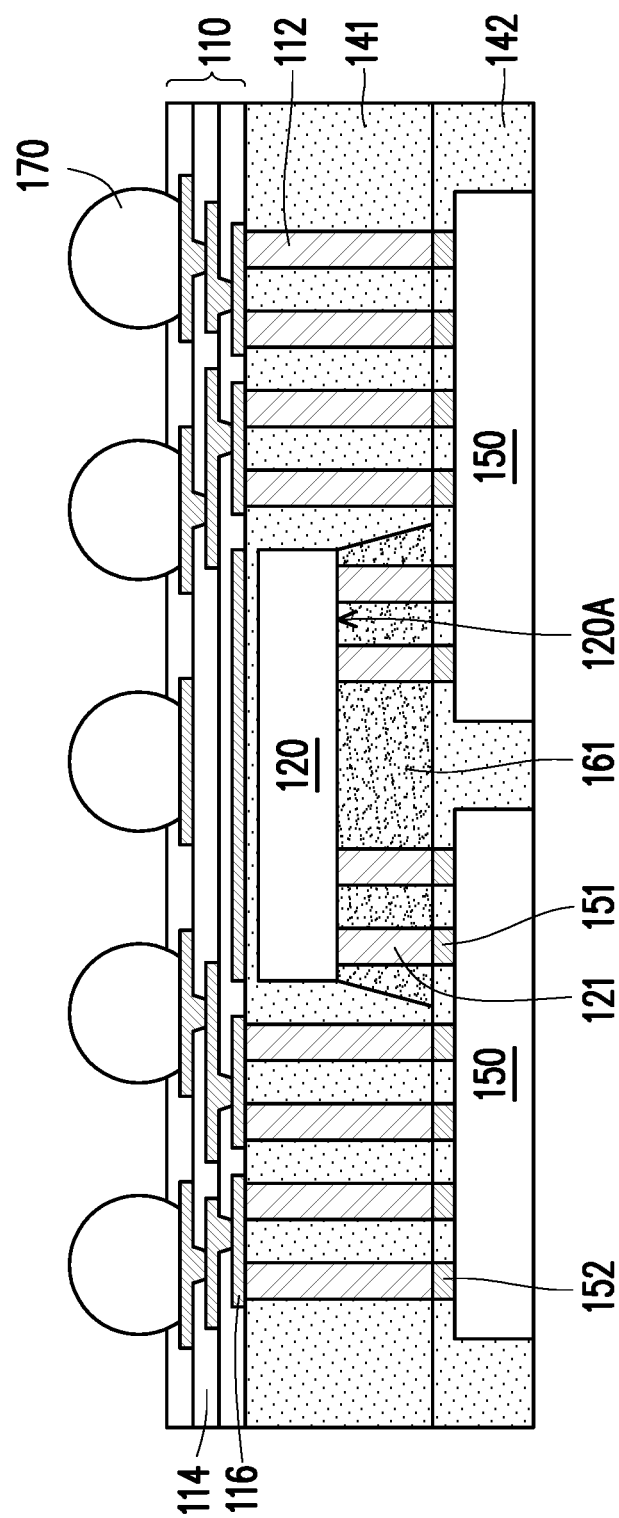

Referring to FIG. 6I, FIG. 6J, and FIG. 8, a release process is performed to separate the structure shown in FIG. 8 from the carrier 10 and the release film 20, so as to complete a semiconductor package 500 of FIG. 8. The release process here is similar to the release process described above with reference to FIG. 1H and FIG. 1I, which will not be reiterated here.

FIG. 9A to FIG. 9I are cross-sectional views of steps of a manufacturing process for manufacturing a multi-chip package according to an embodiment of the disclosure. FIG. 10 is a cross-sectional view illustrating a multi-chip package according to an embodiment of the disclosure. The same or similar components in the multi-chip packages shown in FIG. 9A to FIG. 10 as aforementioned are given the same reference numerals and the descriptions of the components having the same reference numerals are the same as aforementioned, which will not be reiterated here.

Referring to FIG. 9A, a carrier 10 is provided. A release film 20 is formed on the carrier 10.

Referring to FIG. 9B, a first redistribution circuit structure 610 is formed by forming a dielectric layer 614 and a redistribution circuit layer 616 on the release film 20 by thin film processes. The method and material for forming the dielectric layer 614 and the redistribution circuit layer 616 are similar to the method and material for forming the redistribution circuit layer 116 and the dielectric layer 114 described above with reference to FIG. 1B, except that the redistribution circuit layer 616 is formed after the dielectric layer 614 is first formed on the release film 20. The rest of the content is the same as the above content, which will not be reiterated here.

Figure 9C:
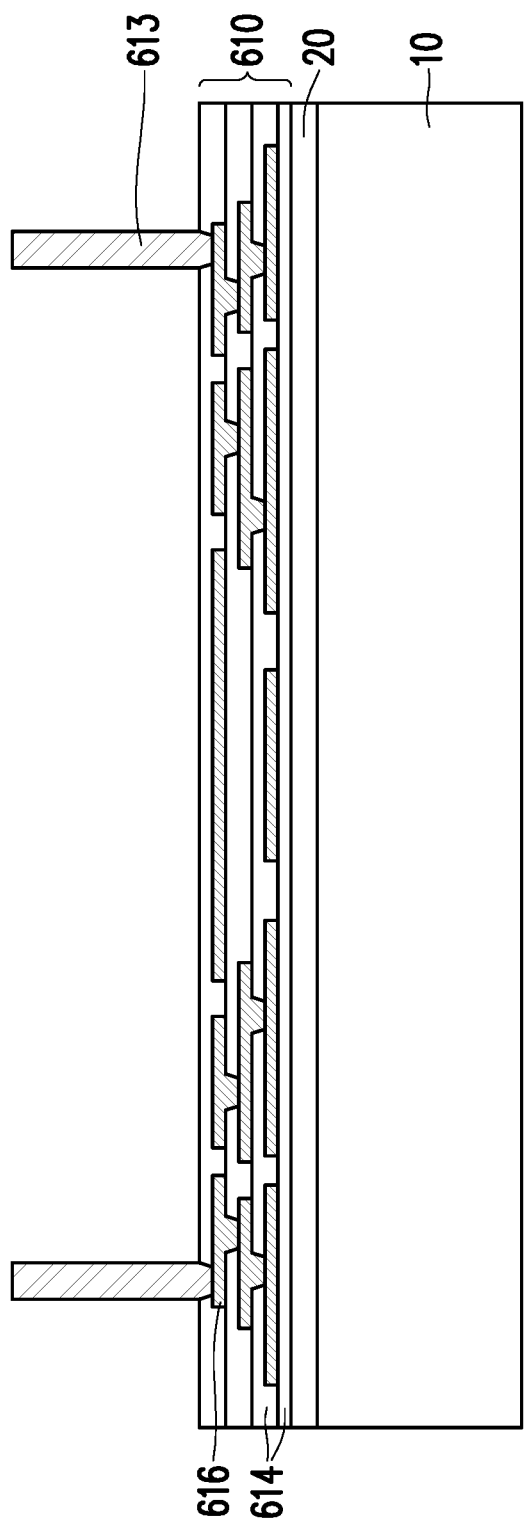
Figure 10:
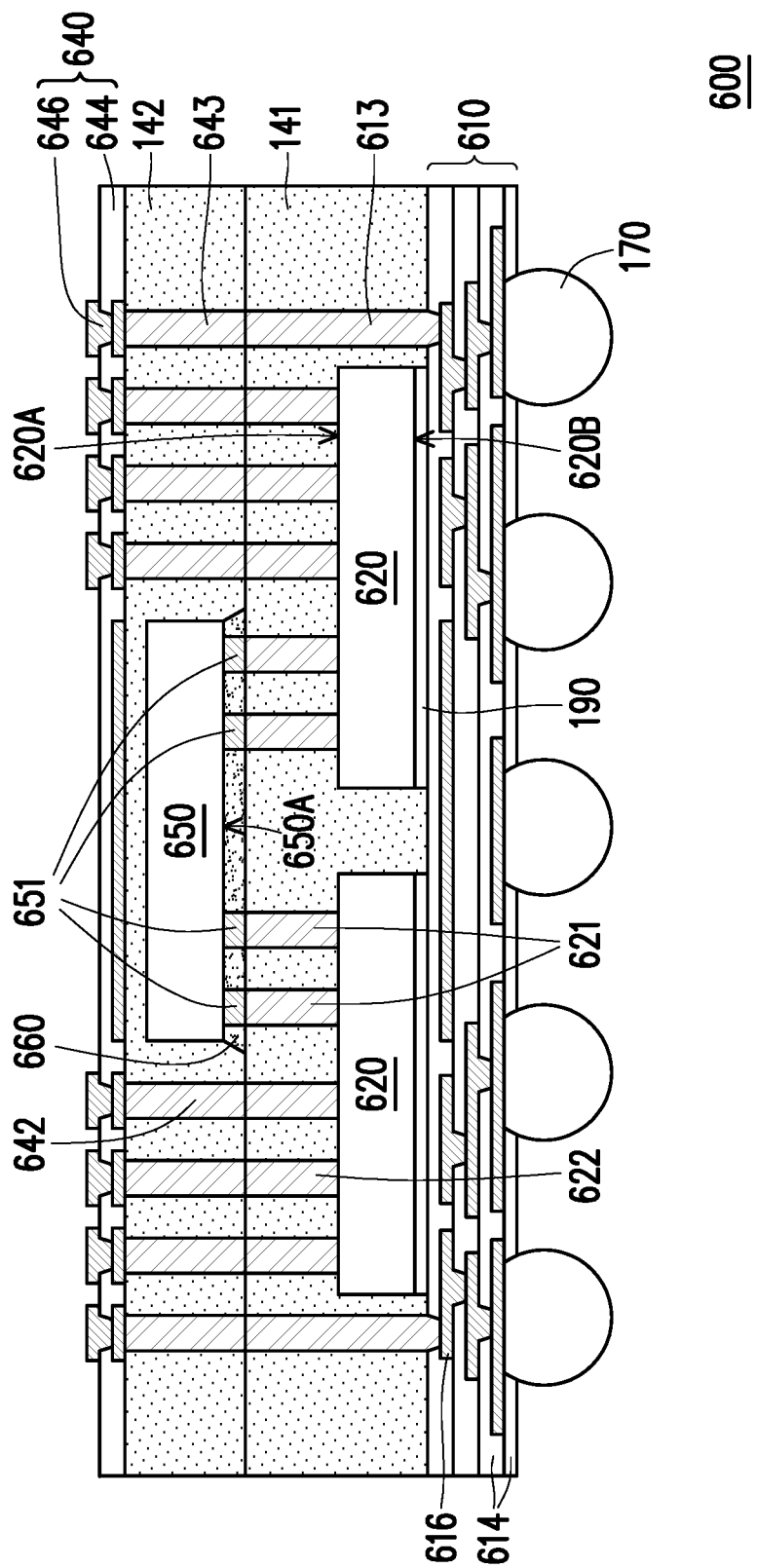
FIG. 10 is a cross-sectional view illustrating a multi-chip package according to an embodiment of the disclosure.

Referring to FIG. 9C, a lower conductive post 613 may be formed on the first redistribution circuit structure 610. The method and material for forming the lower conductive post 613 are similar to the method and material for forming the second conductive post 112 described above with reference to FIG. 1C, which will not be reiterated here.

Figure 9D:
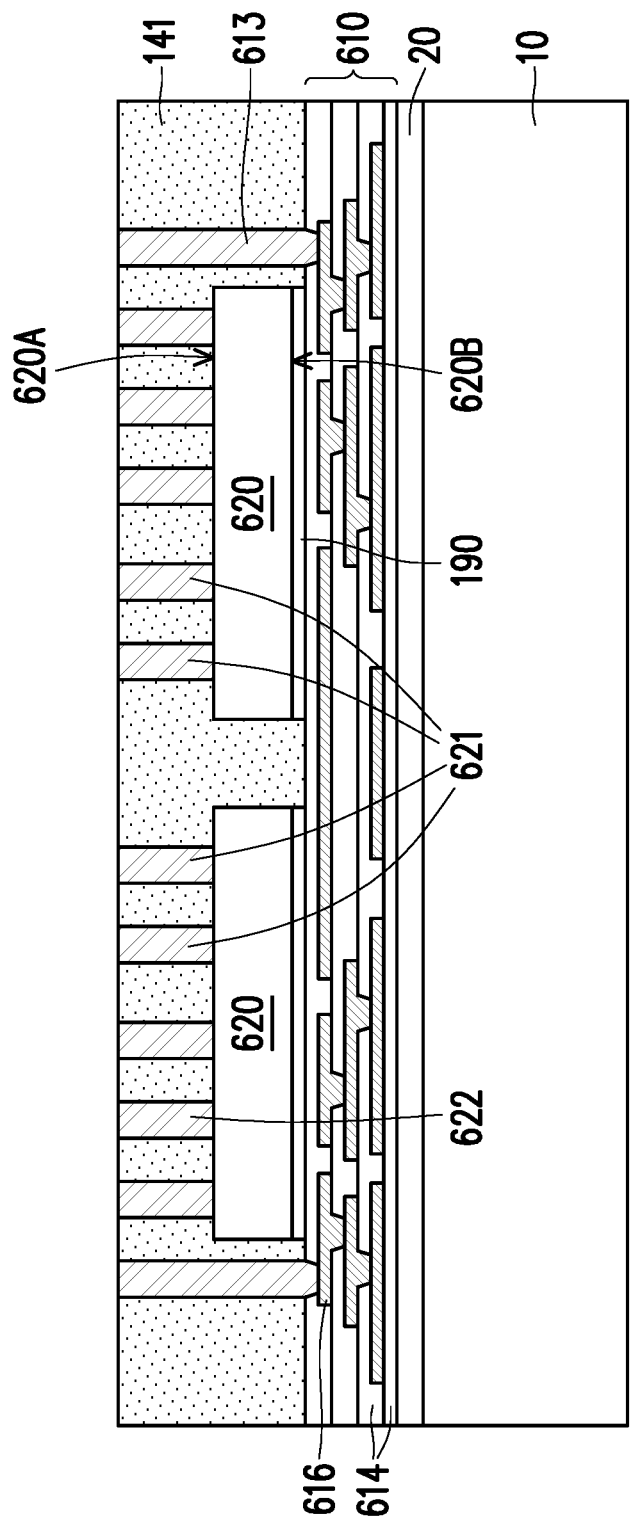

Referring to FIG. 9D, a first back surface 620B of multiple lower semiconductor chips 620 may be attached onto the first redistribution circuit structure 610 by an adhesive layer 190 such as a DAF. The lower semiconductor chip 620 may be a semiconductor chip, such as a memory chip, a logic chip, a digital chip, an analog chip, a sensor chip, an AI chip, a wireless and radio frequency chip, a voltage regulator chip, etc., formed with a semiconductor integrated circuit. The sensor chip may be an image sensor chip, including at least a CCD or a CMOS image sensor. The lower semiconductor chip 620 has a first conductor 621 and a second conductor 622 on a first active surface 620A. The materials of the first conductor 621 and the second conductor 622 include, for example, conductive materials such as copper (Cu), silver (Ag), palladium (Pd), aluminum (Al), nickel (Ni), titanium (Ti), gold (Au), platinum (Pt), tungsten (W), an alloy thereof, etc.

Continue referring to FIG. 9D, a first encapsulant 141 is formed. The first encapsulant 141 encapsulates the lower semiconductor chip 620 and the lower conductive post 613. After the first encapsulant 141 is formed, a wafer grinding process or a surface planarization process may be executed so that surfaces of the first conductor 621, the second conductor 622, and the lower conductive post 613 are exposed.

Figure 9E:
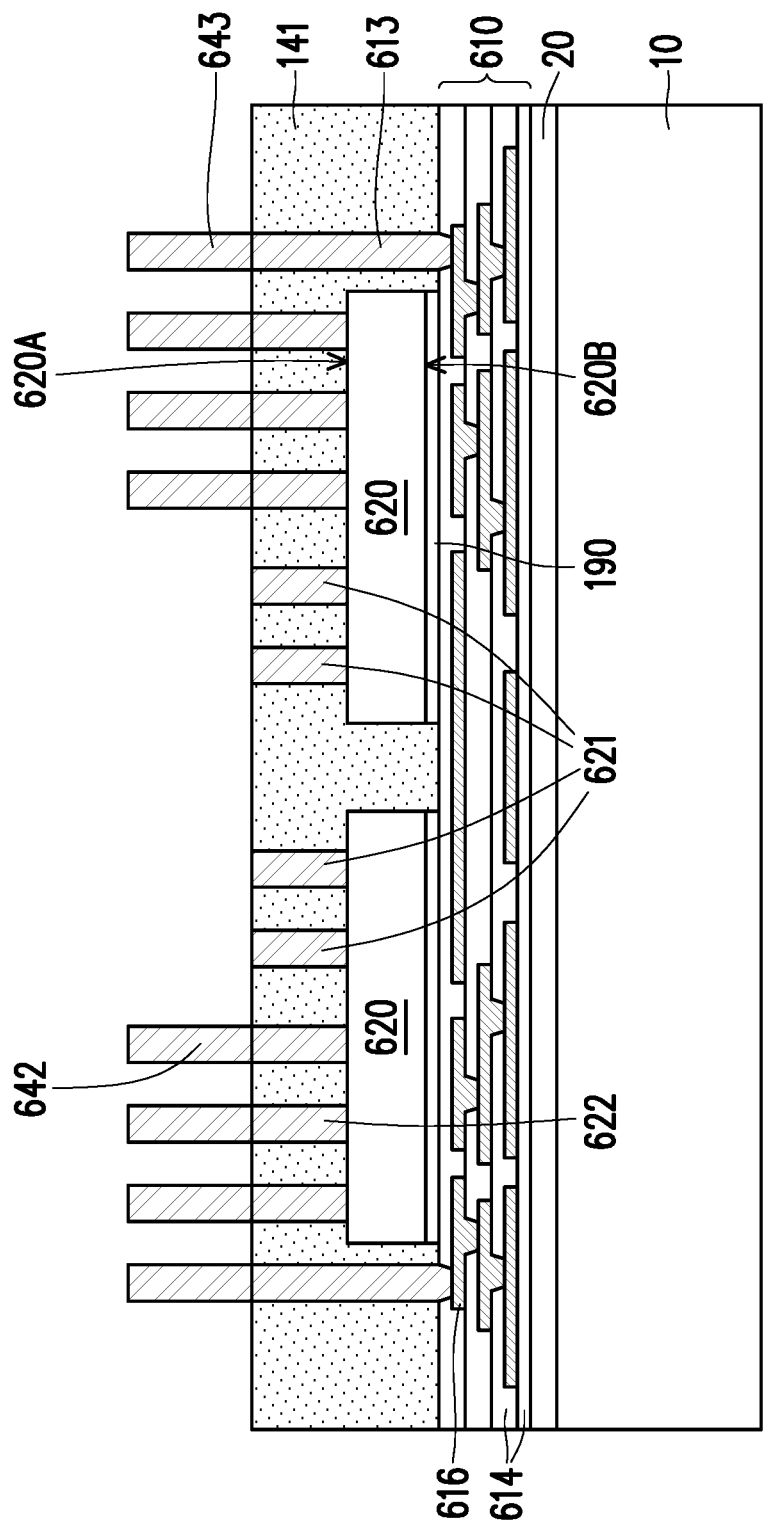

Referring to FIG. 9E, a second conductive post 642 and a third conductive post 643 may be respectively formed on the second conductor 622 and the lower conductive post 613. The method of forming the second conductive post 642 and the third conductive post 643 here is similar to the method of forming the second conductive post 112 described above with reference to FIG. 6D, which will not be reiterated here. The materials of the second conductive post 642 and the third conductive post 643 include, for example, conductive materials such as copper (Cu), silver (Ag), palladium (Pd), aluminum (Al), nickel (Ni), titanium (Ti), gold (Au), platinum (Pt), tungsten (W), an alloy thereof, etc.

Figure 9F:
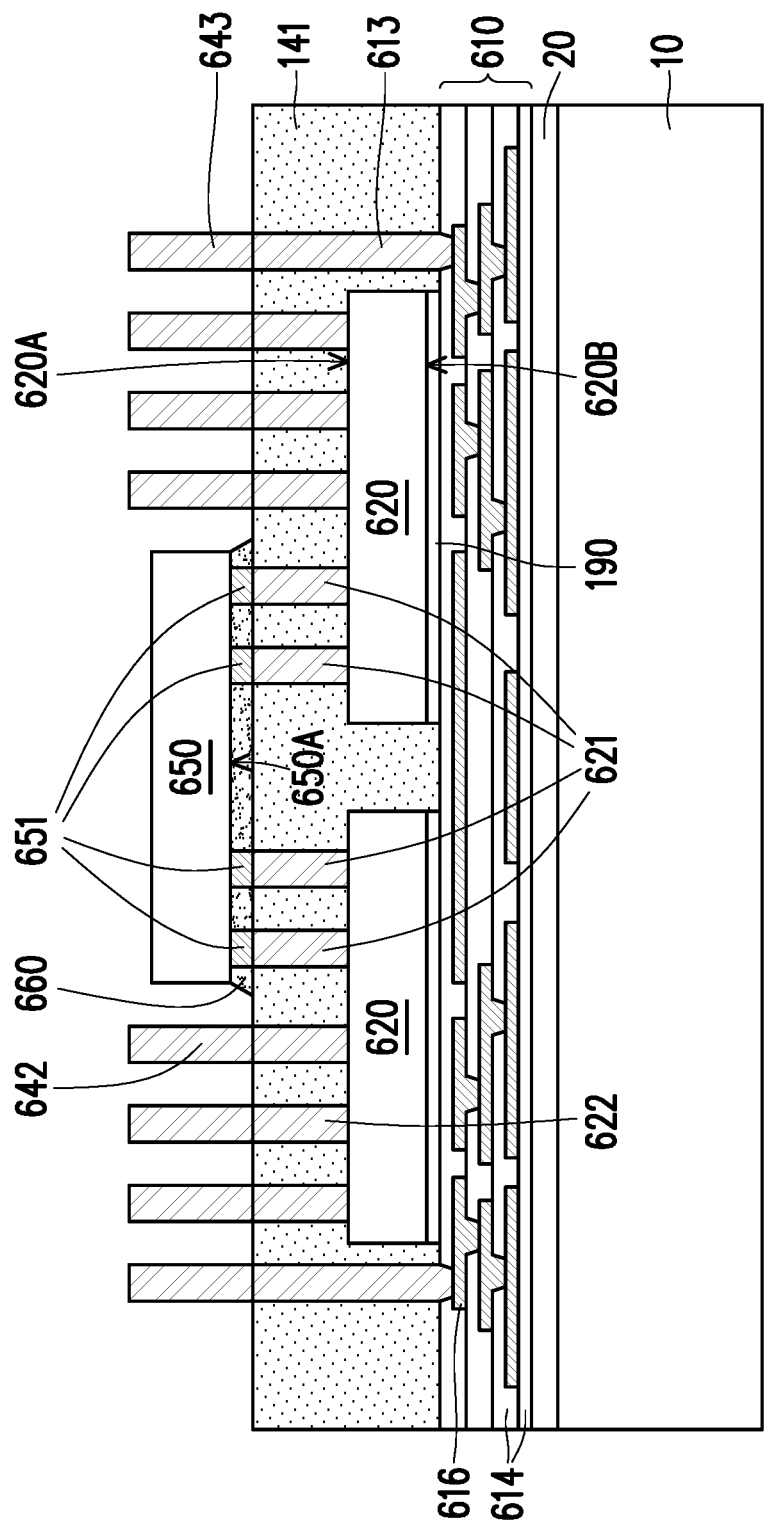

Referring to FIG. 9F, the upper semiconductor chip 650 is installed onto the first encapsulant 141 to connect the first conductive post 651 on the second active surface 650A of the upper semiconductor chip 650 and the first conductor 621 of the lower semiconductor chip 620 to each other. The method for installing the upper semiconductor chip 650 here is similar to the method for installing the lower semiconductor chip 120 described above with reference to FIG. 6E, which will not be reiterated here. In addition, the connection method of the first conductive post 121 and the first conductor 151 described with reference to FIG. 7A to FIG. 7H is also applicable to the connection method of the first conductive post 651 of the upper semiconductor chip 650 and the first conductor 621 of the lower semiconductor chip 620. In other words, an underfill 660 may be formed before or after the first conductive post 651 of the upper semiconductor chip 650 and the first conductor 621 of the lower semiconductor chip 620 are bonded. When the underfill 660 is formed after the first conductive post 651 of the upper semiconductor chip 650 and the first conductor 621 of the lower semiconductor chip 620 are bonded, the underfill 660 has tapered sidewalls, and the width of the underfill 660 gradually decreases from one end closer to the first encapsulant 141 toward the other end closer to the upper semiconductor chip 650. When the underfill 660 is formed before the first conductive post 651 of the upper semiconductor chip 650 and the first conductor 621 of the lower semiconductor chip 620 are bonded, the underfill 660 has tapered sidewalls, and the width of the underfill 660 gradually increases from one end closer to the first encapsulant 141 toward the other end closer to the upper semiconductor chip 650. The upper semiconductor chip 650 may be a memory chip, a logic chip, a digital chip, an analog chip, a sensor chip, an AI chip, a wireless and radio frequency chip, a voltage regulation chip, etc. Although it is not shown in the drawings, in some embodiments, the upper semiconductor chip 650 may have a conductive through-via structure, such as a TSV or a TGV to form a vertical connection path in the upper semiconductor chip 650. In other words, the upper semiconductor chip 650 may be electrically connected to other components from the second active surface 650A and/or a surface opposite to the second active surface 650A by the conductive through-via structure. For example, the upper semiconductor chip 650 may be electrically connected to the second redistribution circuit structure 640 described below by the conductive through-via structure. The material of the first conductive post 651 includes, for example, a conductive material such as copper (Cu), silver (Ag), palladium (Pd), aluminum (Al), nickel (Ni), titanium (Ti), gold (Au), platinum (Pt), tungsten (W), an alloy thereof, etc.

Figure 9G:
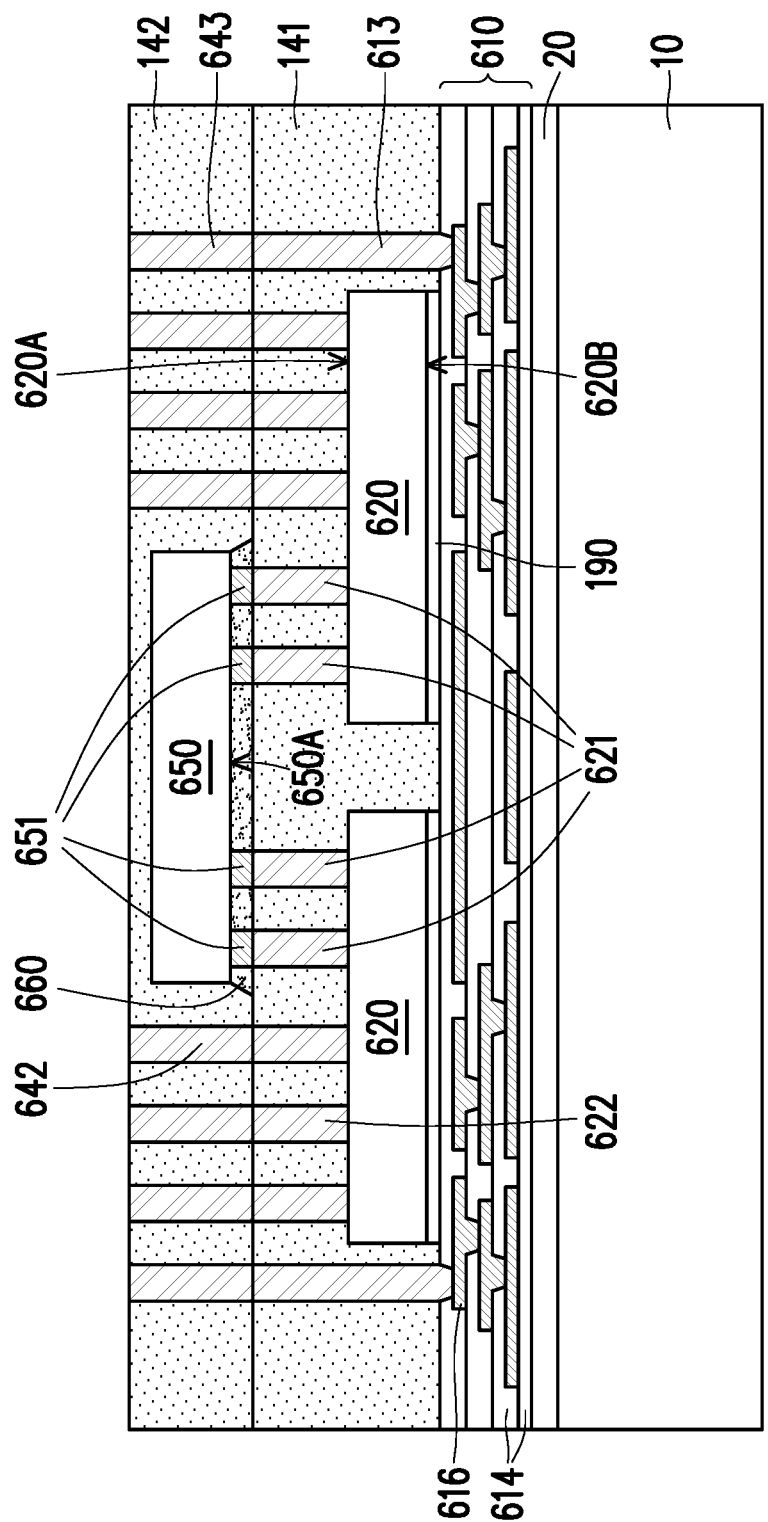

Referring to FIG. 9G, a second encapsulant 142 is formed. The second encapsulant 142 encapsulates the upper semiconductor chip 650. The method for forming the second encapsulant 142 includes the following steps. An encapsulant material layer covering the first encapsulant 141, the upper semiconductor chip 650, the second conductive post 642, and the third conductive post 643 is formed on the carrier 10 by a suitable process (such as a molding process or a deposition process). Then, a wafer grinding process or a surface planarization process is executed so that surfaces of the second conductive post 642 and the third conductive post 643 are exposed.

Figure 9H:
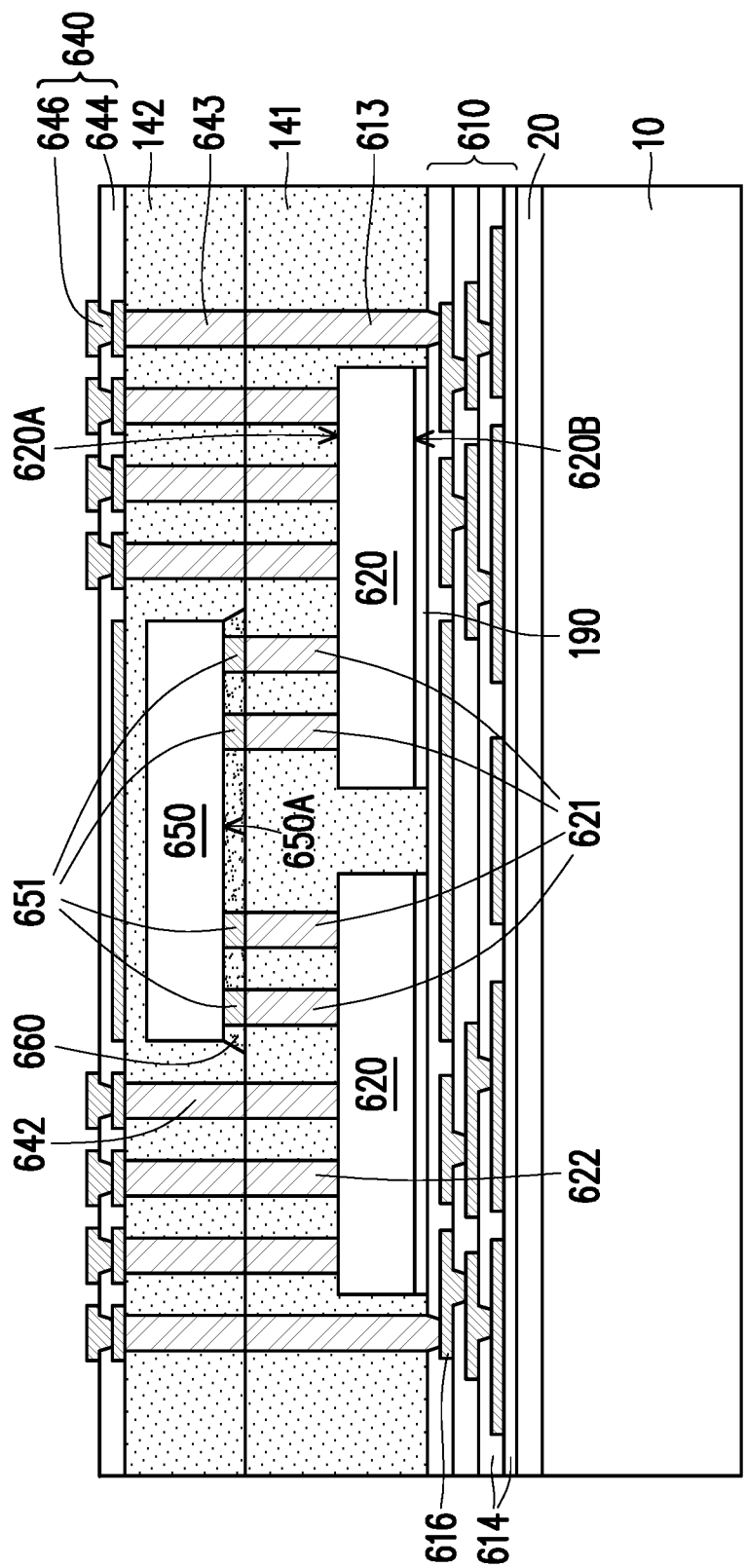

Referring to FIG. 9H, a second redistribution circuit structure 640 including a second redistribution circuit layer 646 and a second dielectric layer 644 is formed on the second encapsulant 142 to be electrically connected to the second conductive post 642 and the third conductive post 643. The materials and methods for forming the second redistribution circuit structure 640 are similar to the materials and methods for forming the redistribution circuit structure 110 described above with reference to FIG. 1B, which will not be reiterated here.

Figure 9I:
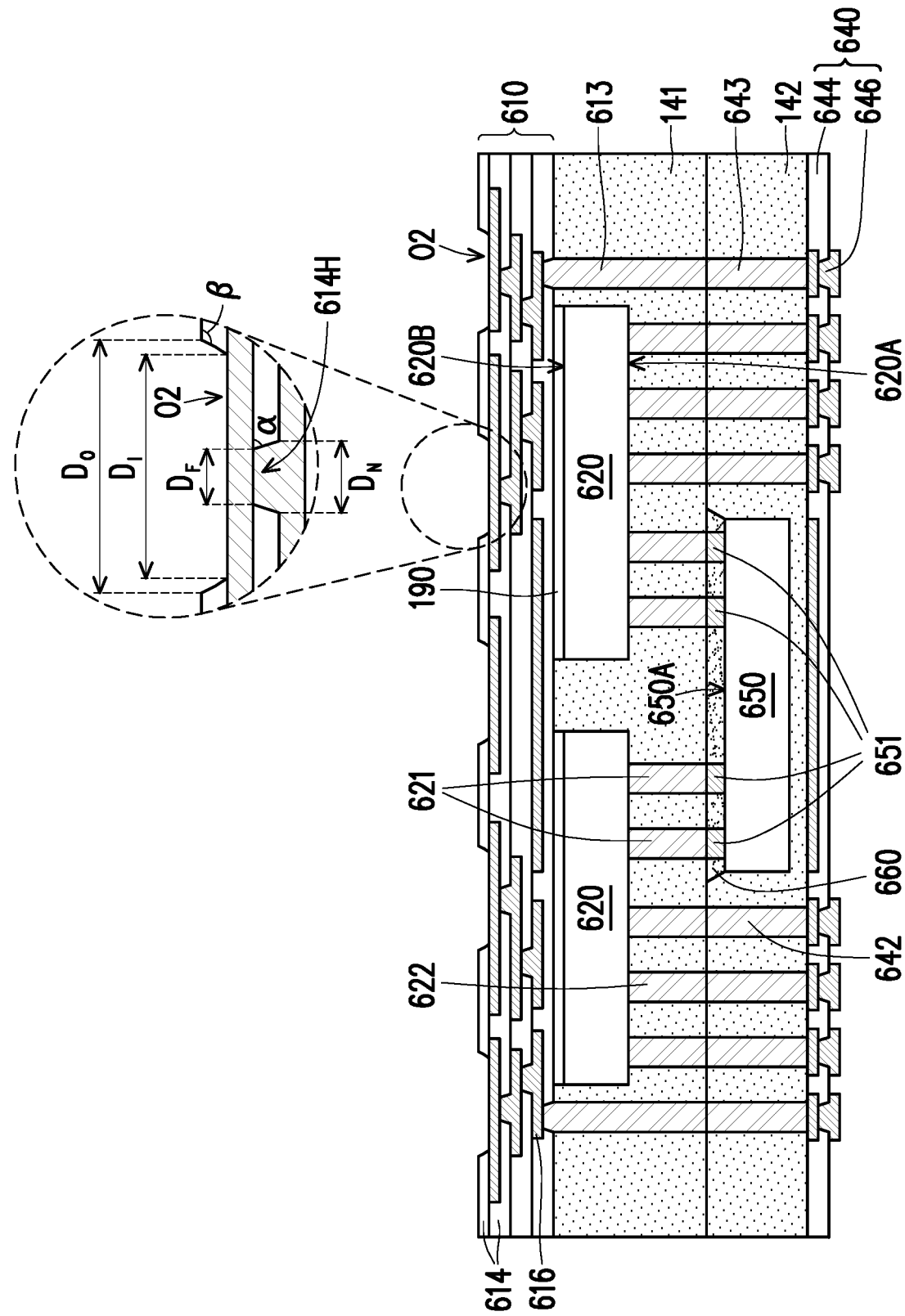

Referring to FIG. 9H, FIG. 9I, and FIG. 10, the release process such as described with reference to FIG. 1H and FIG. 1I is performed to separate the structure shown in FIG. 9I from the carrier 10 and the release film 20. Next, the structure may be inverted to form an opening O2 on the outermost first dielectric layer 614 to expose at least a portion of the first redistribution circuit layer 616. Referring to the enlarged view in FIG. 9I, an outer width $D_O$ of the opening O2 formed in the outermost first dielectric layer 614 may be greater than an inner width $D_I$. A width $D_N$ of a portion closer to the lower semiconductor chip 120 of an opening 614H formed in the inner first dielectric layer 614 may be greater than a width $D_F$ of a portion farther from the lower semiconductor chip 120. In other words, the width change direction of the opening O2 is opposite to the width change direction of the opening in the first dielectric layer 614 below. Next, the conductive terminal 170 is placed into the opening O2 formed using a pick-up equipment. Then, the conductive terminal 170 and the first redistribution circuit layer 616a are bonded by a reflow process to form a multi-chip package 600 of FIG. 10.

Figure 11:
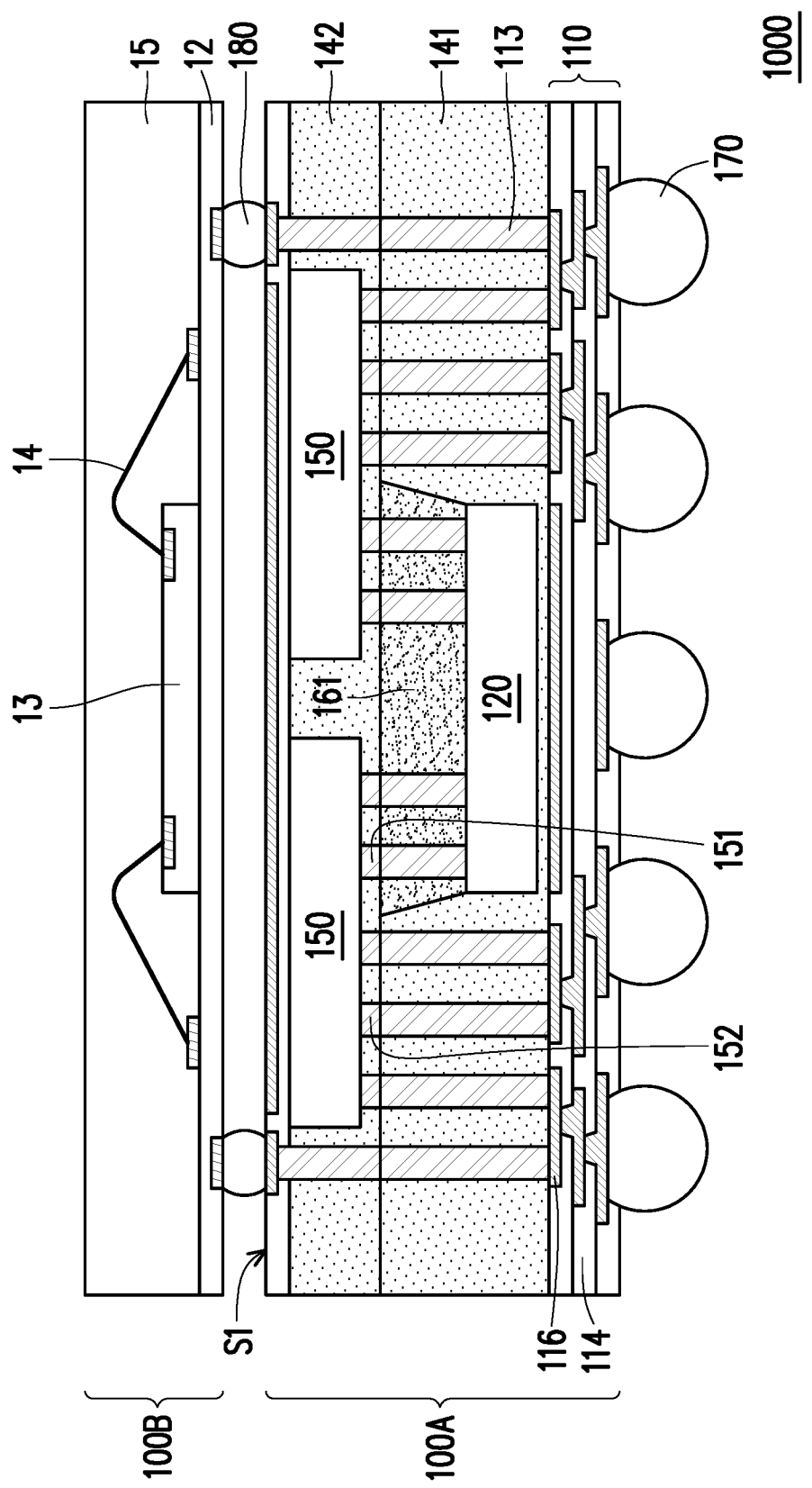
FIG. 11 is a cross-sectional view illustrating a package on package (PoP) according to an embodiment of the disclosure.

FIG. 11 is a cross-sectional view illustrating a package on package (PoP) according to an embodiment of the disclosure. The same or similar components in the PoP shown in FIG. 11 as the aforementioned are given the same reference numerals and the descriptions of the components having the same reference numerals are the same as the above descriptions, which will not be reiterated here.

Referring to FIG. 11, a PoP 1000 according to an embodiment of the disclosure includes a lower semiconductor package 100A, an upper semiconductor package 100B, and an intermediate conductive terminal 180 connecting the lower semiconductor package 100A and the upper semiconductor package 100B. The lower semiconductor package 100A is the same as the multi-chip package 500 described with reference to FIG. 8, except that the lower semiconductor package 100A further includes a third conductive post 113 and a top redistribution circuit structure 140, the third conductive post 113 penetrates the first encapsulant 141 and the second encapsulant 142, and is connected to the redistribution circuit structure 110 and the top redistribution circuit structure 140. The material of the third conductive post 113 includes, for example, a conductive material such as copper (Cu), silver (Ag), palladium (Pd), aluminum (Al), nickel (Ni), titanium (Ti), gold (Au), platinum (Pt), tungsten (W), an alloy thereof, etc. The upper semiconductor package 100B includes a substrate 12, a semiconductor chip 13, and an encapsulant 15. The semiconductor chip 13 may be disposed on the substrate 12 facing up and connected to a circuit layer (not shown) in the substrate 12 by a welding wire 14. The encapsulant 15 is disposed on the substrate 12 and encapsulates the semiconductor chip 13 and the welding wire. The intermediate conductive terminal 180 is located on a top surface S1 of the multi-chip package 100A. The intermediate conductive terminal 180 is, for example, a solder ball, but the disclosure is not limited thereto.

The top redistribution circuit structure 140 of the lower semiconductor package 100A may be omitted as required. In addition, although the lower semiconductor package 100A in the PoP 1000 is shown as having a structure similar to that of the multi-chip package 500 described with reference to FIG. 8, the disclosure is not limited thereto. The lower semiconductor package 100A in the PoP 1000 may also have a structure similar to that of the multi-chip package 100, the multi-chip package 200, and the multi-chip package 600 described with reference to FIG. 2, FIG. 3, and FIG. 10.

Figure 12:
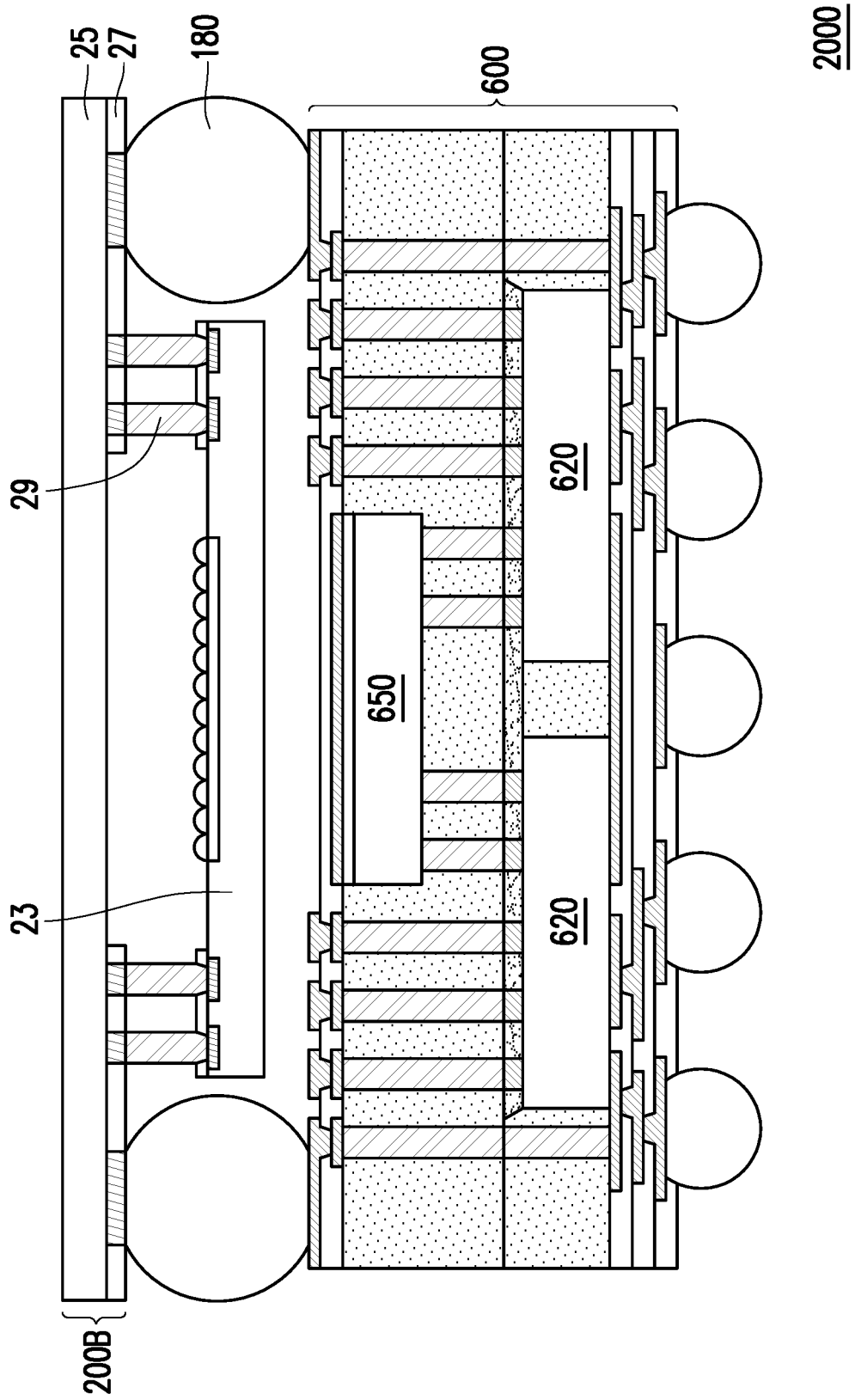
FIG. 12 is a cross-sectional view illustrating a PoP according to an embodiment of the disclosure.

FIG. 12 is a cross-sectional view of a PoP according to an embodiment of the disclosure. The same or similar components in the PoP shown in FIG. 12 as aforementioned are given the same reference numerals and the descriptions of the components having the same reference numerals are the same as the aforementioned, which will not be reiterated.

Referring to FIG. 12, a PoP 2000 according to an embodiment of the disclosure includes a multi-chip package 600, an image sensor package 200B, and an intermediate conductive terminal 180 connecting the multi-chip package 600 and the image sensor package 200B. The image sensor package 200B includes at least a transparent substrate 25 located on top of the image sensor package 200B, an image sensor chip 23 below the transparent substrate 25, a circuit layer 27 on the transparent substrate 25, and a connection conductor 29 connecting the image sensor chip 23 and the circuit layer 27. The image sensor chip 23 may be a CMOS image sensor chip. However, the disclosure does not limit the type of the image sensor chip 23, which may be other appropriate types of image sensor chips. The image sensor chip 23 may be electrically connected to the multi-chip package 600 by the connection conductor 29, the circuit layer 27, and the intermediate conductive terminal 180.

Unless there are other obviously contradictory or obviously different descriptions, the related descriptions of the components with the same reference numerals in the above embodiments are also applicable to the components with the same reference numerals in this embodiment, which will not be reiterated here.

FIG. 13A to FIG. 13L are cross-sectional views of steps of a manufacturing process for manufacturing a multi-chip package according to an embodiment of the disclosure.

Figure 13A:
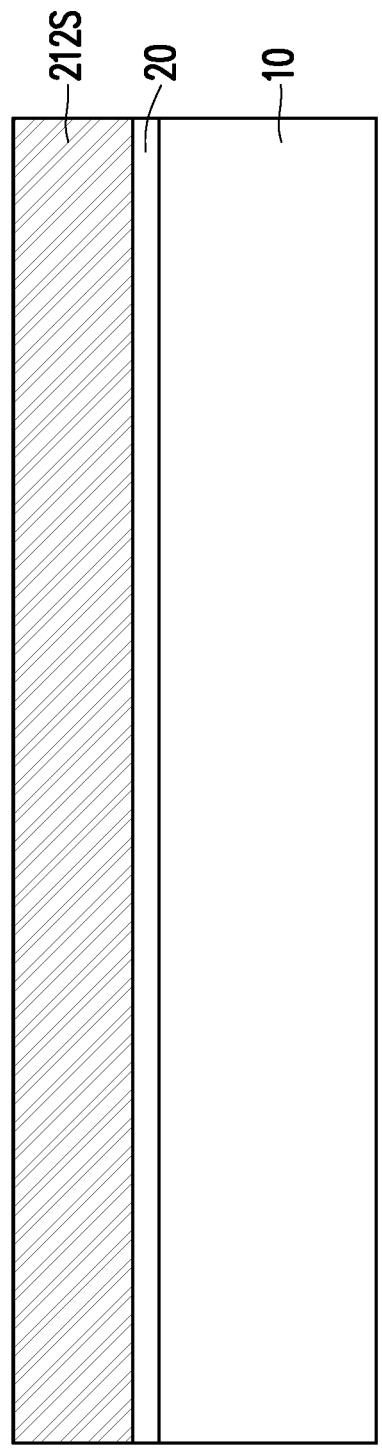
FIG. 13A to FIG. 13L are cross-sectional views of steps of a manufacturing process for manufacturing a multi-chip package according to an embodiment of the disclosure.

Referring to FIG. 13A, a carrier 10 is provided. A release film 20 and a seed layer 212S may be sequentially formed on the carrier 10.

The carrier 10 may be a supporting substrate used during a semiconductor chip packaging process. The material of the carrier 10 may include glass, ceramic, semi-conductor, etc. Although it is shown in the drawing that a single multi-chip package is packaged on the carrier 10, the carrier 10 may also be a large-size wafer type carrier. In other words, multiple multi-chip packages may be formed on the carrier 10 at the same time.

The release film 20 may be formed from an adhesive (for example, an ultra-violet (UV) glue, a light-to-heat conversion (LTHC) glue, or other types of adhesives). Taking the release film 20 formed from the UV glue as an example, an UV light may be irradiated on the release film 20, so that viscosity of the release film 20 is lost or reduced, thereby enabling the carrier 10 and the release film 20 to be separated from a structure formed in subsequent steps. Taking the LTHC glue as an example, light of appropriate energy may be irradiated on the release film 20, so that the release film 20 is decomposed under the heat energy of the light and viscosity of the release film 20 is lost or reduced, thereby enabling the carrier 10 and the release film 20 to be separated from the structure formed in subsequent steps.

The seed layer 212S may be formed on the release film 20 by a sputtering or deposition process. The material of the seed layer 212S may be, for example, a conductive material such as titanium, copper, etc.

Figure 13B:
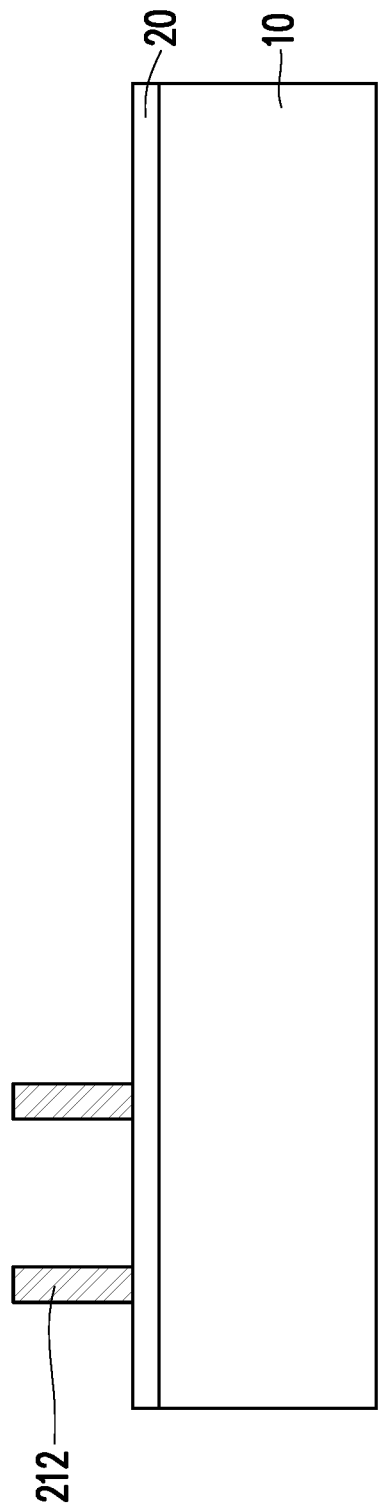

Referring to FIG. 13B, a conductive pillar 212 may be formed on the carrier 10. For example, the process of forming the conductive post 212 includes the following steps. First, a patterned photoresist layer is formed on the seed layer 212S. The patterned photoresist layer may be formed by a lithography and/or etching process. An opening of the patterned photoresist layer exposes a surface of the seed layer 212S. Then, multiple conductive post-shape structures may be formed in the opening of the patterned photoresist layer. The method for forming the conductive post-shape structures may be, for example, printing, electroplating, electroless plating, or a combination thereof. After that, the patterned photoresist layer and a portion of the seed layer are removed to form the conductive post 212. The material of the conductive post 212 may be formed using a metal or an alloy thereof having excellent electrical characteristics, such as copper (Cu), silver (Ag), palladium (Pd), aluminum (Al), nickel (Ni), titanium (Ti), gold (Au), platinum (Pt), tungsten (W), or an alloy thereof. Then, the seed layer 212S on the release film 20 can be removed by etching or a lithography process.

Figure 13C:
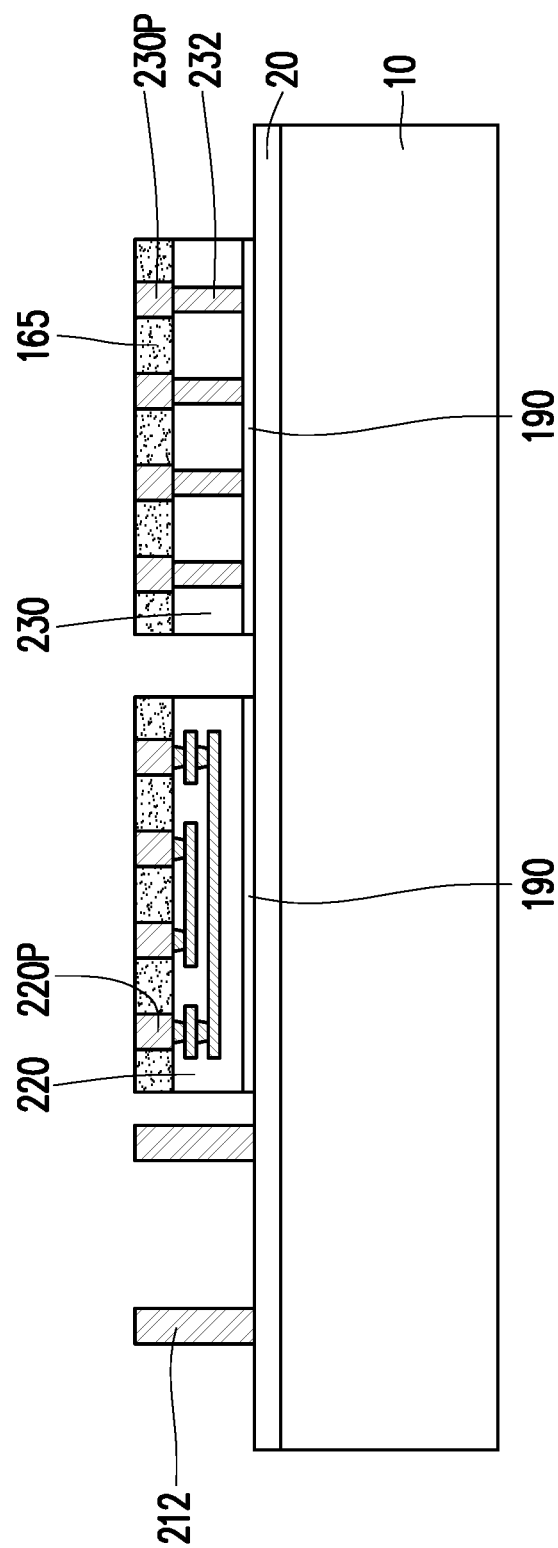

Referring to FIG. 13C, a first lower semiconductor chip 220 and a second lower semiconductor chip 230 may be attached onto the release film 20 with a back surface by an adhesive layer 190 such as a die attach film (DAF), etc. The first lower semiconductor chip 220 and the second lower semiconductor chip 230 may be independently a semiconductor chip, such as a memory chip, a logic chip, a digital chip, an analog chip, a sensor chip, an AI chip, a wireless and radio frequency chip, a voltage regulator chip, etc., formed with a semiconductor integrated circuit. The sensor chip may be an image sensor chip, including at least a CCD or a CMOS image sensor.

In the present embodiment, the second lower semiconductor chip 230 may have a conductive through-via structure 232 such as a through silicon via (TSV) or a through glass via (TGV) to form a vertical connection path in the second lower semiconductor chip 230. In other words, the second lower semiconductor chip 230 may be electrically connected to other components from an active surface provided with a second lower connecting conductor 230P and/or a surface opposite to the active surface through the conductive through-via structure 232. Although the disclosure is shown in the drawings that only the second lower semiconductor chip 230 has the conductive through-via structure 232, the disclosure is not limited thereto. The first lower semiconductor chip 220 may also have a conductive through-via structure as needed.

The first lower semiconductor chip 220 and the second lower semiconductor chip 230 respectively have a first lower connection conductor 220P and a second lower connection conductor 230P connected to the internal circuit of the semiconductor chip on their active surfaces. The material of the first lower connection conductor 220P and the second lower connection conductor 230P may include, for example, copper (Cu), silver (Ag), palladium (Pd), aluminum (Al), nickel (Ni), titanium (Ti), gold (Au), platinum (Pt), tungsten (W), or other metals or alloys thereof having excellent electrical characteristics. The first lower semiconductor chip 220 and the second lower semiconductor chip 230 may have a protective layer 165 on the active surfaces thereof to encapsulate at least a portion of the first lower connection conductor 220P and the second lower connection conductor 230P. The material of the protective layer 165 may include an organic insulating material such as a molding compound, a molding underfill, a resin, an epoxy molding compound (EMC), etc. The material and configuration of the protective layer 165 of the disclosure are not limited thereto. The protective layer 165 may also be omitted as required.

Figure 13D:
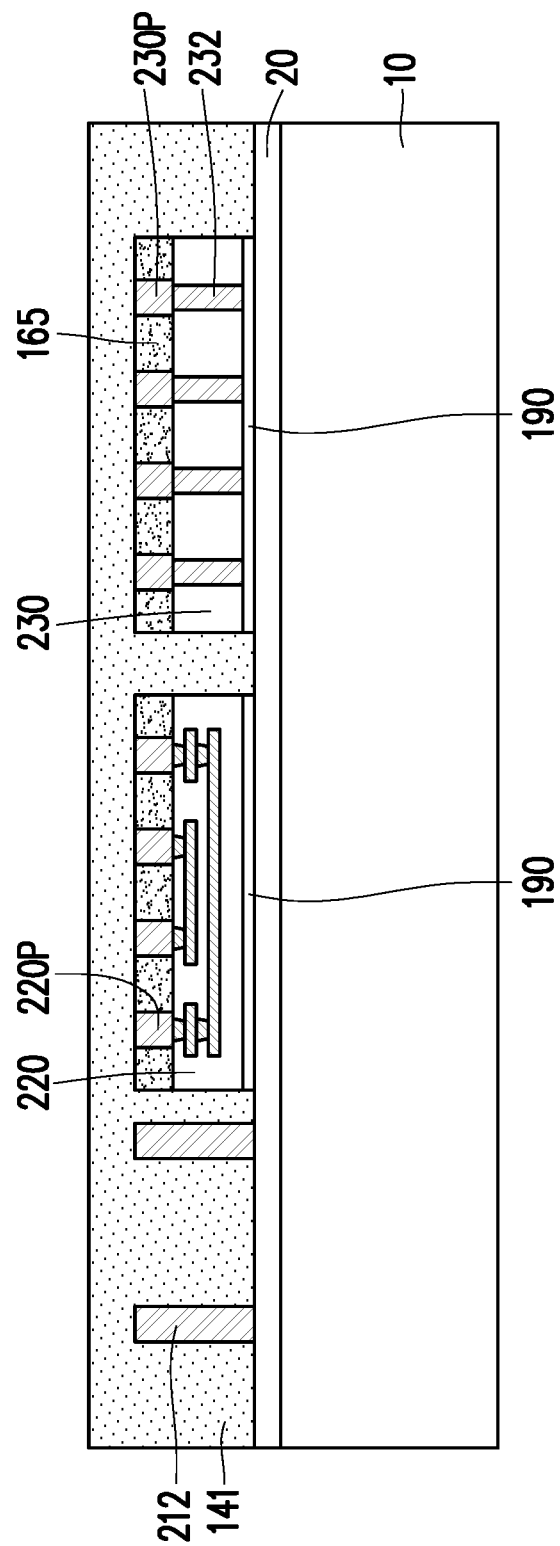
Figure 13E:
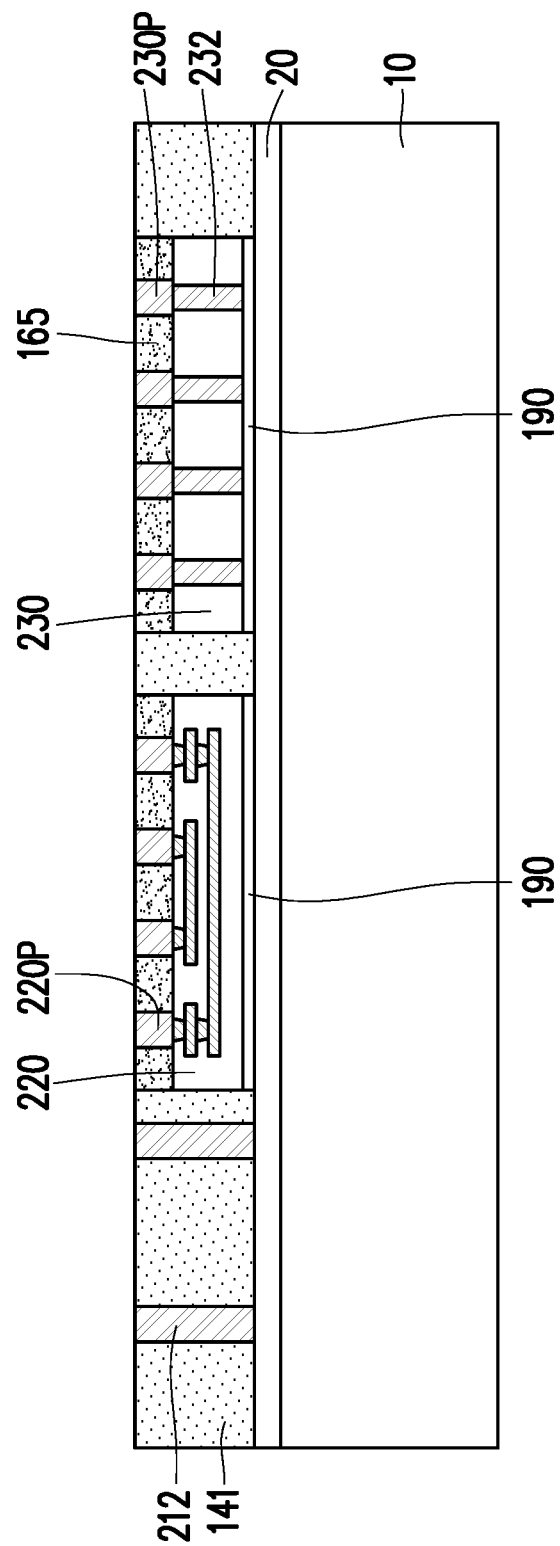

Referring to FIG. 13D and FIG. 13E, a first encapsulant 141 is formed. The first encapsulants 141 encapsulants the first lower semiconductor chip 220, the second lower semiconductor chip 230, and the conductive post 212. The material of the first encapsulant 141 may include a molding compound, a molding underfill, a resin, an EMC, etc. The first encapsulant 141 may be doped with an inorganic filler as required. The method for forming the first encapsulant 141 includes the following steps. An encapsulant material layer covering the first lower semiconductor chip 220, the second lower semiconductor chip 230, and the conductive post 212 is formed on the carrier 10 by a suitable process (such as a molding process or a deposition process). Then, a wafer grinding process or a surface planarization process is executed, so that a surface of the conductive post 212 and a surface of the first lower connection conductor 220P and a surface of the second lower connection conductor 230P are exposed. That is, the surface of the conductive post 212 and the surface of the first lower connection conductor 220P and the surface of the second lower connection conductor 230P are located at the same level. In other words, the upper surfaces of the conductive post 21, the first lower connection conductor 220P, the second lower connection conductor 230P, and the first encapsulant 141 are coplanar.

Figure 13F:
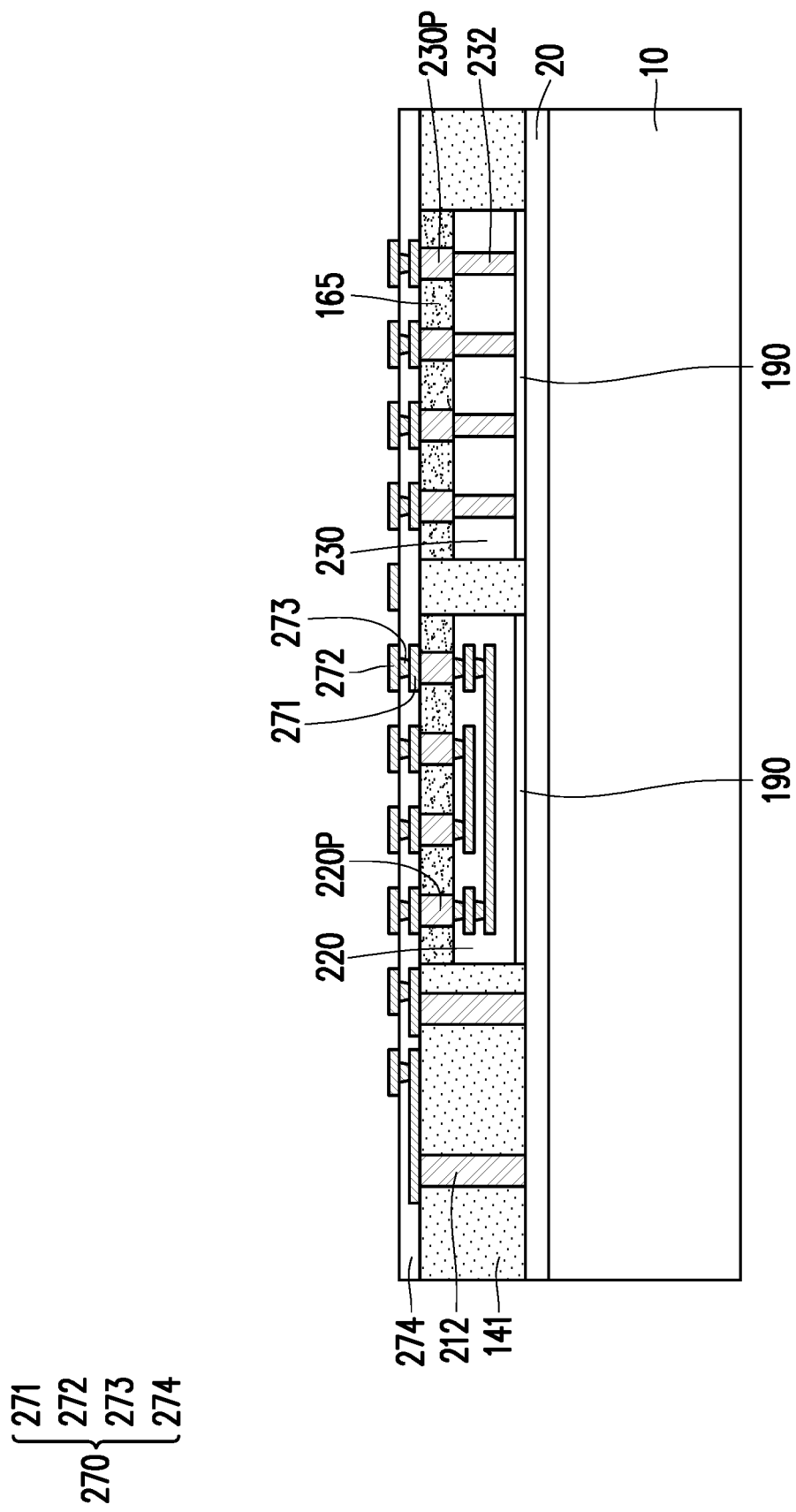

Referring to FIGS. 13E and 13F, an interposer connection structure 270 including a dielectric layer 274, a first conductive pattern 271, a second conductive pattern 272, and a conductive via pattern 273 penetrating the dielectric layer 274 to connect the first conductive pattern 271 and the second conductive pattern 272 may be formed on the structure shown in FIG. 13E by a thin film process.

The interposer connection structure 270 may be formed by a build-up process. For example, the process of forming the interposer connection structure 270 includes the following steps. First, a seed layer is sputtered or deposited on the structure shown in FIG. 13E, wherein the material of the seed layer may be, for example, a conductive material such as titanium, copper, etc. Next, a patterned photoresist layer is formed on the seed layer to expose the seed layer. A conductive material is formed on the seed layer exposed by the patterned photoresist layer by an electroplating process. The conductive material may include copper (Cu), silver (Ag), palladium (Pd), aluminum (Al), nickel (Ni), titanium (Ti), gold (Au), platinum (Pt), tungsten (W), or an alloy thereof. Next, the photoresist layer and the portion of the seed layer not covered by the conductive material are removed to form the first conductive pattern 271.

The first conductive pattern 271 may be formed on the conductive post 212, the first lower connection conductor 220P, and the second lower connection conductor 230P and electrically connected to the conductive post 212, the first lower semiconductor chip 220, and the second lower semiconductor chip 230. In some embodiments, the respective first conductive patterns 271 may be individually connected to the respective conductive post 212, the respective first lower connection conductor 220P, and the respective second lower connection conductor 230P, wherein the line width of the first conductive pattern 271 connected to the conductive post 212 may be larger than the line width of the first conductive pattern 271 connected to the first lower connection conductor 220P or the second lower connection conductor 230P.

Then, the dielectric layer 274 may be formed on the first conductive pattern 271 by a method such as spin coating, chemical vapor deposition (CVD), plasma-enhanced chemical vapor deposition (PECVD), etc. The dielectric layer 274 may be a photosensitive insulating layer including a photosensitive insulating resin. Then, an opening is formed in the dielectric layer 274 to expose the first conductive pattern 271 thereunder, wherein the method for forming the opening in the dielectric layer 274 may be different depending on the material of the dielectric layer 274. When the dielectric layer 274 is a photosensitive insulating layer including a photosensitive insulating resin, the dielectric layer 274 may be patterned by a lithography process to form the opening. When the dielectric layer 274 is a non-photosensitive insulating layer, the dielectric layer 274 may be patterned by a lithography/etching process, a laser drilling process, or a mechanical drilling process to form the opening. Next, for example, a plating process may be applied to fill the opening of the dielectric layer 274 with conductive materials to form the conductive via pattern 273 and the second conductive pattern 272. The width of the conductive via pattern 273 in the cross-sectional view may vary. For example, the width of the conductive via pattern 273 closer to the second conductive pattern 272 may be greater than the width of the conductive via pattern 273 closer to the first conductive pattern 271.

Figure 13G:
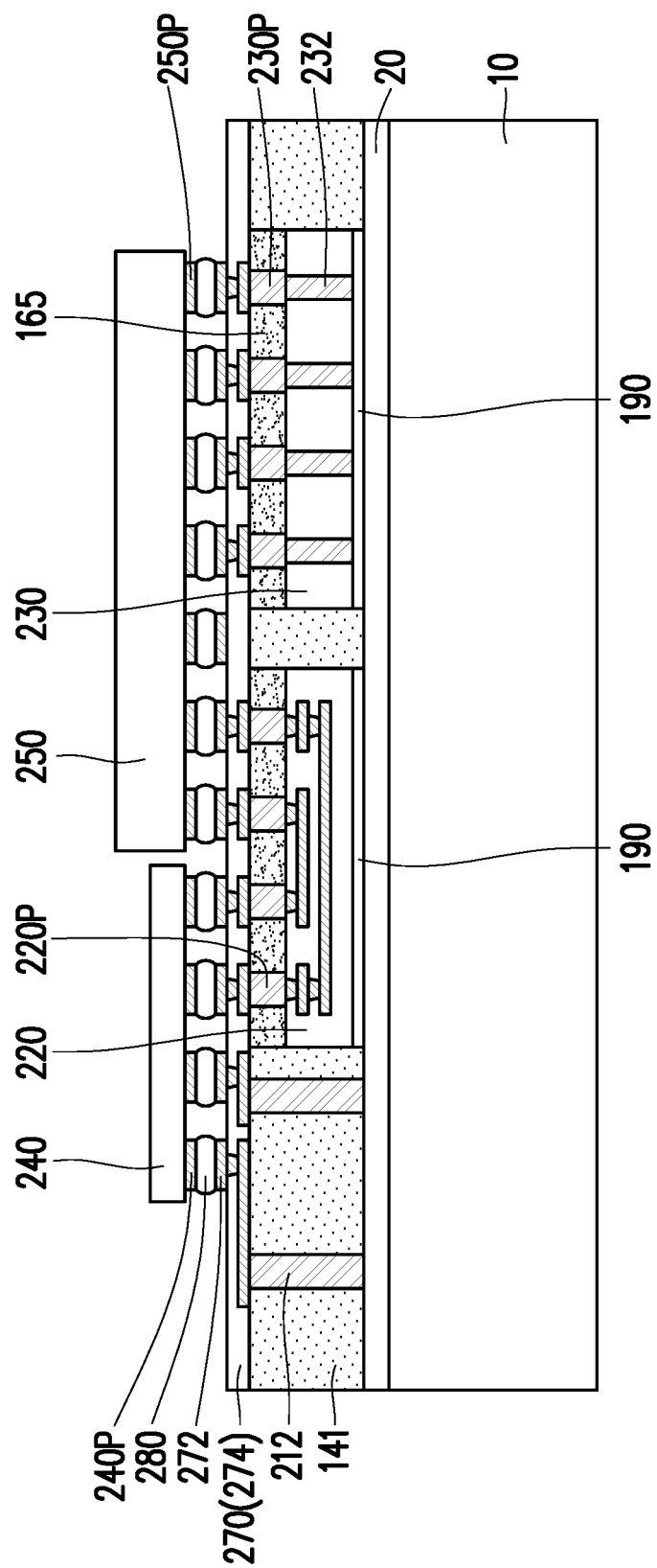

Referring to FIG. 13G, a first upper semiconductor chip 240 and a second upper semiconductor chip 250 are mounted side by side on the interposer connection structure 270 so that a first upper connection conductor 240P on the active surface of the first upper semiconductor chip 240 and the second conductive pattern 272 are electrically connected, and a second upper connection conductor 250P on the active surface of the second upper semiconductor chip 250 and the second conductive pattern 272 are electrically connected. In some embodiments, the respective second conductive patterns 272 may be correspondingly connected to the respective first upper connection conductor 240P and the respective second upper connection conductor 250P.

As shown in FIG. 13G, the first upper semiconductor chip 240 may overlap with both of the conductive post 212 and the first lower semiconductor chip 220 in the vertical direction, and the second upper semiconductor chip 250 may overlap with both of the first lower semiconductor chip 220 and the second lower semiconductor chip 230 in the vertical direction. Further, the first upper connection conductor 240P of the first upper semiconductor chip 240 and the second upper connection conductor 250P of the second upper semiconductor chip 250 may overlap with the corresponding first lower connection conductor 220P of first lower semiconductor chip 220 and the second lower connection conductor 230P of the second lower semiconductor chip 230 in the vertical direction. Therefore, the first upper semiconductor chip 240 may transmit signals through the first lower semiconductor chip 220 and the second upper semiconductor chip 250.

The first upper semiconductor chip 240 and the second upper semiconductor chip 250 may be independently a semiconductor chip, such as a memory chip, a logic chip, a digital chip, an analog chip, a sensor chip, an AI chip, a wireless and radio frequency chip, a voltage regulator chip, etc., formed with a semiconductor integrated circuit. The sensor chip may be an image sensor chip, including at least a CCD or a CMOS image sensor. The first lower semiconductor chip 220, the second lower semiconductor chip 230, the first upper semiconductor chip 240, and the second upper semiconductor chip 250 may independently be semiconductor chips performing the same or different functions, and the disclosure is not particularly limited.

The materials of the first upper connection conductor 240P on the active surface of the first upper semiconductor chip 240 and the second upper connection conductor 250P on the active surface of the second upper semiconductor chip 250 may include conductive materials such as copper (Cu), silver (Ag), palladium (Pd), aluminum (Al), nickel (Ni), titanium (Ti), gold (Au), and platinum (Pt), Tungsten (W), an alloy thereof, etc.

Although not shown in the drawings, in some embodiments, the first upper semiconductor chip 240 and the second upper semiconductor chip 250 may have a conductive through-via structure such as a through silicon via (TSV), respectively, to form a vertical connection path in the first upper semiconductor chip 240 and a second upper semiconductor chip 250, respectively. The conductive through-via structure may extend from the active surface of the first upper semiconductor chip 240 to a back surface opposite to the active surface of the first upper semiconductor chip 240. The conductive through-via structure may be electrically and/or physically connected to the first upper connection conductor 240P on the active surface of the first upper semiconductor chip 240. The conductive through-via structure may be exposed from the back surface of the first upper semiconductor chip 240 to be electrically and/or physically connected to other components. For example, other electronic components such as semiconductor chips may be stacked on the first upper semiconductor chip 240 and electrically and/or physically connected to the conductive through-via structure exposed from the back surface of the first upper semiconductor chip 240, and the electronic components may be electrically connected to the interposer connection structure 270 under the first upper semiconductor chip 240 through the conductive through-via structure. Similarly, the conductive through-via structure may extend from the active surface of the second upper semiconductor chip 250 to a back surface opposite to the active surface of the second upper semiconductor chip 250. The conductive through-via structure may be electrically and/or physically connected to the second upper connection conductor 250P on the active surface of the second upper semiconductor chip 250. The conductive through-via structure may be exposed from the back surface of the second upper semiconductor chip 250 to be electrically and/or physically connected to other components. For example, other electronic components such as semiconductor chips may be stacked on the second upper semiconductor chip 250 and electrically and/or physically connected to the conductive through-via structure exposed from the back surface of the second upper semiconductor chip 250, and the electronic components may be electrically connected to the interposer connection structure 270 under the second upper semiconductor chip 250 through the conductive through-via structure.

In some embodiments, before mounting the first upper semiconductor chip 240 and the second upper semiconductor chip 250, a bonding structure 280 such as a bump may be formed on the second conductive pattern 272. Therefore, the first upper semiconductor chip 240 and the second upper semiconductor chip 250 may be electrically connected to the second conductive pattern 272 of the interposer connection structure 270 via the bonding structure 280, and to the conductive post, the first lower semiconductor chip 220 and the second lower semiconductor chip 230 via the interposer connection structure 270.

The material of the bonding structure 280 may include bonding metals such as a solder alloy, copper, gold, silver, indium, palladium, titanium, manganese, cobalt, an alloy thereof, etc. In some embodiments, the material of the bonding structure 280 may be a low-temperature bonding metal with a melting point of less than 200° C. For example, the low-temperature bonding metal may include twin crystal copper, twin crystal silver, or other nano-twin materials, an indium tin alloy, a tin bismuth alloy, porous gold, or a combination thereof. Compared to traditional solder balls or solders, which usually require a reflow temperature of higher than or equal to 250° C., the use of the low-temperature bonding metal enables the connection structure to achieve stable bonding at a relatively lower heating temperature (for example, at a temperature below 200° C. or below 150° C.) and meets the reliability requirement of electrical connection requirement.

Figure 13H:
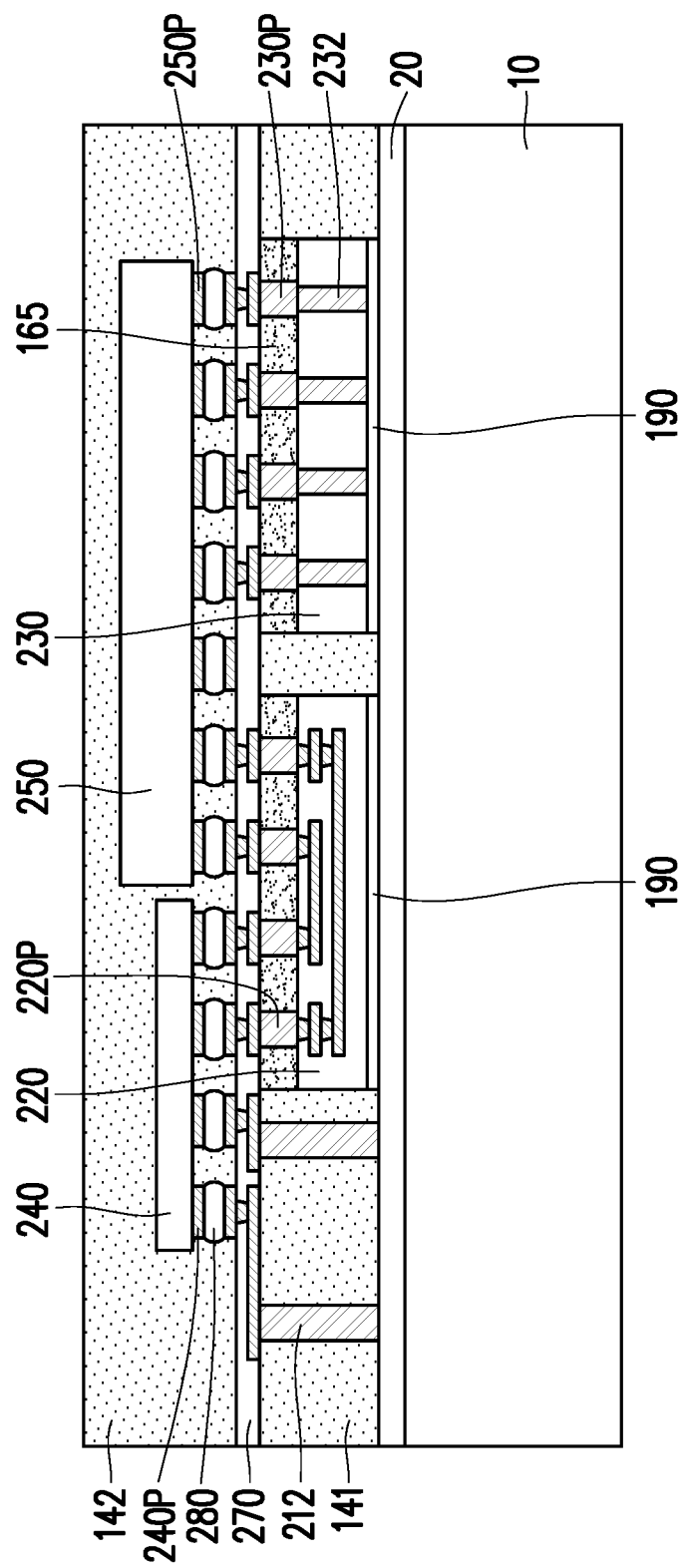

Referring to FIG. 13H, a second encapsulant 142 covering the interposer connection structure 270, the first upper semiconductor chip 240 and the second upper semiconductor chip 250 is formed on the carrier 10 by a suitable process such as a molding process or a deposition process. The material of the second encapsulant 142 may include a molding compound, a molding underfill, a resin, an EMC, etc. The second encapsulant 142 may be doped with an inorganic filler as required. The material of the first encapsulant 141 and the material of the second encapsulant 142 may be the same as each other. Alternatively, the material of the first encapsulant 141 and the material of the second encapsulant 142 may be different from each other.

Figure 13I:
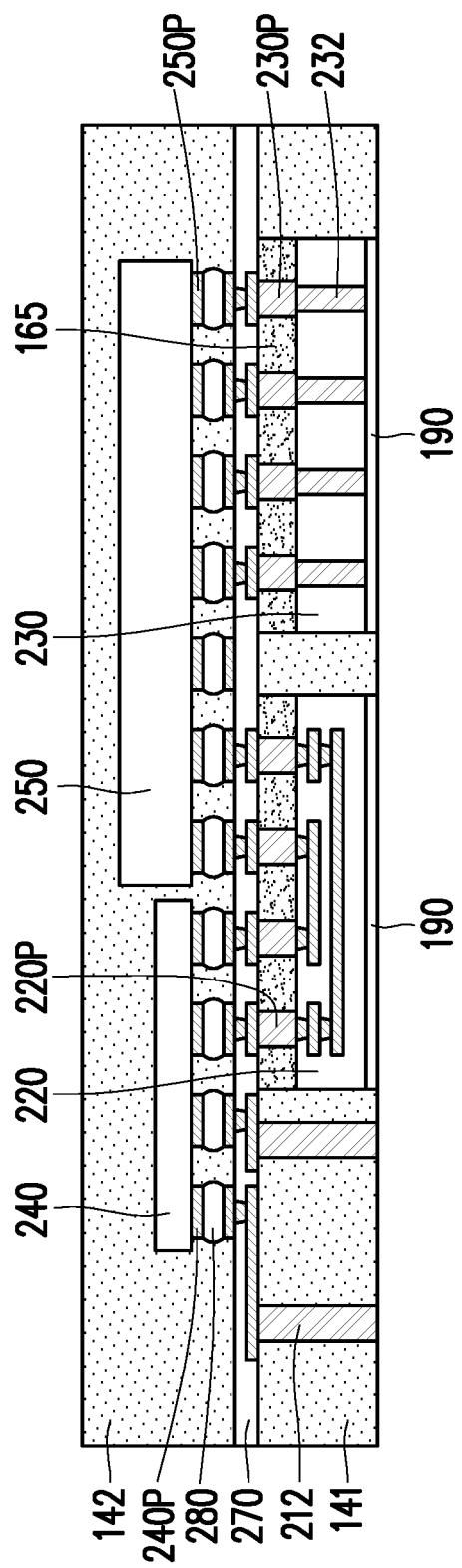

Referring to FIG. 13H and FIG. 13I, a release process is performed, so that the structure shown in FIG. 13I is separated from the carrier 10 and the release film 20. Taking the release film 20 formed from the UV glue as an example, an UV light may be irradiated on the release film 20, so that viscosity of the release film 20 is lost or reduced, thereby enabling the carrier 10 and the release film 20 to be separated from a structure shown in FIG. 13H. Taking the release film 20 formed from the UV glue as an example, an UV light may be irradiated on the release film 20, so that viscosity of the release film 20 is lost or reduced, thereby enabling the carrier 10 and the release film 20 to be separated from a structure shown in FIG. 13H.

Figure 13J:
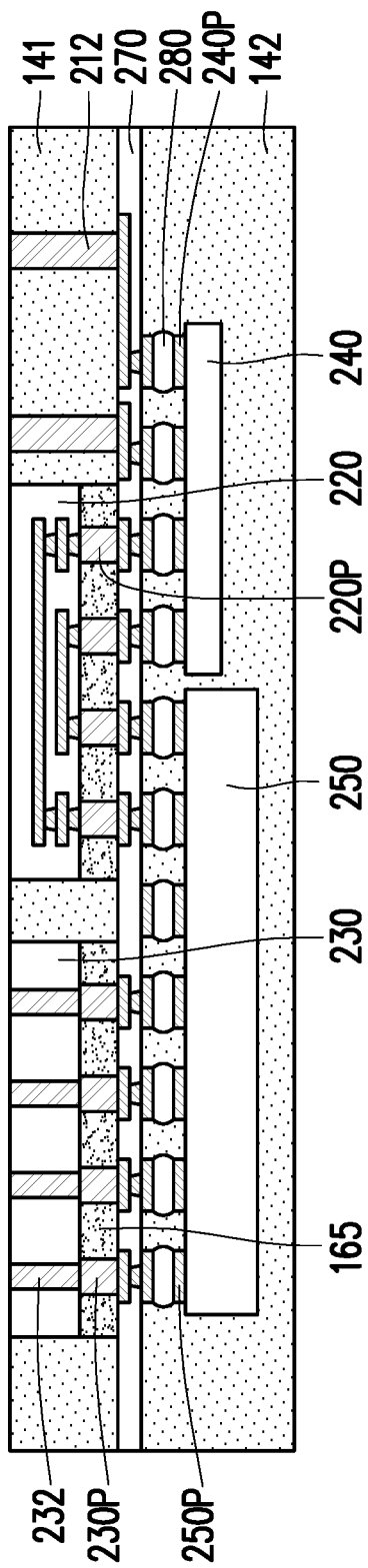

Referring to FIG. 13I and FIG. 13J, a wafer grinding process or a surface planarization process is executed on a surface from which the release film 20 is removed such that a surface of the conductive through-via structure 232 of the second lower semiconductor chip 230 and a surface of the conductive post 212 are exposed.

Figure 13K:
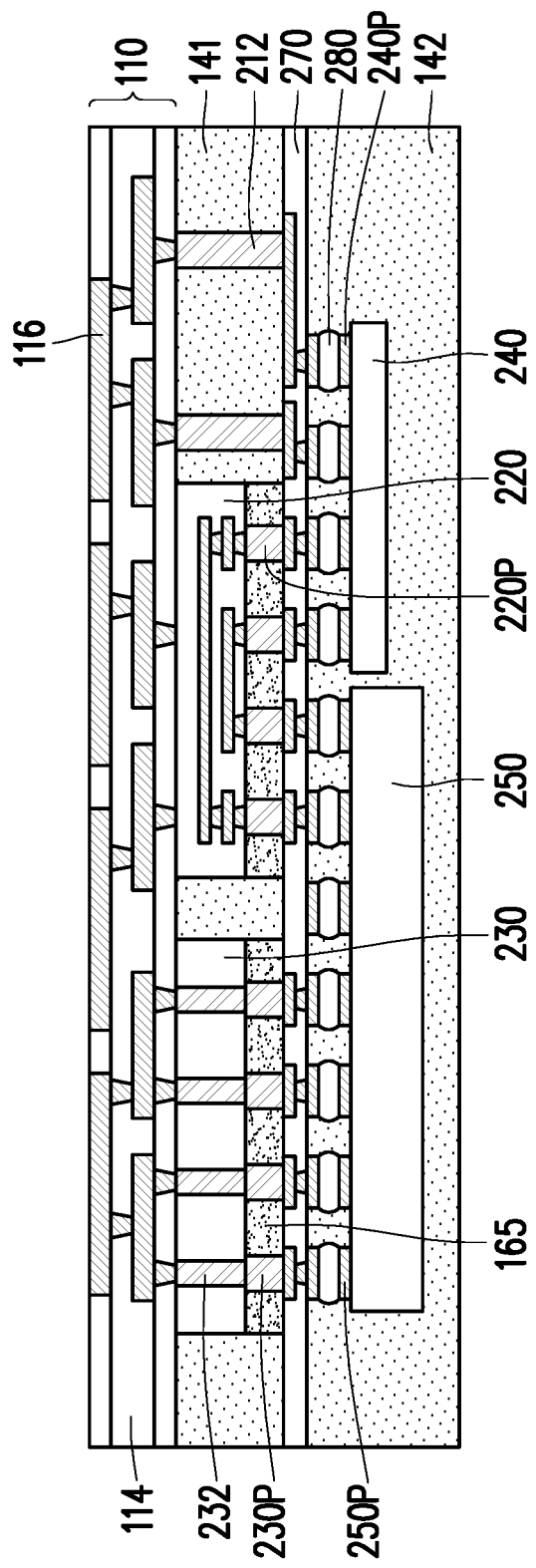

Referring to FIG. 13K, a redistribution circuit structure 110 including a redistribution circuit layer 116 and a dielectric layer 114 is formed on a structure shown in FIG. 13J by thin film processes.

Specifically, the dielectric layer 114 may be formed on a structure shown in FIG. 13J by a method such as spin coating, chemical vapor deposition (CVD), plasma-enhanced chemical vapor deposition (PECVD), etc. The material of the dielectric layer 114 may include polyimide, epoxy resin, acrylic resin, phenolic resin, bismaleimide-trizine (BT) resin, or any other suitable polymer dielectric material and a silicon oxide layer, a silicon nitride layer, a silicon oxynitride layer, or other suitable silicon dielectric materials. The dielectric layer 114 may be a photosensitive insulating layer including a photosensitive insulating resin.

Next, an opening is formed in the dielectric layer 114 to expose the conductive through-via structure 232 and the conductive post 212 thereunder. The method for forming the opening in the dielectric layer 114 may be different depending on the material of the dielectric layer 114. When the dielectric layer 114 is a photosensitive insulating layer including a photosensitive insulating resin, the dielectric layer 114 may be patterned by a lithography process to form the opening. When the dielectric layer 114 is a non-photosensitive insulating layer, the dielectric layer 114 may be patterned by a lithography/etching process, a laser drilling process, or a mechanical drilling process to form the opening. The width of the opening of the dielectric layer 114 in the cross-sectional view may vary. For example, the upper width of the opening may be greater than the lower width. Therefore, the upper width of a portion of the redistribution circuit layer 116 filling in the opening may also be larger than the lower width.

Then, a seed layer may be sputtered or deposited on a surface of the dielectric layer 114 and a surface of the opening of the dielectric layer 114, wherein the material of the seed layer may be, for example, a conductive material such as titanium, copper, etc. Next, a patterned photoresist layer is formed on the seed layer to expose the seed layer. A conductive material is formed on the seed layer exposed by the patterned photoresist layer by an electroplating process. The conductive material may include copper (Cu), silver (Ag), palladium (Pd), aluminum (Al), nickel (Ni), titanium (Ti), gold (Au), platinum (Pt), tungsten (W), or an alloy thereof. Next, the photoresist layer and the portion of the seed layer not covered by the conductive material are removed to form the redistribution circuit layer 116.

Figure 13L:
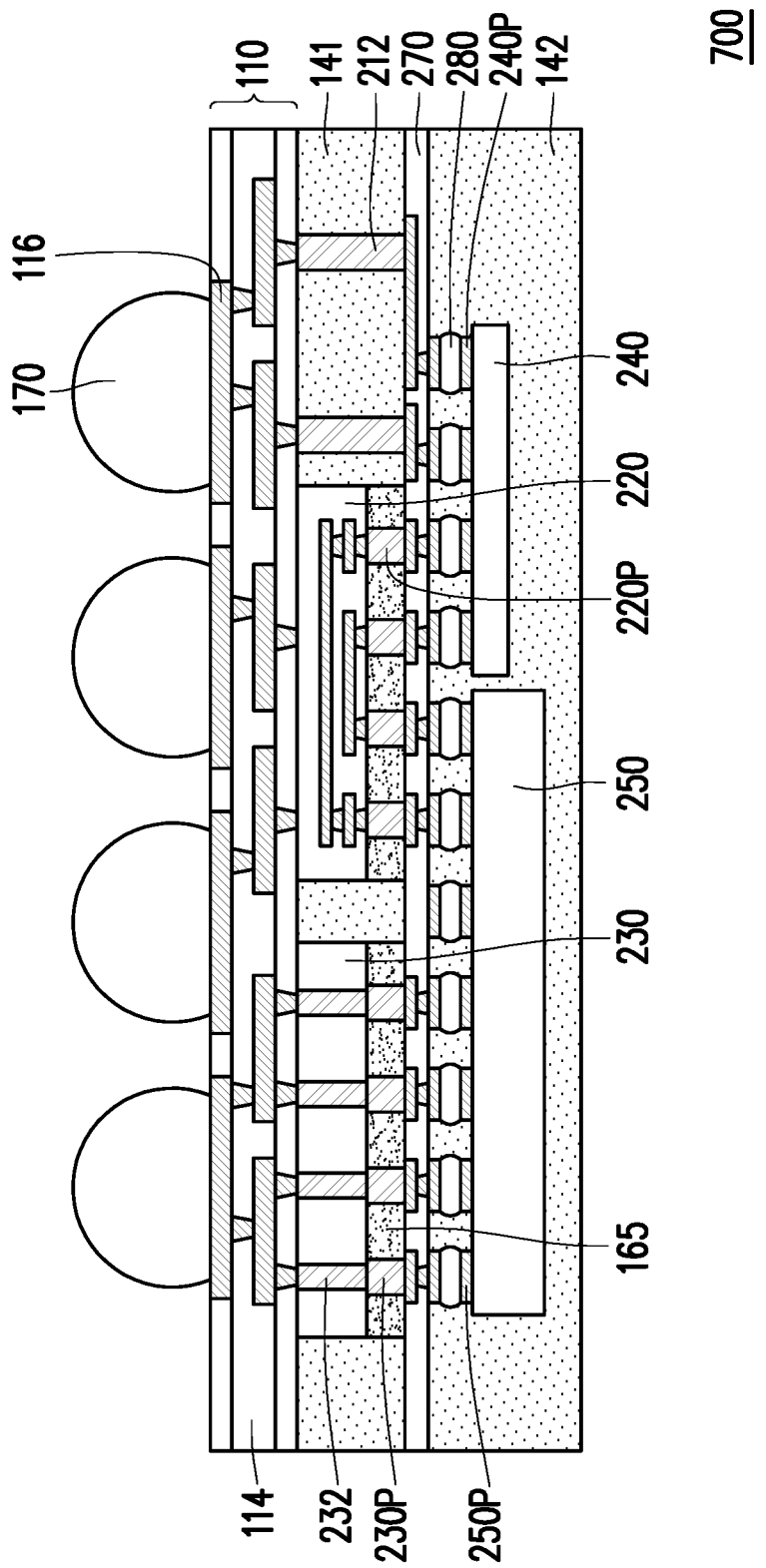

Referring to FIG. 13L, a plurality of conductive terminals 170 may be formed on the outermost redistribution circuit layer 116 of the redistribution circuit structure 110 to complete a multi-chip package 700 of the disclosure. The conductive terminal 170 is, for example, a solder ball, but the disclosure is not limited thereto.

Multiple multi-chip packages 700 of the disclosure may be formed on a large-size wafer at the same time. Next, respective multi-chip package 700 is separated by a process such as cutting, etc. Therefore, a sidewall of the first encapsulant 141 and a sidewall of the second encapsulant 142 in the multi-chip package 700 of the disclosure may be aligned with a sidewall of the redistribution circuit structure 110.

In the multi-chip package 700 of the disclosure, the first and second upper semiconductor chips 240 and 250 and the first and second lower semiconductor chips 220 and 230 are connected with each other through the interposer connection structure 270 without a redistribution circuit structure provided therebetween. Compared with the redistribution circuit structure, the interposer connection structure 270 of the disclosure may have a smaller line width, line spacing, and via width, so that the power and/or signal transmission path between the first and second upper semiconductor chips 240 and 250 and the first and second lower semiconductor chips 220 and 230 may be shortened. The transmission speed and quality of the power and/or signal may thus be improved.

Meanwhile, the multi-chip package 700 of the disclosure may realize both of high-speed signal transmission and large current signal transmission by including the conductive through-via structure 232 in the second lower semiconductor chip 230 which is capable of providing high-speed signal transmission and the conductive post 212 which is disposed side by side with the second lower semiconductor chip 230 and is capable of providing transmission for other signals or large current (e.g. grounding).

Alternatively, more layers of semiconductor chips may be stacked on the multi-chip package 700 shown in FIG. 13L by, for example, the same or similar manufacturing method as that described with reference to FIGS. 13A to 13L. For example, more layers of semiconductor chips may be stacked on the first upper semiconductor chip 240 and/or the second upper semiconductor chip 250. In detail, the first upper semiconductor chip 240 and/or the second upper semiconductor chip 250 may have conductive through-via structures such as TSV to be electrically and/or physically connected to the semiconductor chip stacked thereon.

FIG. 14A to FIG. 14I are cross-sectional views of steps of a manufacturing process for manufacturing a multi-chip package 800 according to an embodiment of the disclosure. In FIGS. 14A to 14I, the same reference numerals as those in FIGS. 13A to 13K are used to denote the same or similar elements as those in FIGS. 13A to 13K. Therefore, detail descriptions of the elements with the same reference numerals may be referred to the descriptions provided above with reference to FIGS. 13A to 13K, and will not be repeated. The following descriptions will be focused on the process and structural differences between the multi-chip package 800 shown in FIG. 14O and the multi-chip package 700 shown in FIG. 13K.

Figure 14A:
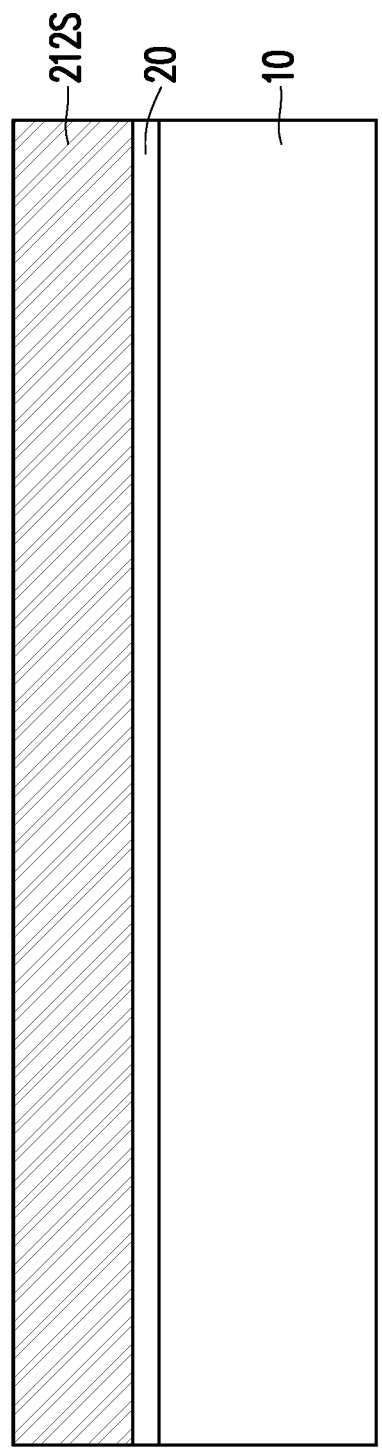
FIG. 14A to FIG. 14O are cross-sectional views of steps of a manufacturing process for manufacturing a multi-chip package 800 according to an embodiment of the disclosure.
Figure 14B:
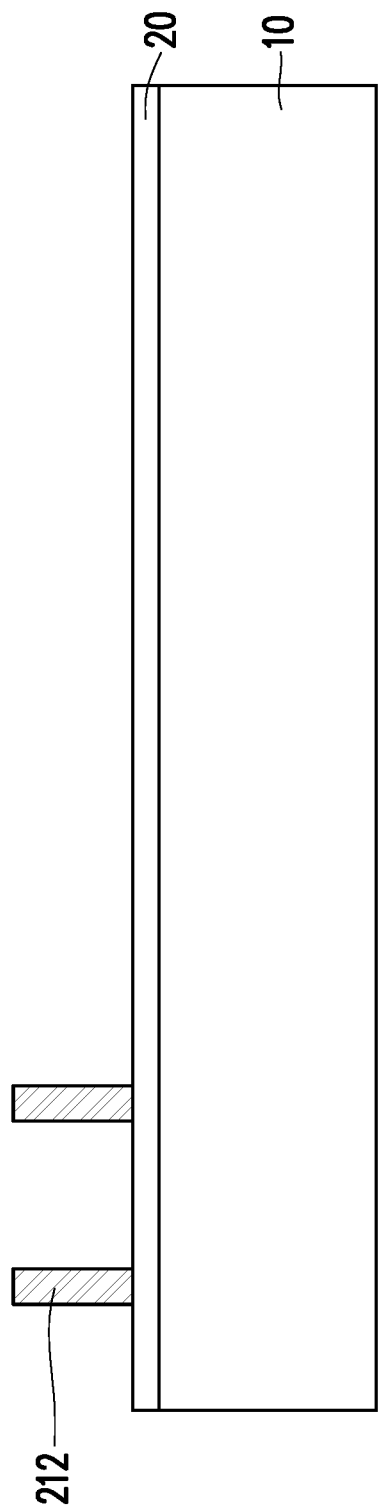

The manufacturing processes of FIGS. 14A and 14B are the same as or similar to the manufacturing processes described with reference to FIGS. 13A and 13B, and therefore will not be repeated.

Figure 14C:
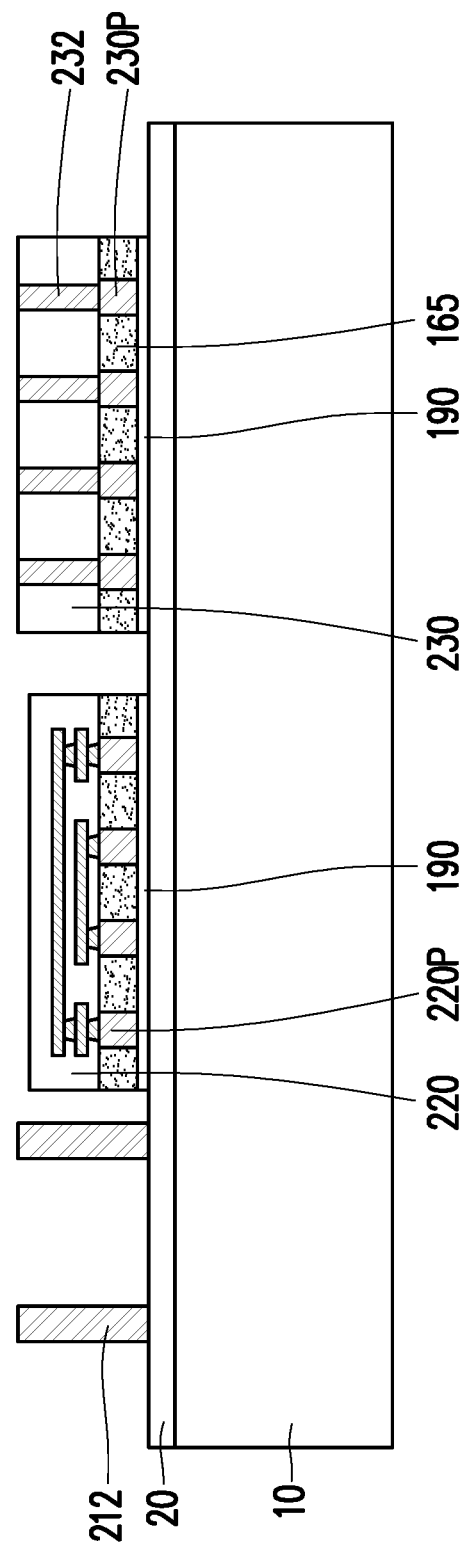

Referring to FIG. 14C, a first lower semiconductor chip 220 and the second lower semiconductor chip 230 may be attached onto a release film 20 by an adhesive layer 190 in a flip chip manner.

Figure 14D:
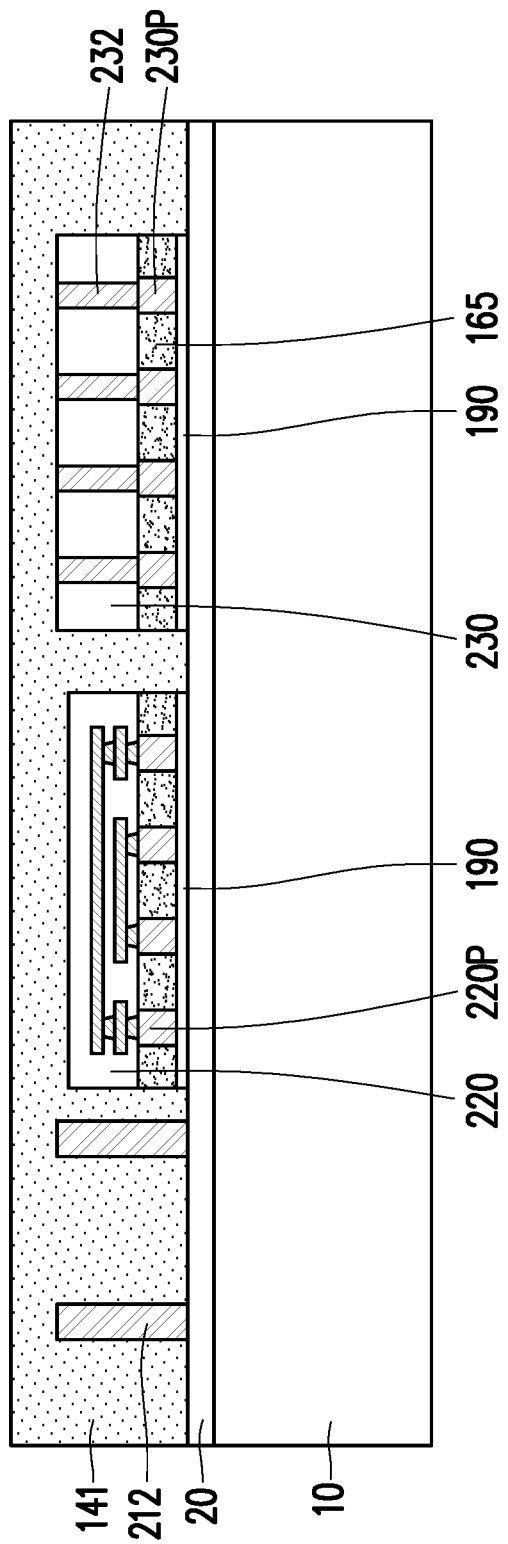
Figure 14E:
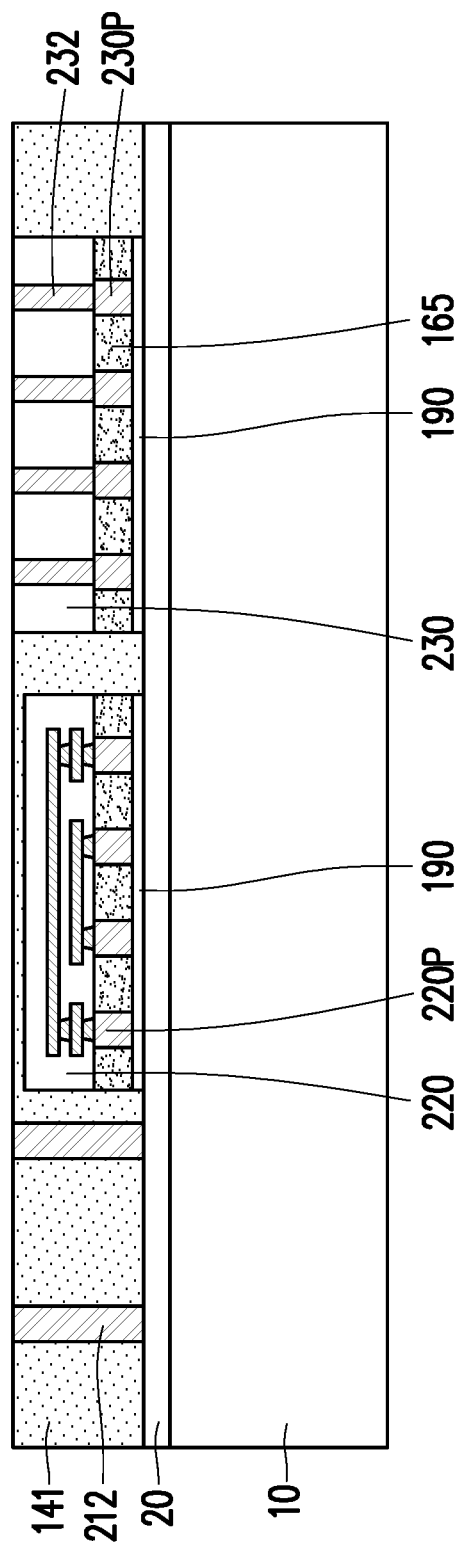

Referring to FIGS. 14D and 14E, an encapsulant material layer covering the first lower semiconductor chip 220, the second lower semiconductor chip 230, and the conductive post 212 is formed on the carrier 10 by a suitable process (such as a molding process or a deposition process). Then, a wafer grinding process or a surface planarization process is executed, so that a surface of the conductive post 212 and a surface of the conductive through-via structure 232 of the second lower semiconductor chip 230 are exposed. That is, the surface of the conductive post 212 and the back surface of the second lower connection conductor 230 are located at the same level. In other words, the upper surface of the first conductive post 212, the back surface of the second conductive post 230, and the first encapsulant 141 are coplanar. Meanwhile, the back surface of the first lower semiconductor chip 220 is completely covered by the first encapsulant 141, but the disclosure is not limited thereto. For example, the back surface of the first lower semiconductor chip 220 may also be exposed from the first encapsulant 141.

Figure 14F:
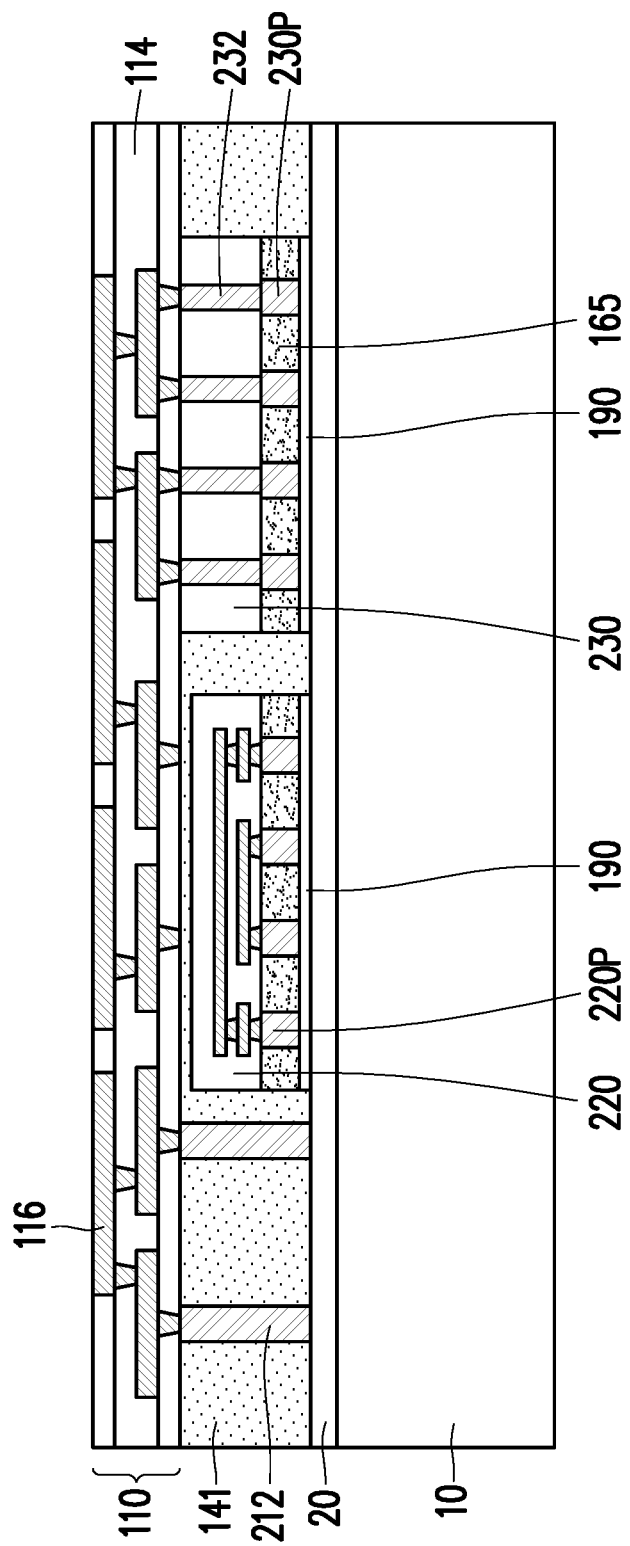
Figure 14G:
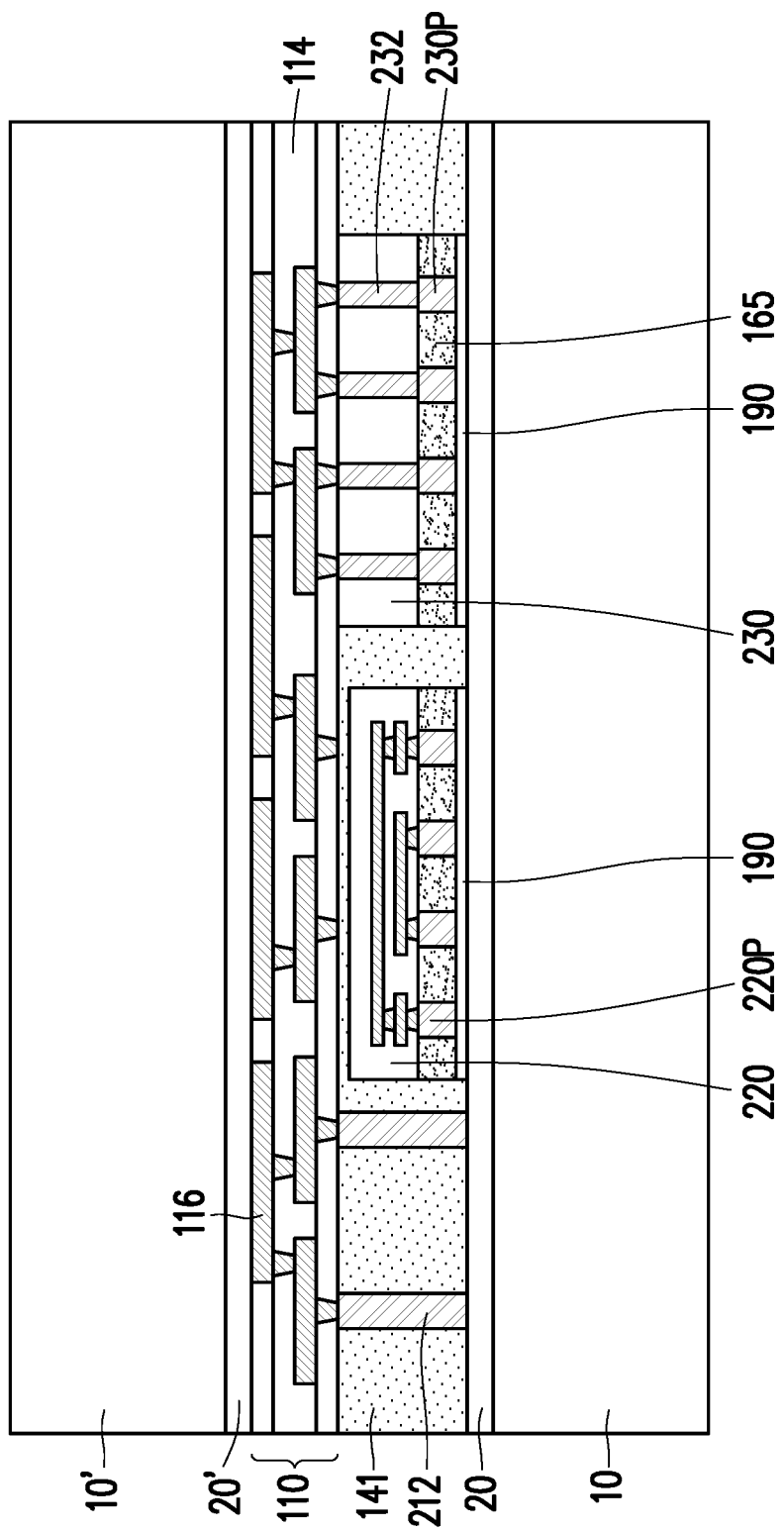
Figure 14H:
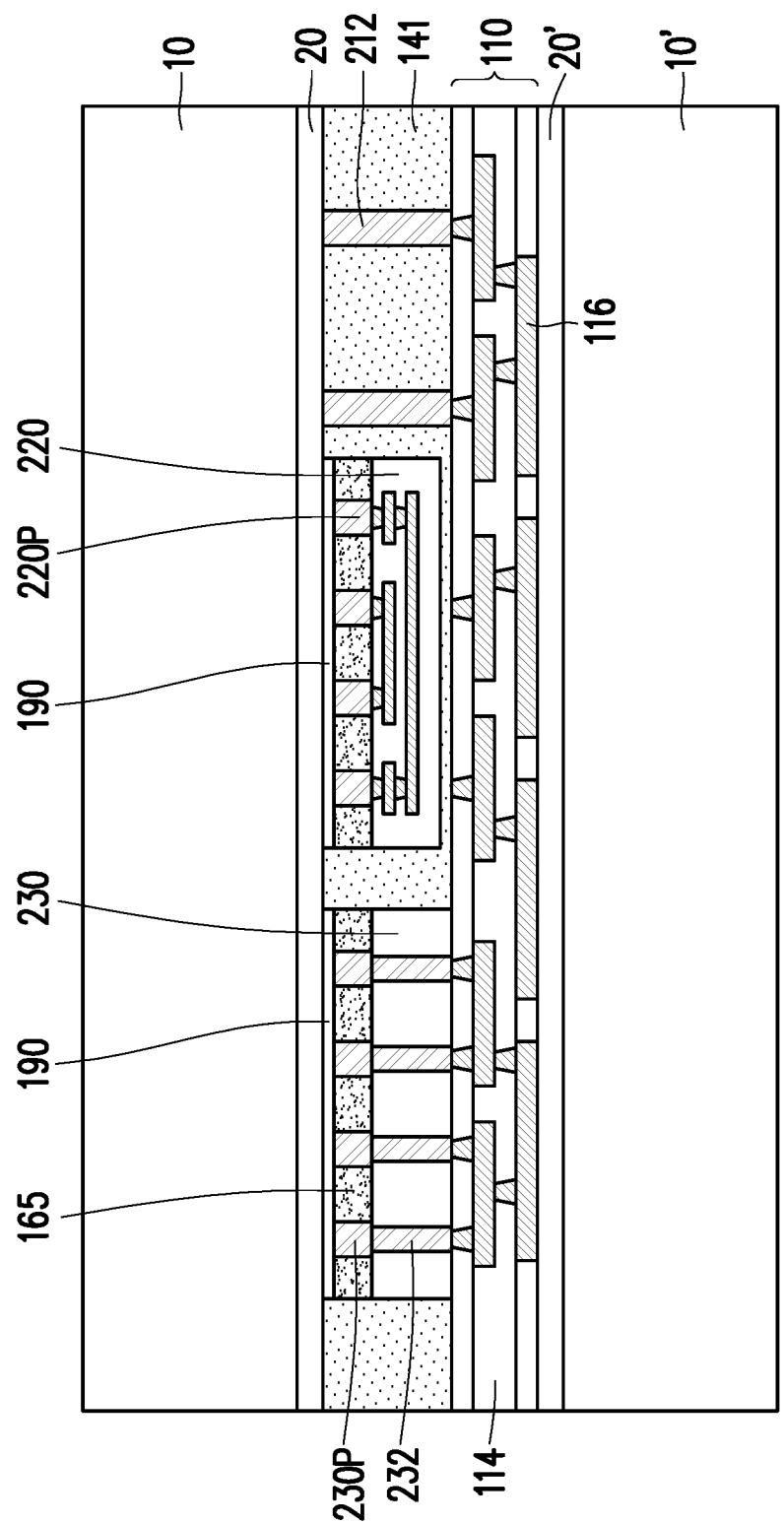

Referring to FIG. 14E and FIG. 14F, a redistribution circuit structure 110 including a redistribution circuit layer 116 and a dielectric layer 114 is formed on a structure shown in FIG. 14E by thin film processes.

Specifically, the dielectric layer 114 may be formed on a structure shown in FIG. 14E by a method such as spin coating, chemical vapor deposition (CVD), plasma-enhanced chemical vapor deposition (PECVD), etc. Next, an opening is formed in the dielectric layer 114 to expose the conductive through-via structure 232 and the conductive post 212 thereunder. Then, the redistribution circuit layer 116 is formed on a surface of the dielectric layer 114 and in the opening of the dielectric layer 114. The width of the opening of the dielectric layer 114 in the cross-sectional view may vary. For example, the upper width of the opening may be greater than the lower width. Therefore, the upper width of a portion of the redistribution circuit layer 116 filling in the opening may also be larger than the lower width.

Figure 14I:
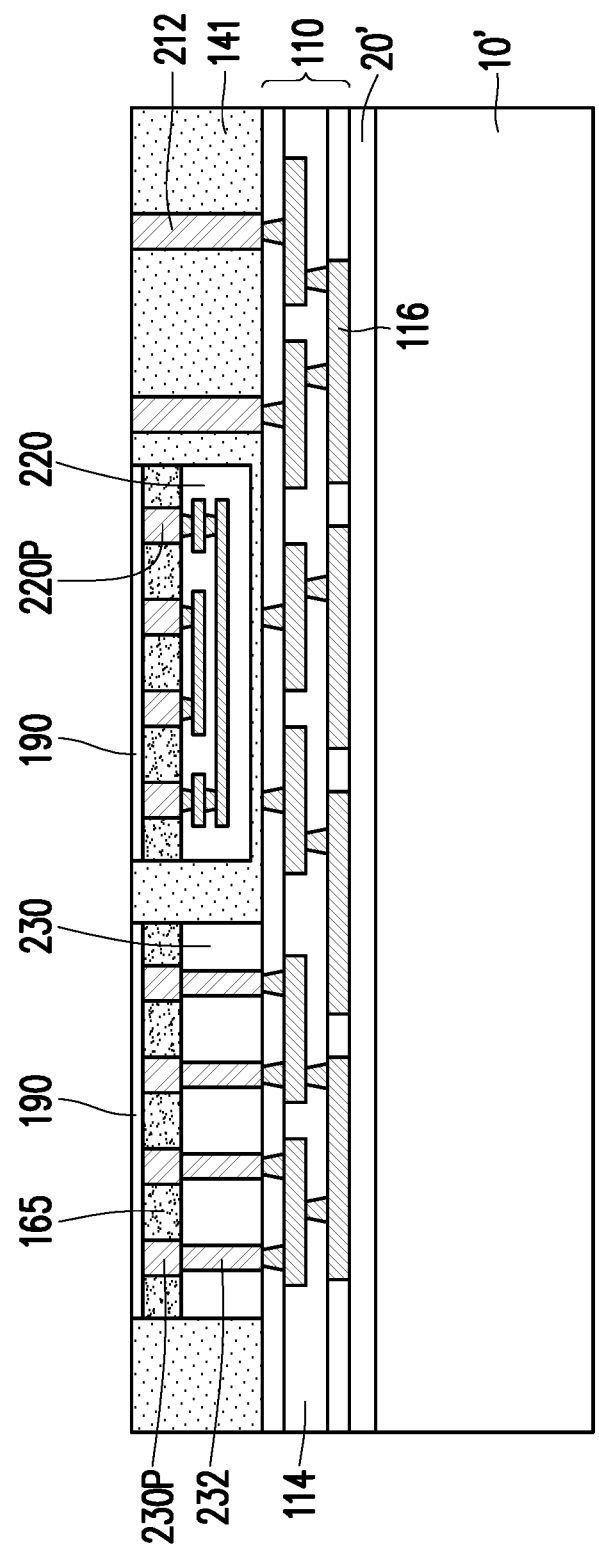

Referring to FIGS. 14F-14I, another release film 20' and another carrier 10' may be formed on a structure shown in FIG. 14F, and a structure shown in FIG. 14I is obtained by upside down the resultant structure and removed the release film 20 and the carrier 10 by a release process.

Figure 14J:
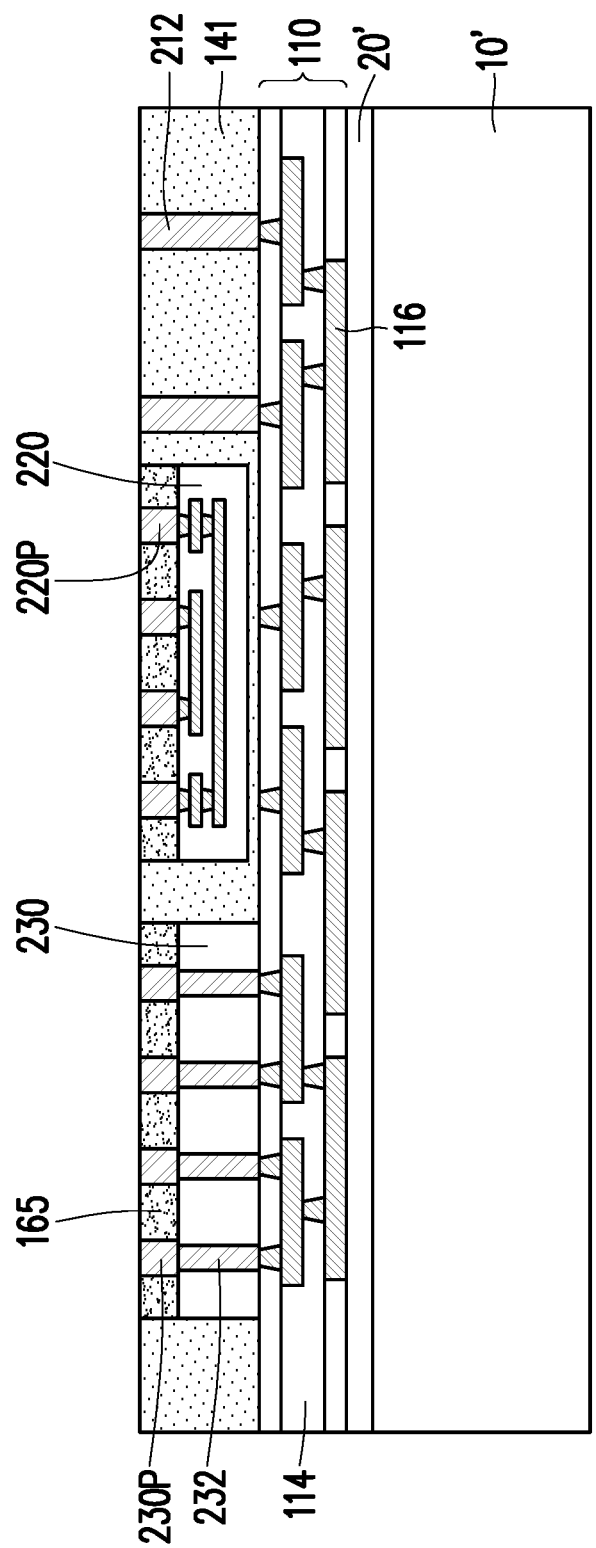

Referring to FIGS. 14I and 14J, a wafer grinding process or a surface planarization process is executed on a surface from which the release film 20 is removed such that a surface of a first lower connection conductor 220P of the first lower semiconductor chip 220, a surface of a second lower connection conductor 230P of the second lower semiconductor chip 230, and a surface of the conductive post 212 are exposed.

Figure 14K:
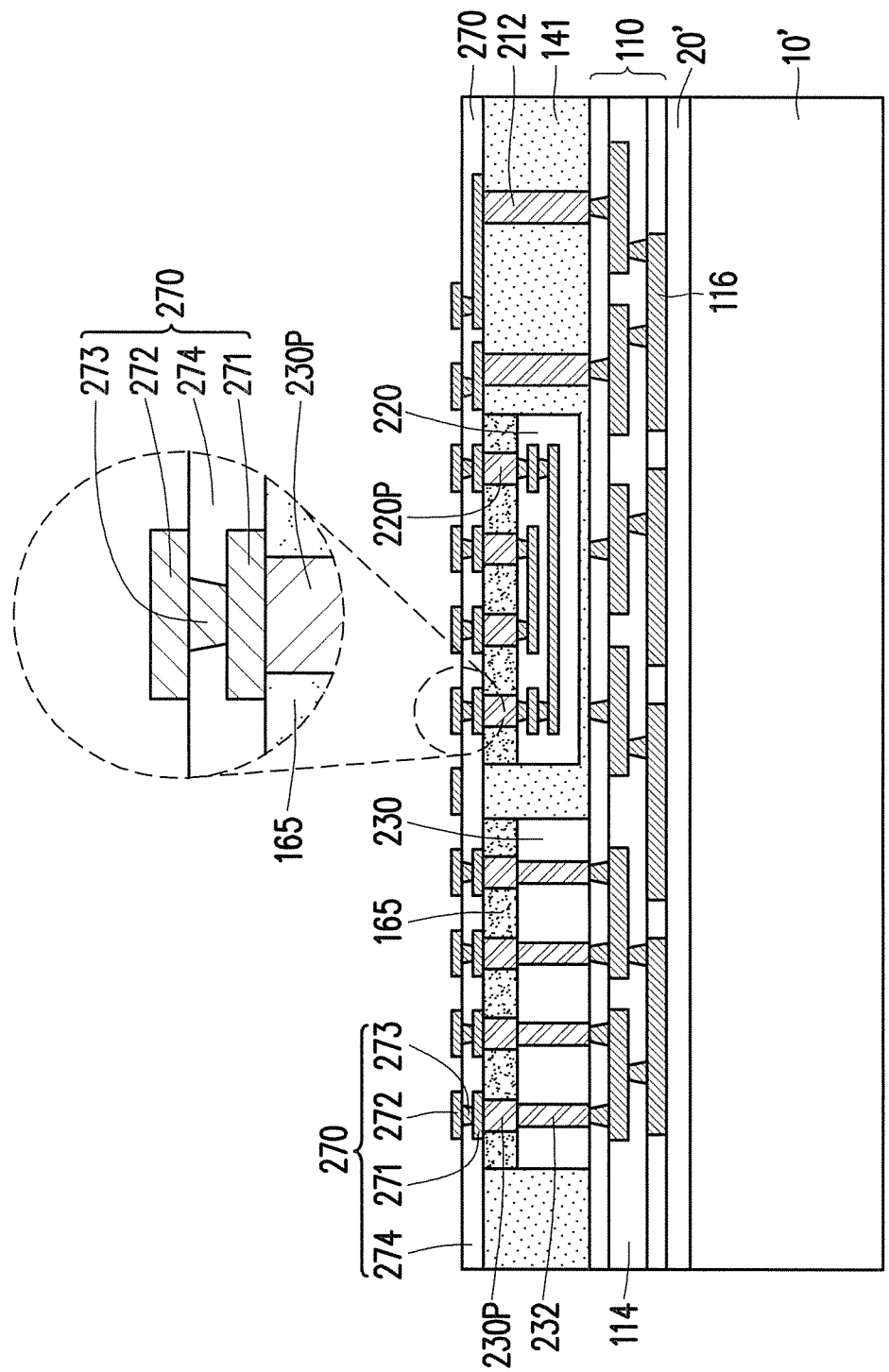

Referring to FIGS. 14J and 14K, an interposer connection structure 270 including a dielectric layer 274, a first conductive pattern 271, a second conductive pattern 272, and a conductive via pattern 273 penetrating the dielectric layer 274 to connect the first conductive pattern 271 and the second conductive pattern 272 may be formed on the structure shown in FIG. 14J. The width of the conductive via pattern 273 in the cross-sectional view may vary. For example, the width of the conductive via pattern 273 closer to the second conductive pattern 272 may be greater than the width of the conductive via pattern 273 closer to the first conductive pattern 271.

Figure 14L:
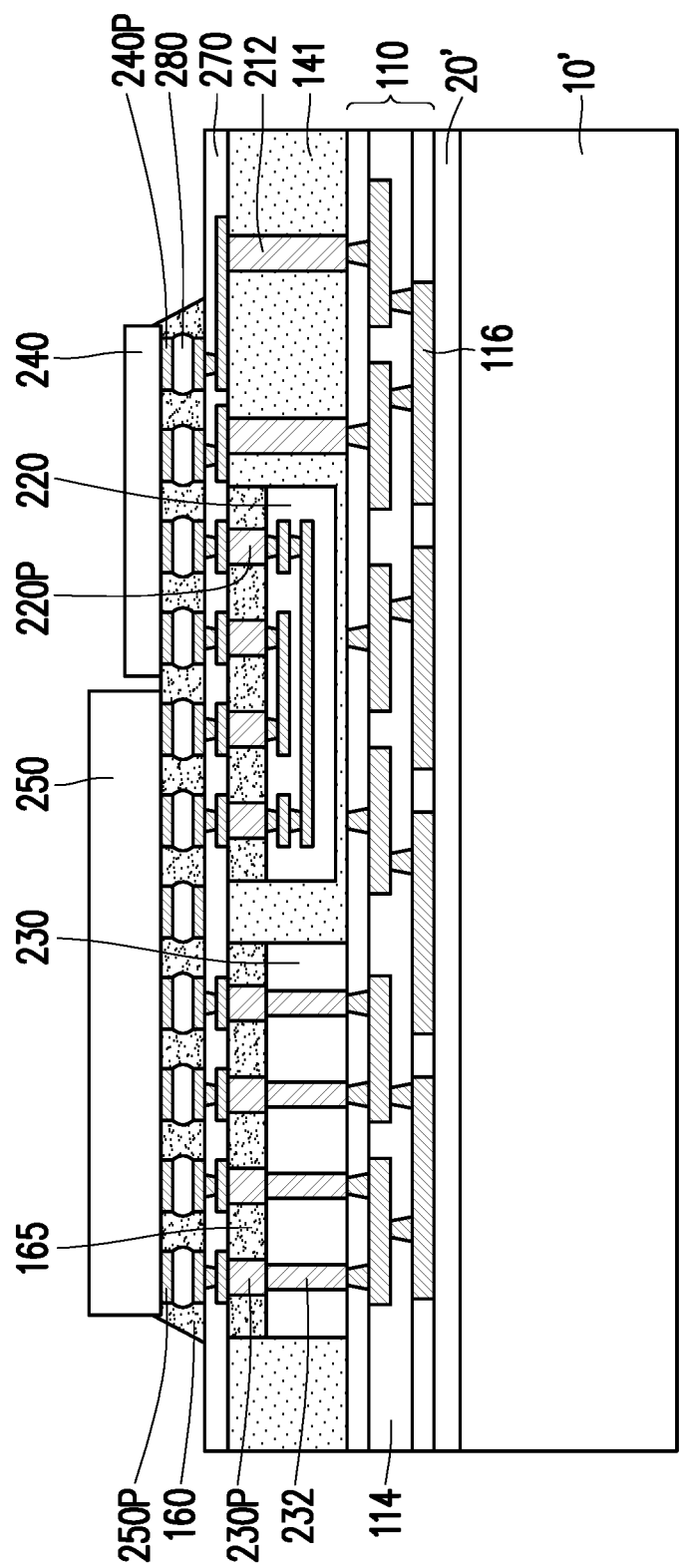

Referring to FIG. 14L, a first upper semiconductor chip 240 and a second upper semiconductor chip 250 are mounted side by side on the interposer connection structure 270 so that a first upper connection conductor 240P on the active surface of the first upper semiconductor chip 240 and the second conductive pattern 272 are electrically connected, and a second upper connection conductor 250P on the active surface of the second upper semiconductor chip 250 and the second conductive pattern 272 are electrically connected.

As shown in FIG. 14L, the first upper semiconductor chip 240 may overlap with both of the conductive post 212 and the first lower semiconductor chip 220 in the vertical direction, and the second upper semiconductor chip 250 may overlap with both of the first lower semiconductor chip 220 and the second lower semiconductor chip 230 in the vertical direction. Further, the respective first upper connection conductor 240P of the first upper semiconductor chip 240 and the respective second upper connection conductor 250P of the second upper semiconductor chip 250 may overlap with the corresponding first lower connection conductor 220P of first lower semiconductor chip 220 and the corresponding second lower connection conductor 230P of the second lower semiconductor chip 230 in the vertical direction.

In some embodiments, before mounting the first upper semiconductor chip 240 and the second upper semiconductor chip 250, a bonding structure 280 such as a bump may be formed on the second conductive pattern 272. Therefore, the first upper semiconductor chip 240 and the second upper semiconductor chip 250 may be electrically connected to the second conductive pattern 272 of the interposer connection structure 270 via the bonding structure 280, and to the conductive post, the first lower semiconductor chip 220 and the second lower semiconductor chip 230 via the interposer connection structure 270.

Referring to FIG. 14L again, an underfill 160 may be applied onto the dielectric layer 274 of the interposer connection structure 270 to fill a space between the first upper semiconductor chip 240, the second upper semiconductor chip 250, and the dielectric layer 274 of the interposer connection structure 270 and encapsulating the first upper connection conductor 240P, the second upper connection conductor 250P, the bonding structure 280, and the second conductive pattern 272. As shown in FIG. 14L, the underfill 160 has tapered sidewalls. The upper width of the underfill 160 is, for example, smaller than the lower width of the underfill 160. In some embodiments, the width of the underfill 160 gradually changes, and the width of the underfill 160 gradually decreases from one end closer to the dielectric layer 274 of the interposer connection structure 270 toward the other end closer to the first upper semiconductor chip 240 and the second upper semiconductor chip 250.

Figure 14M:
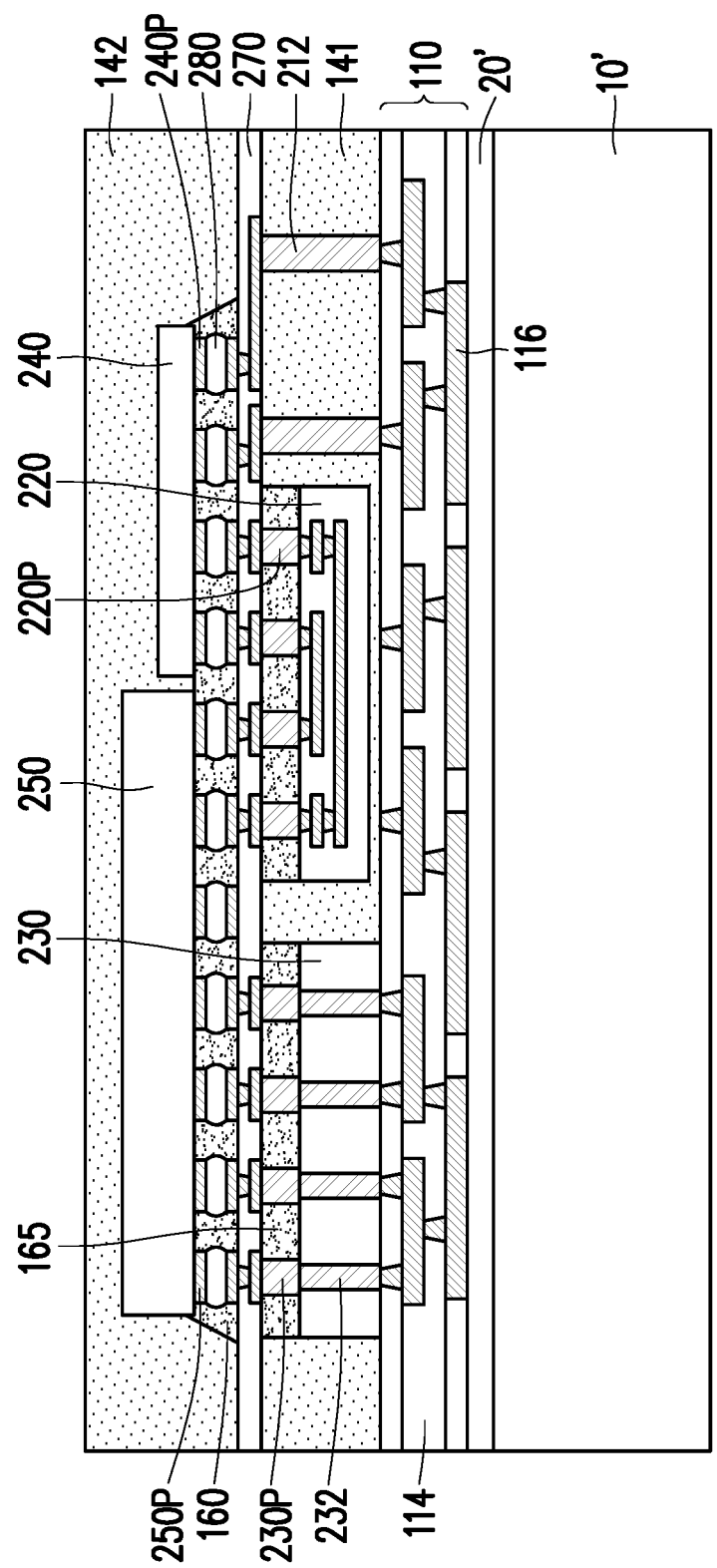

Referring to FIG. 14M, a second encapsulant 142 covering the interposer connection structure 270, the first upper semiconductor chip 240 and the second upper semiconductor chip 250 is formed on the carrier 10 by a suitable process such as a molding process or a deposition process.

Figure 14N:
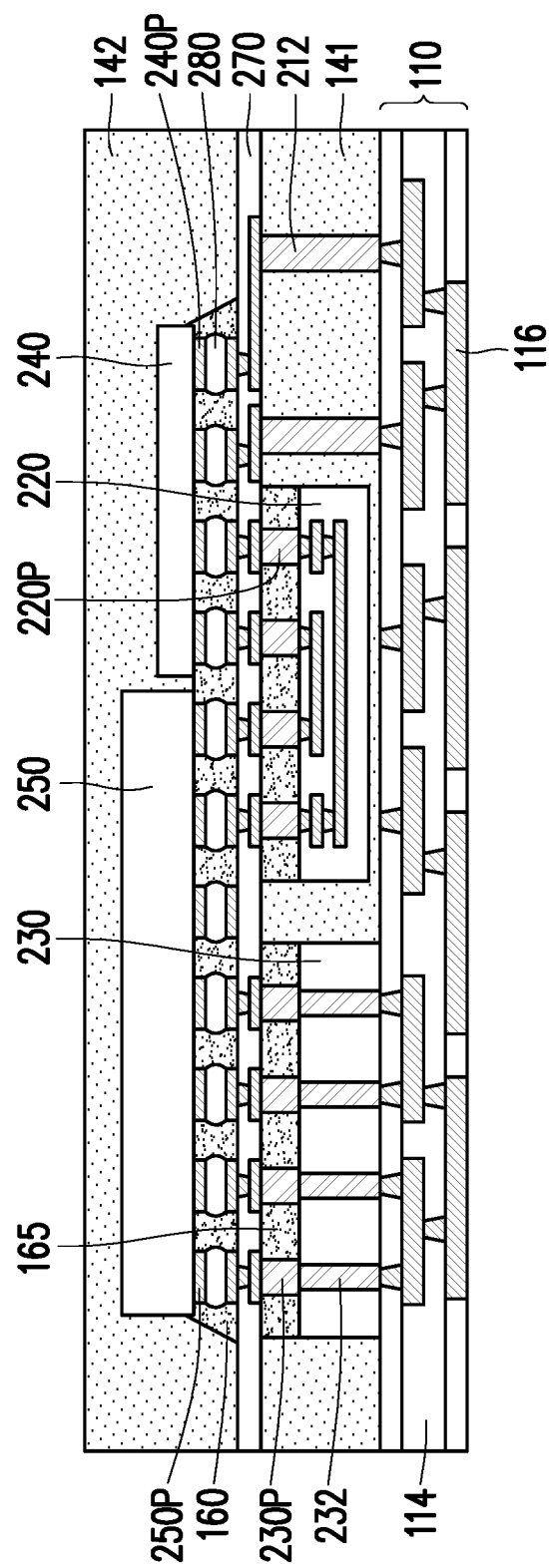
Figure 140:
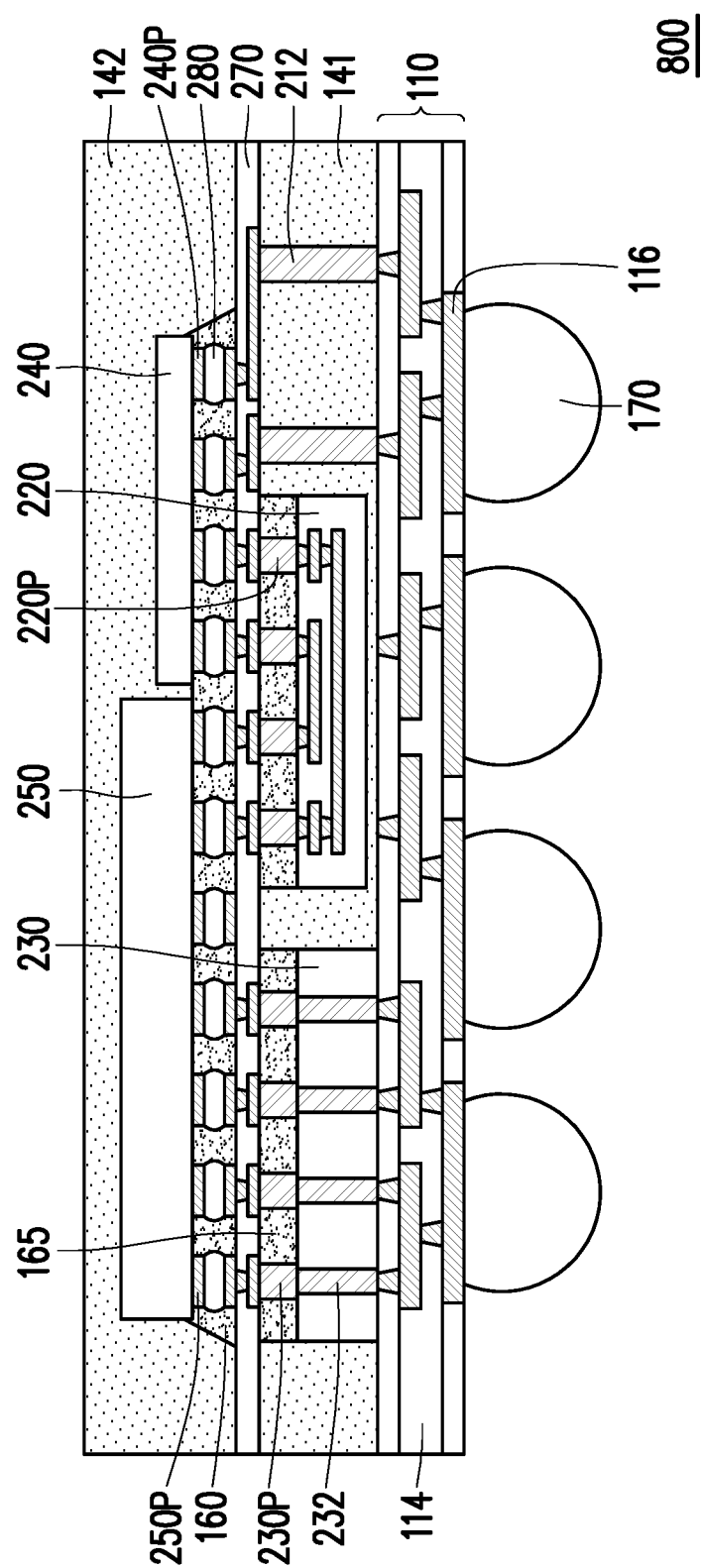

Referring to FIG. 14M and FIG. 14N, a release process is performed, so that the structure shown in FIG. 14M is separated from the carrier 10' and the release film 20' such that the outermost redistribution circuit layer 116 of the redistribution circuit structure 110 is exposed.

Referring to FIG. 14O, a plurality of conductive terminals 170 may be formed on the outermost redistribution circuit layer 116 of the redistribution circuit structure 110 to complete a multi-chip package 800 of the disclosure. Multiple multi-chip packages 800 of the disclosure may be formed on a large-size wafer at the same time. Next, respective multi-chip package 800 is separated by a process such as cutting, etc. Therefore, a sidewall of the first encapsulant 141 and a sidewall of the second encapsulant 142 in the multi-chip package 800 of the disclosure may be aligned with a sidewall of the redistribution circuit structure 110.

Except for the underfill 160, the multi-chip package 800 shown in FIG. 14O and the multi-chip package 700 shown in FIG. 13L may have a similar structure, so the multi-chip package 800 shown in FIG. 14O may also have the advantages of the chip package 700 shown in FIG. 13L mentioned above. In addition, the multi-chip package 800 shown in FIG. 14O may further have improved reliability due to the underfill 160.

Figure 15A:
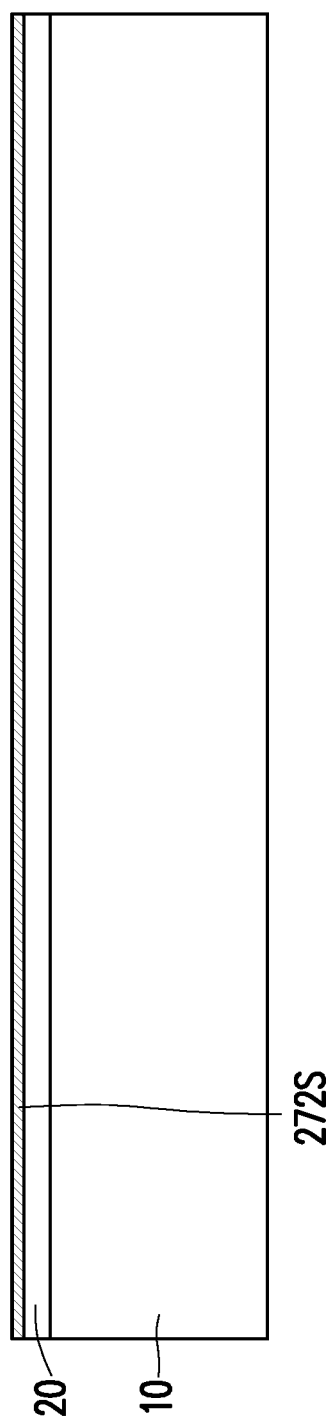
FIG. 15A to FIG. 15N are cross-sectional views of steps of a manufacturing process for manufacturing a multi-chip package 900 according to an embodiment of the disclosure.
Figure 15B:
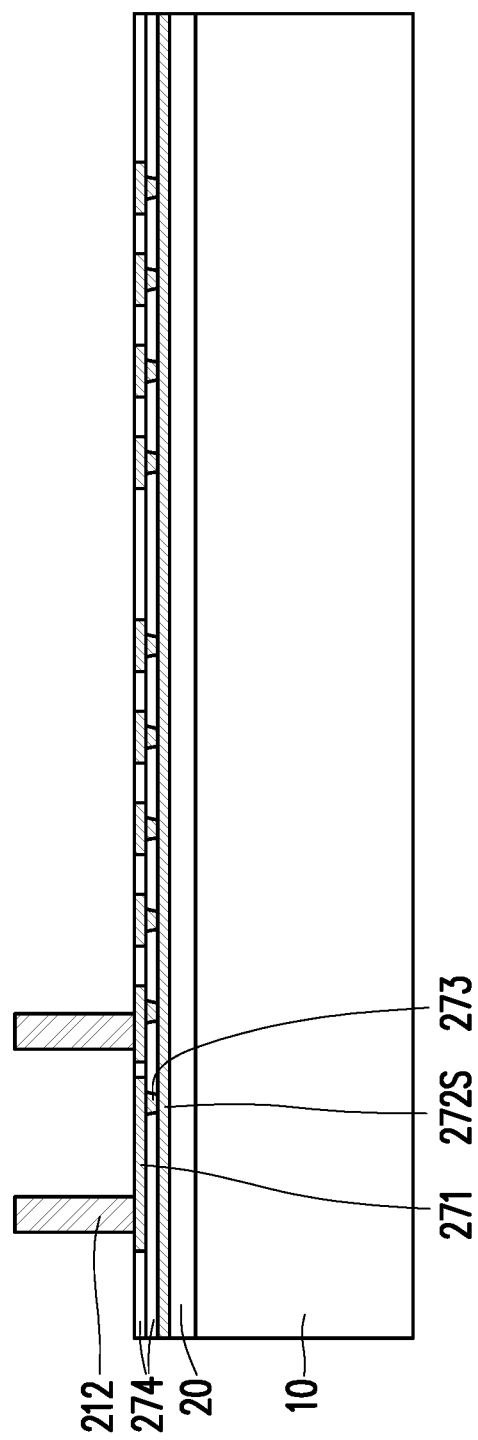
Figure 15C:
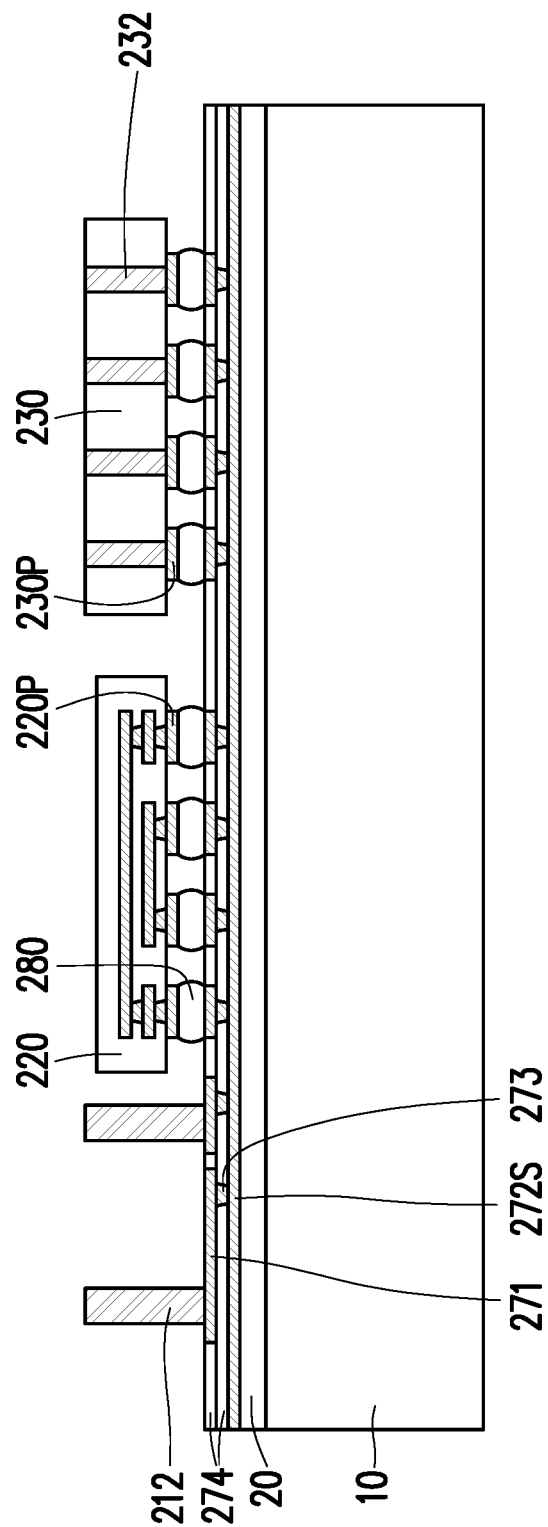
Figure 15D:
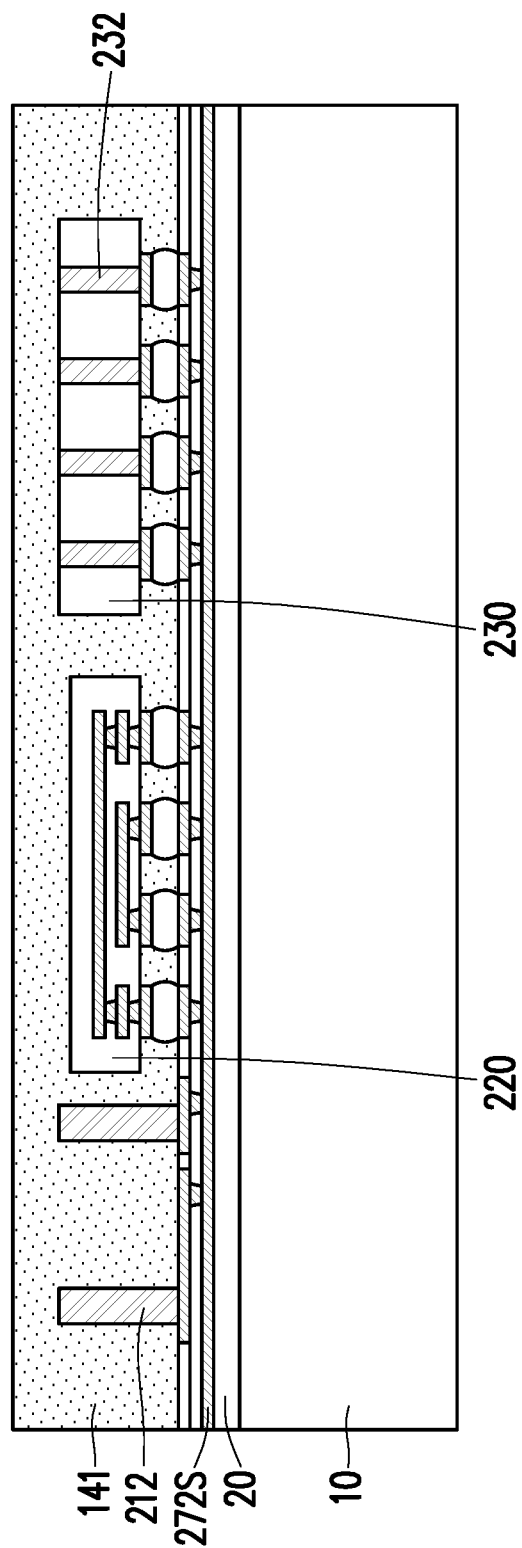
Figure 15E:
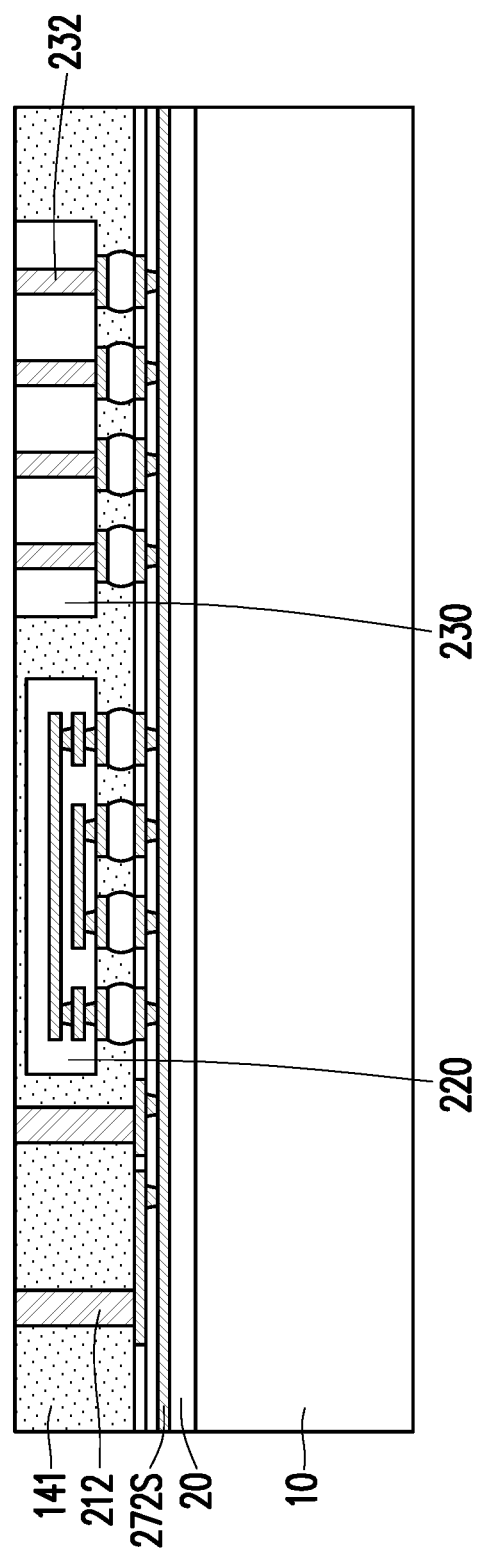
Figure 15F:
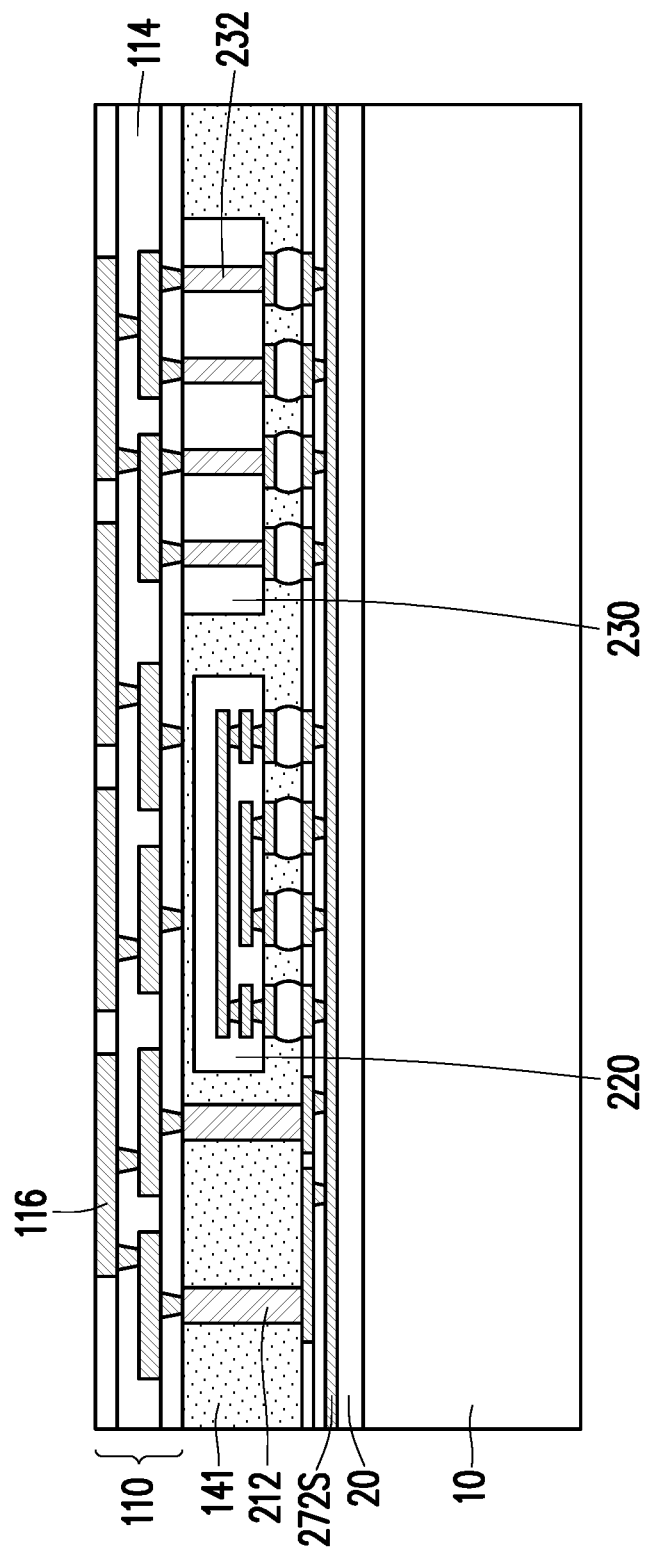
Figure 15H:
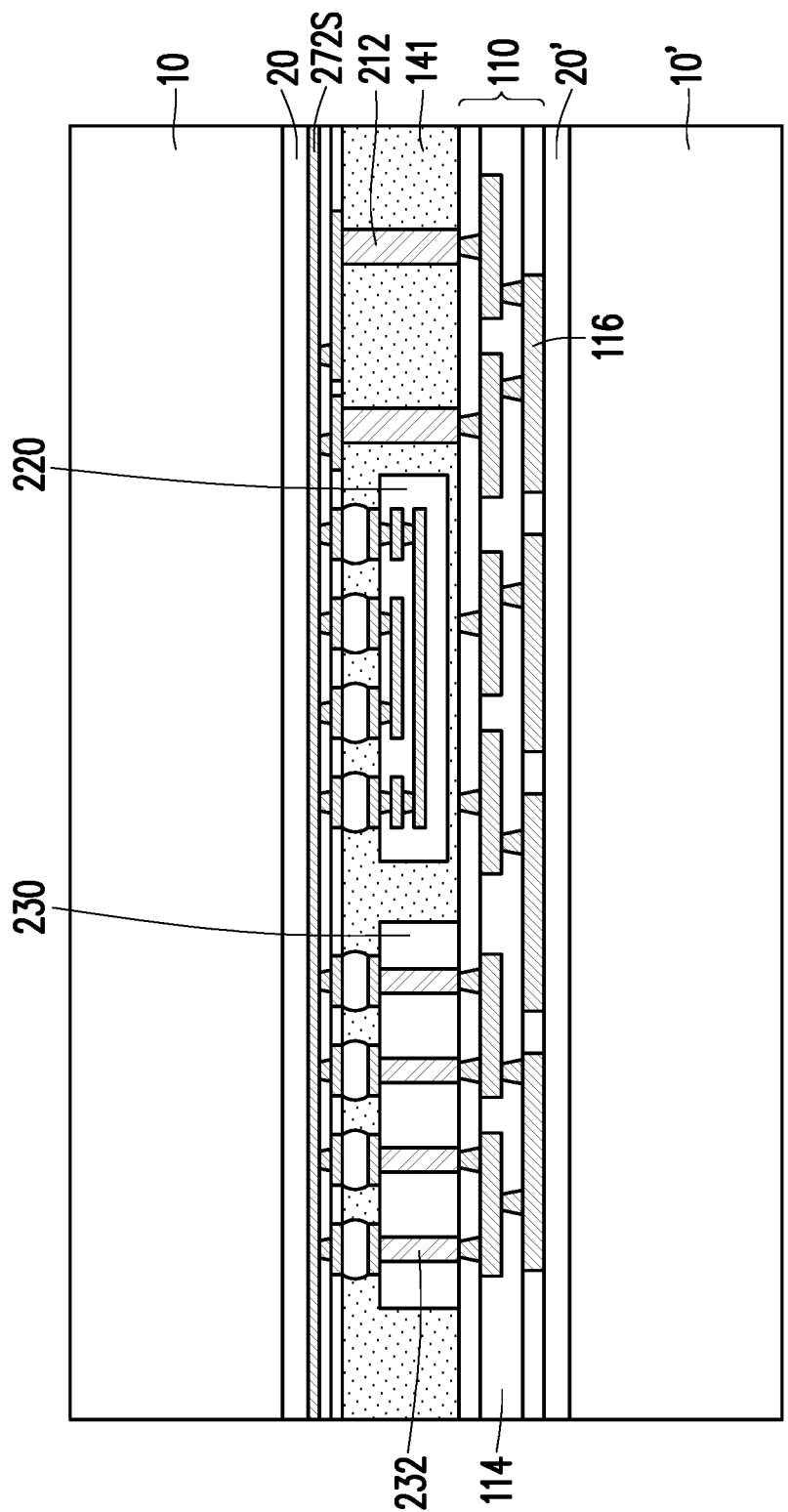
Figure 15I:
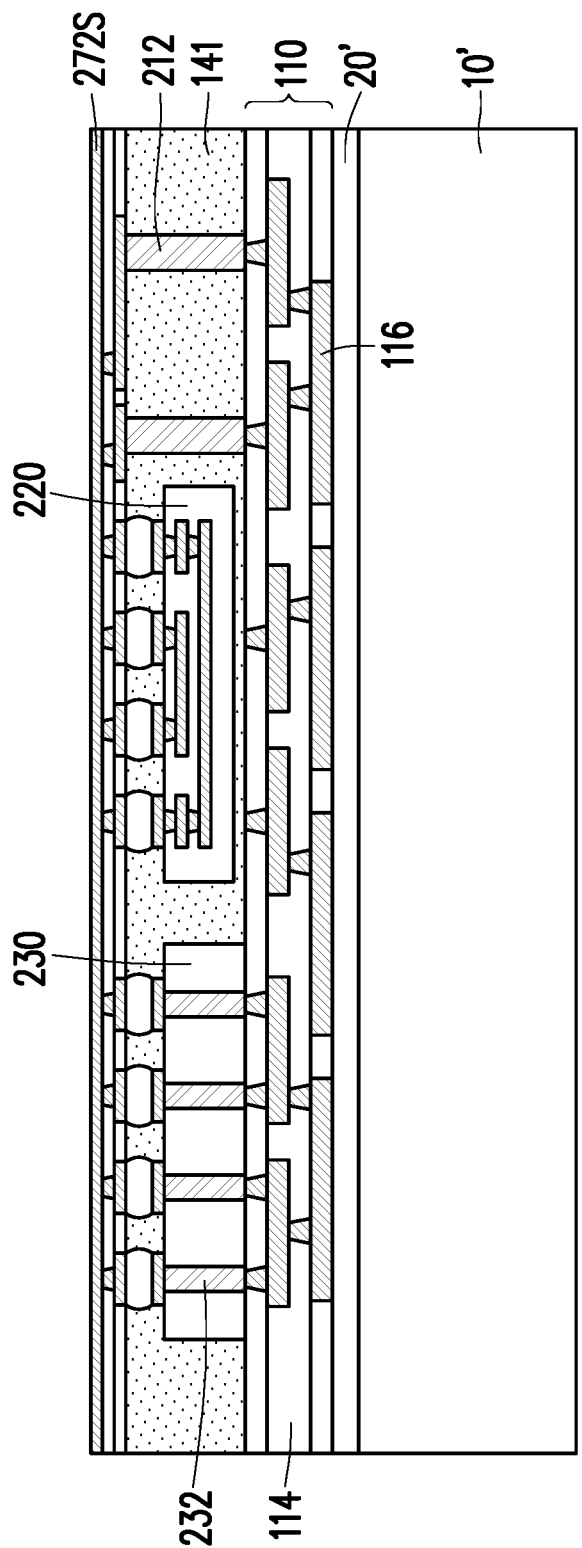
Figure 15J:
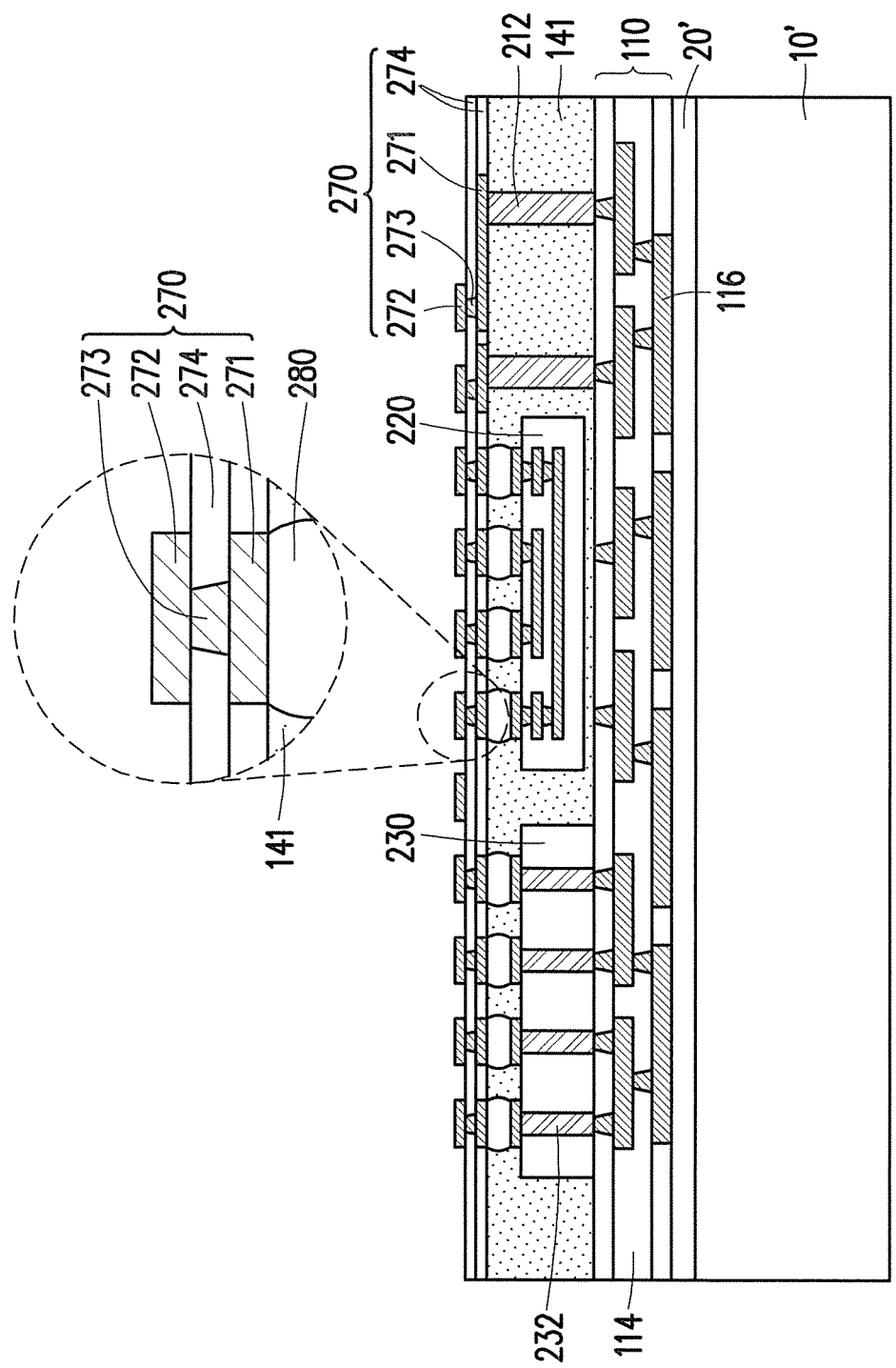
Figure 15K:
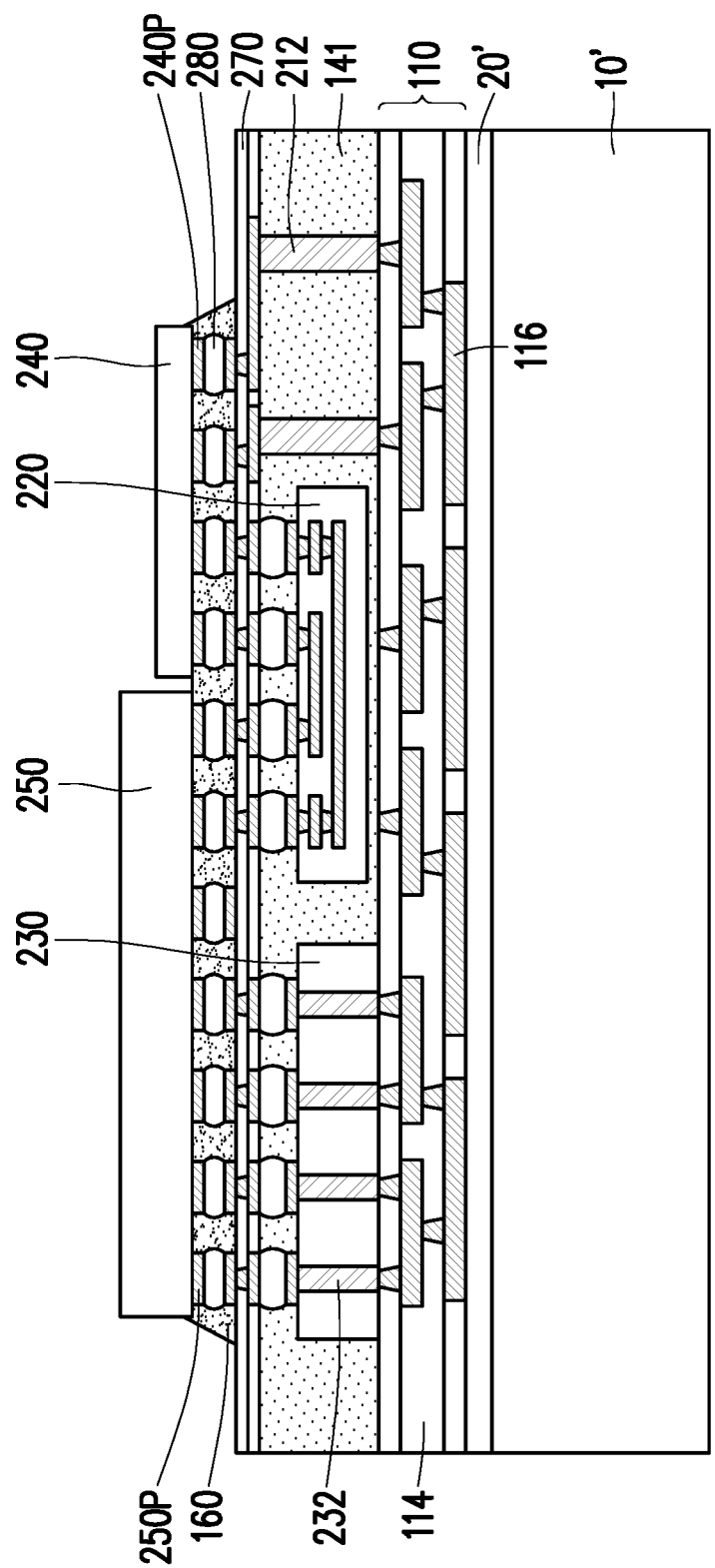
Figure 15L:
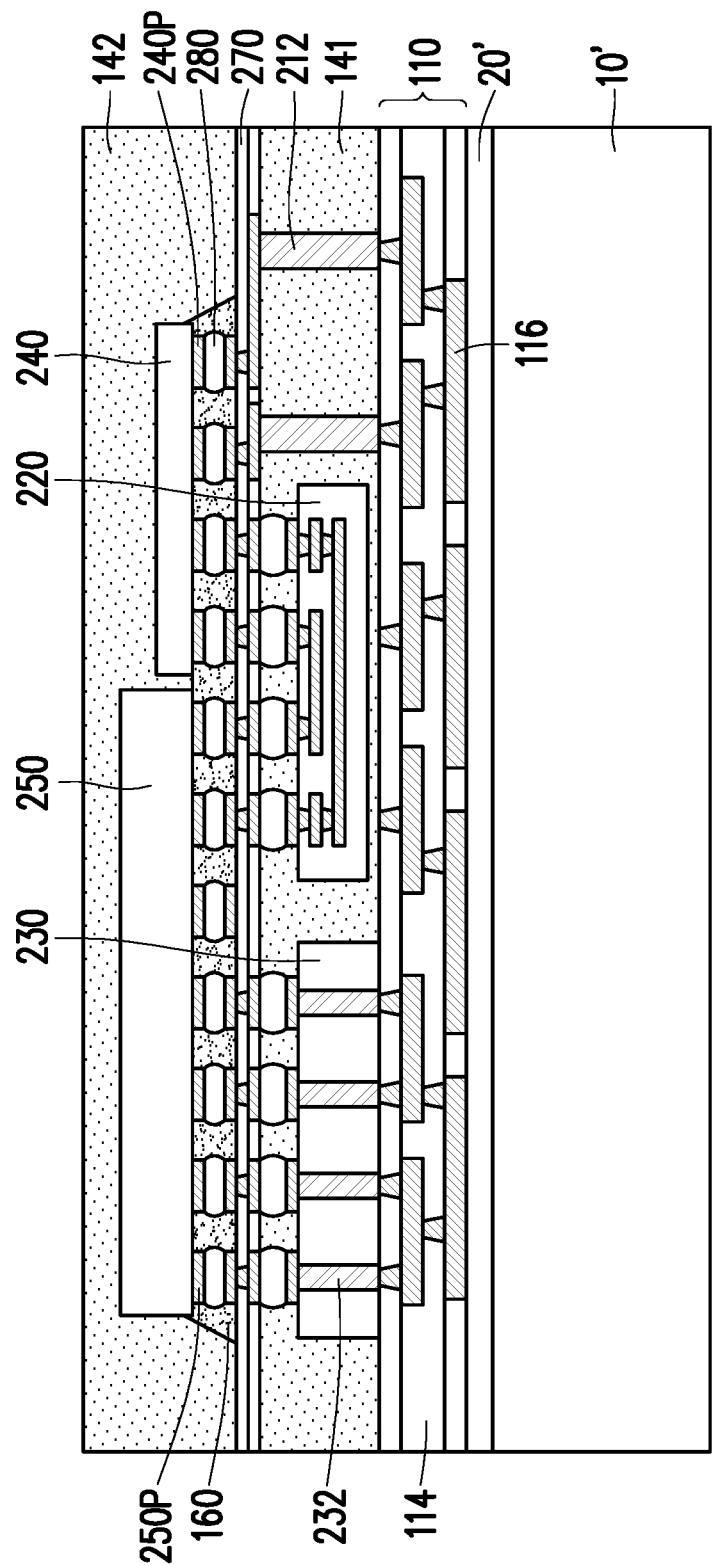
Figure 15M:
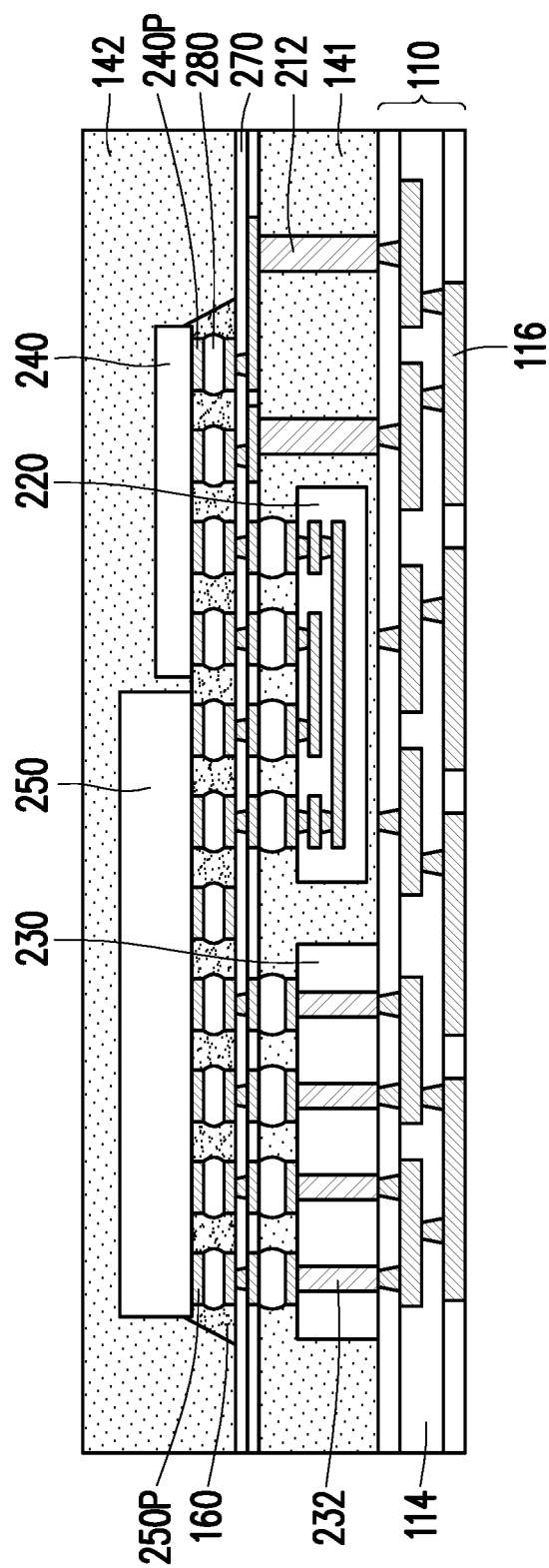
Figure 15N:
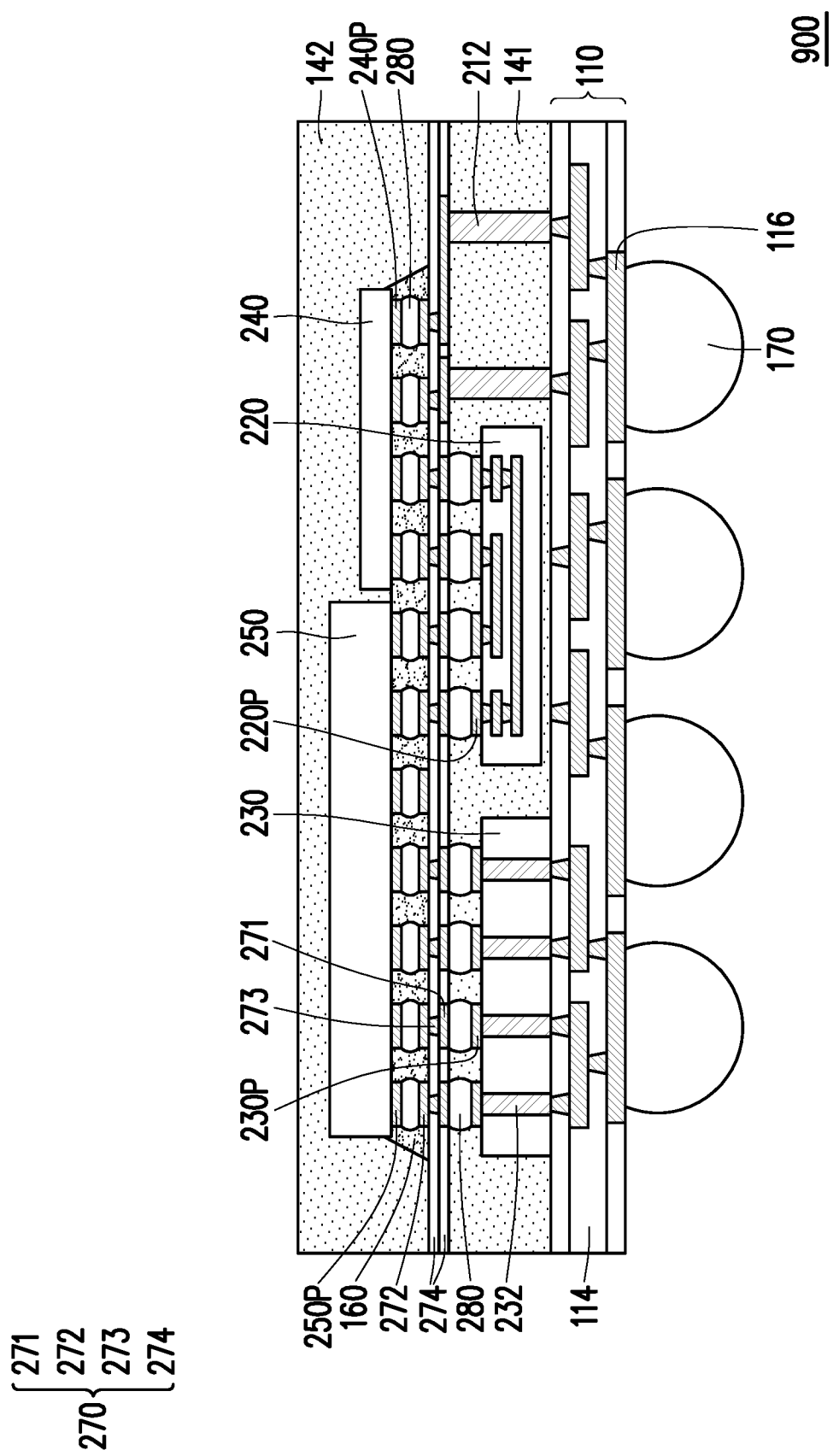

FIG. 15A to FIG. 15N are cross-sectional views of steps of a manufacturing process for manufacturing a multi-chip package 900 according to an embodiment of the disclosure. In FIGS. 15A to 15N, the same reference numerals as those in FIGS. 13A to 14O are used to denote the same or similar elements as those in FIGS. 13A to 14O. Therefore, detail descriptions of the elements with the same reference numerals may be referred to the descriptions provided above with reference to FIGS. 13A to 14O, and will not be repeated. The following descriptions will be focused on the process and structural differences between the multi-chip package 900 shown in FIG. 15N, the multi-chip package 700 shown in FIG. 13K, and the multi-chip package 800 shown in FIG. 14O.

Referring to FIG. 15A, a carrier 10 is provided. A release film 20 and a conductive material layer 272S may be sequentially formed on a carrier 10. The conductive material layer 272S may be formed by sputtering or depositing conductive materials such as titanium and/or copper on the release film 20 to form a seed layer, and then a conductive material layer 272S is formed on the seed layer by an electroplating process. The conductive material layer 272S may include a conductive material such as copper (Cu), silver (Ag), palladium (Pd), aluminum (Al), nickel (Ni), titanium (Ti), gold (Au), platinum (Pt), tungsten (W), or an alloy thereof.

Referring to FIG. 15B, the dielectric layer 274 may be formed on the conductive material layer 272S by a method such as spin coating, chemical vapor deposition (CVD), plasma-enhanced chemical vapor deposition (PECVD), etc. Next, an opening is formed in the dielectric layer 274 to expose the conductive material layer 272S thereunder. Next, for example, a plating process may be applied to fill the opening of the dielectric layer 274 with conductive materials to form a conductive via pattern 273 and a first conductive pattern 271. The width of the conductive via pattern 273 in the cross-sectional view may vary. For example, the width of the conductive via pattern 273 closer to the first conductive pattern 271 may be greater than the width of the conductive via pattern 273 closer to the conductive material layer 272S. Next, a conductive post 212 electrically connected to the first conductive pattern 271 is formed on the first conductive pattern 271.

Referring to FIG. 15C, a first lower semiconductor chip 220 and a second lower semiconductor chip 230 may be connected to the first conductive pattern 271, for example, by a bonding structure 280 such as a bump. The first lower semiconductor chip 220 and the second lower semiconductor chip 230 may thus be electrically connected to the conductive post 212.

Referring to FIGS. 15D and 15E, an encapsulant material layer covering the first lower semiconductor chip 220, the second lower semiconductor chip 230, and the conductive post 212 is formed on the carrier 10 by a suitable process (such as a molding process or a deposition process). Then, a wafer grinding process or a surface planarization process is executed, so that a surface of the conductive post 212 and a surface of the conductive through-via structure 232 of the second lower semiconductor chip 230 are exposed. That is, the surface of the conductive post 212 and the back surface of the second lower connection conductor 230 are located at the same level. In other words, the upper surface of the first conductive post 212, the back surface of the second conductive post 230, and the first encapsulant 141 are coplanar. Meanwhile, the back surface of the first lower semiconductor chip 220 is completely covered by the first encapsulant 141, but the disclosure is not limited thereto. For example, the back surface of the first lower semiconductor chip 220 may also be exposed from the first encapsulant 141.

Referring to FIG. 15E and FIG. 15F, a redistribution circuit structure 110 including a redistribution circuit layer 116 and a dielectric layer 114 is formed on a structure shown in FIG. 15E by thin film processes.

Specifically, the dielectric layer 114 may be formed on a structure shown in FIG. 15E by a method such as spin coating, chemical vapor deposition (CVD), plasma-enhanced chemical vapor deposition (PECVD), etc. Next, an opening is formed in the dielectric layer 114 to expose the conductive through-via structure 232 and the conductive post 212 thereunder. The width of the opening of the dielectric layer 114 in the cross-sectional view may vary. For example, the upper width of the opening may be greater than the lower width. Therefore, the upper width of a portion of the redistribution circuit layer 116 filling in the opening may also be larger than the lower width. Then, the redistribution circuit layer 116 is formed on a surface of the dielectric layer 114 and a surface of the opening of the dielectric layer 114.

Referring to FIGS. 15F-15I, another release film 20' and another carrier 10' may be formed on a structure shown in FIG. 15F, and a structure shown in FIG. 15I is obtained by upside down the resultant structure and removed the release film 20 and the carrier 10 by a release process.

Referring to FIGS. 15I and 15J, an interposer connection structure 270 including a dielectric layer 274, a first conductive pattern 271, a second conductive pattern 272, and a conductive via pattern 273 penetrating the dielectric layer 274 to connect the first conductive pattern 271 and the second conductive pattern 272 may be formed by performing a patterning process on the conductive material layer 272S.

The manufacturing processes of FIGS. 15K-15N are the same as or similar to the manufacturing processes described with reference to FIGS. 14L-14O, and therefore will not be repeated.

Referring to FIG. 15N, the multi-chip package 900 shown in FIG. 15N and the multi-chip package 800 shown in FIG. 14O have similar structures except the multi-chip package 900 shown in FIG. 15N does not have the protective layer 165 on the active surfaces of the first and second lower semiconductor chips 220 and 230 and the first lower connection conductor 220P of the first lower semiconductor chip 220 and the second lower connection conductor 230P of the second lower semiconductor chip 230 are connected to the corresponding first conductive pattern 272 through the bonding structure 280 in the multi-chip package 900 shown in FIG. 15N. Further, the width of the conductive via pattern 273 of the multi-chip package 900 shown in FIG. 15N closer to the second conductive pattern 272 is less than the width of the conductive via pattern 273 closer to the first conductive pattern 271, and the width of the conductive via pattern 273 of the multi-chip package 800 shown in FIG. 14O closer to the second conductive pattern 272 is larger than the width of the conductive via pattern 273 closer to the first conductive pattern 271 (see FIG. 14K).

Figure 16:
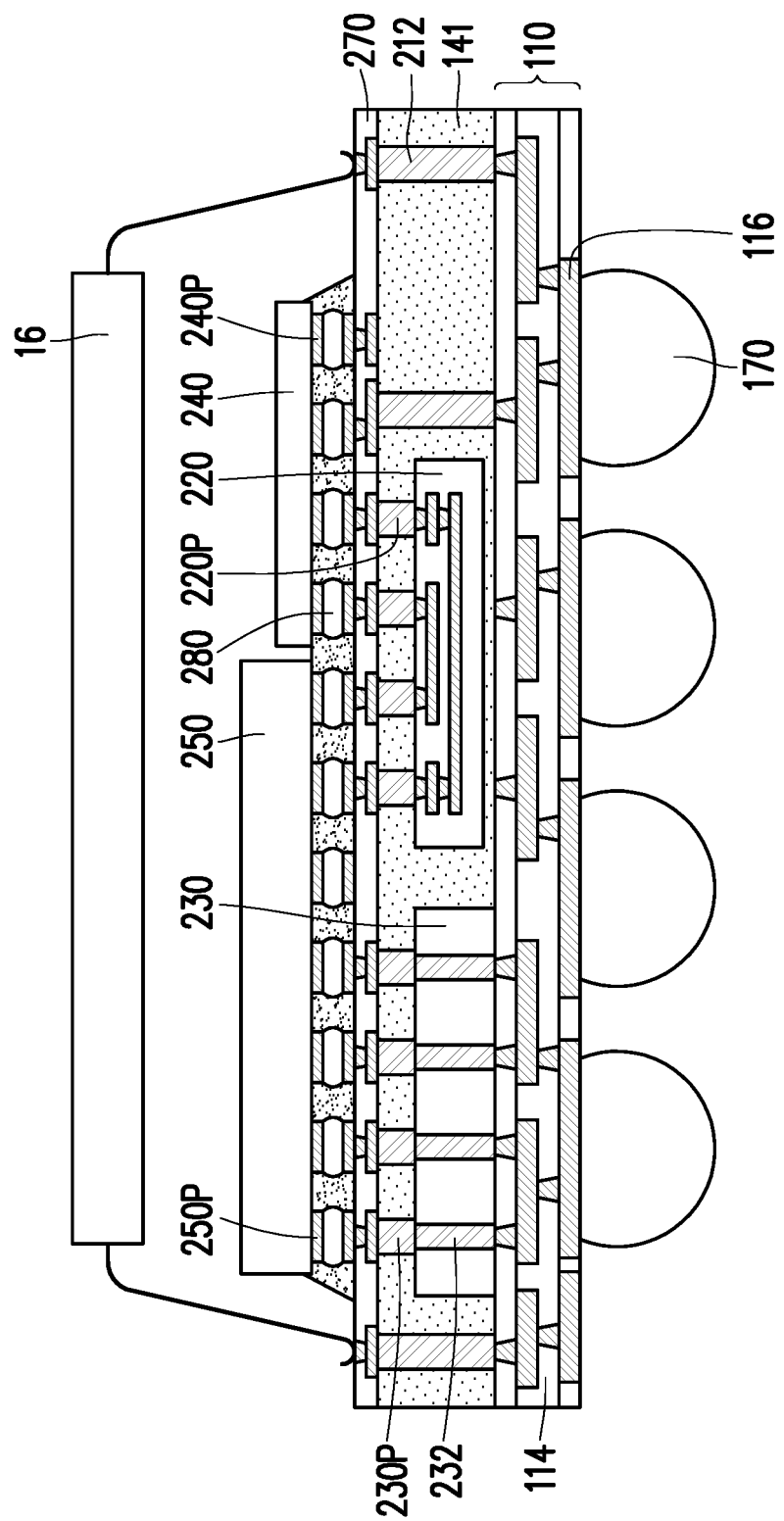
FIG. 16 is a cross-sectional view illustrating a PoP according to an embodiment of the disclosure.

FIG. 16 is a cross-sectional view of a PoP according to an embodiment of the disclosure. The same or similar components in the PoP shown in FIG. 16 as aforementioned are given the same reference numerals and the descriptions of the components having the same reference numerals are the same as the aforementioned, which will not be reiterated.

Referring to FIG. 16, a package on package (PoP) according to an embodiment of the disclosure comprises any of the multi-chip packages 700, 800, and 900 and another semiconductor chip 16. The semiconductor chip 16 may be located above the first upper semiconductor chip 240 and the second upper semiconductor chip 250 and connected to the interposer connection structure 270, for example, by a connection structure such as pins, such that the semiconductor chip 16 may be electrically connected to the redistribution circuit structure 110 through the pin, the interposer connection structure 270, and the conductive post 212.

Figure 17:
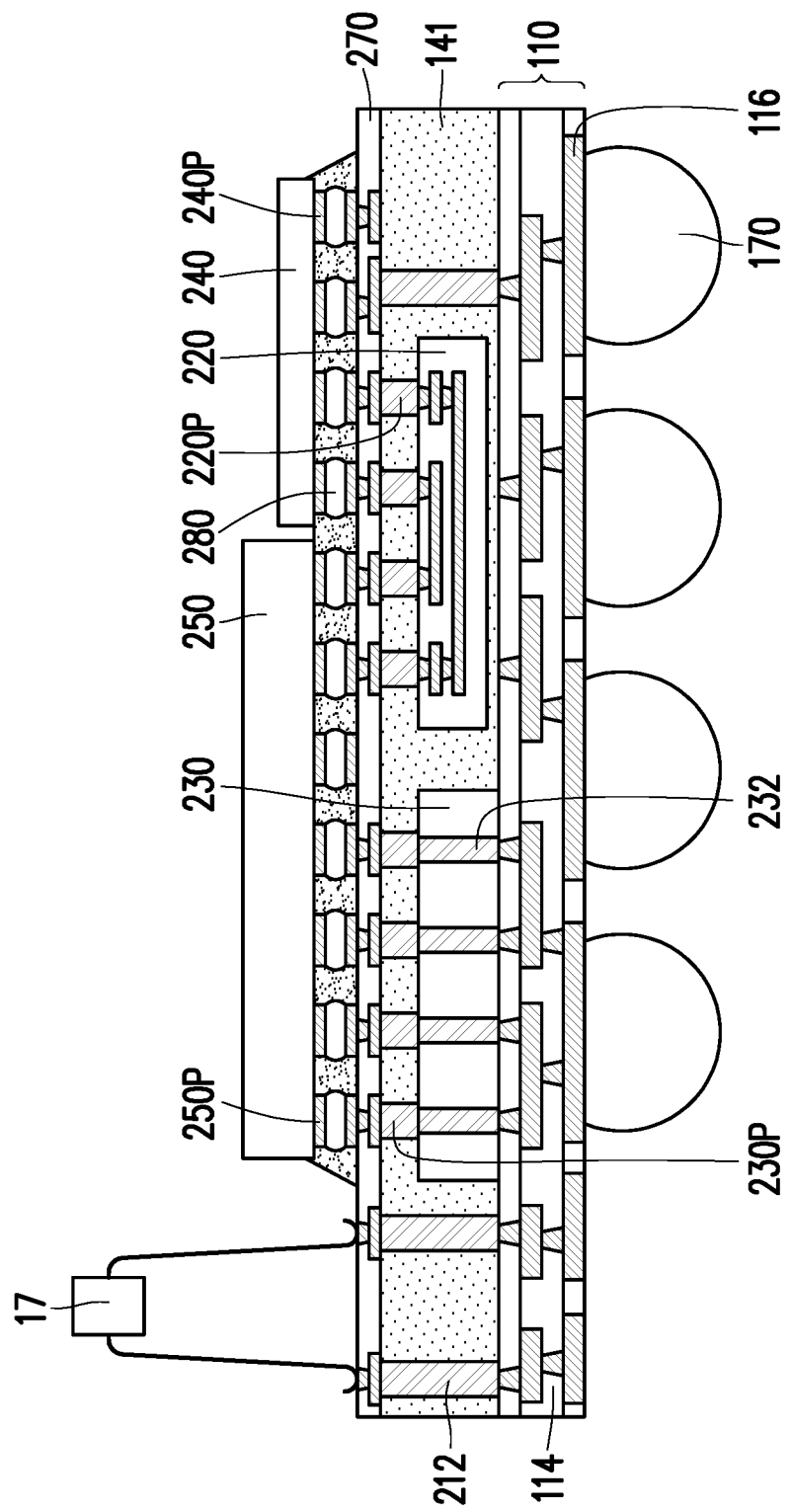
FIG. 17 is a cross-sectional view illustrating a PoP according to an embodiment of the disclosure.

FIG. 17 is a cross-sectional view of a PoP according to an embodiment of the disclosure. The package on package shown in FIG. 17 is the same as or similar to the package on package shown in FIG. 16 except a semiconductor chip 17 is used instead of the semiconductor chip 16. The semiconductor chip 17 may have a smaller size, and may be mounted side by side with the first upper semiconductor chip 240 and the second upper semiconductor chip 250 on the interposer connection structure 270.

Figure 18:
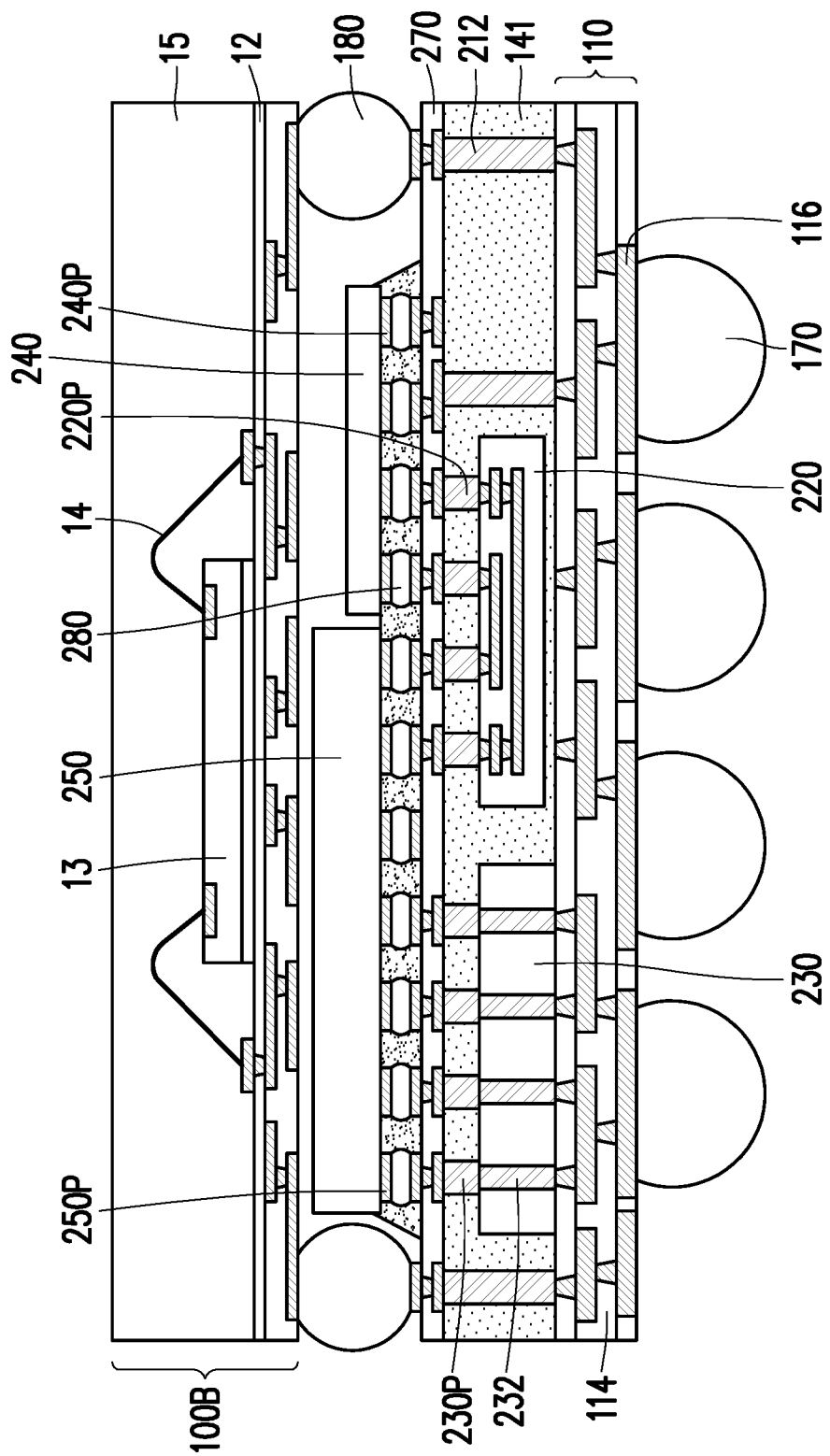
FIG. 18 is a cross-sectional view illustrating a PoP according to an embodiment of the disclosure.

FIG. 18 is a cross-sectional view of a PoP according to an embodiment of the disclosure. The same or similar components in the PoP shown in FIG. 18 as aforementioned are given the same reference numerals and the descriptions of the components having the same reference numerals are the same as the aforementioned, which will not be reiterated.

Referring to FIG. 18, a PoP according to an embodiment of the disclosure includes any of the multi-chip packages 700, 800, and 900 mentioned above, an upper semiconductor package 100B, and intermediate conductive terminals 180 connecting the multi-chip package and the upper semiconductor package 100B. The upper semiconductor package 100B includes a substrate 12, a semiconductor chip 13, and an encapsulant 15. The semiconductor chip 13 may be disposed on the substrate 12 facing up and connected to a circuit layer (not shown) in the substrate 12 by a welding wire 14. The encapsulant 15 is disposed on the substrate 12 and encapsulates the semiconductor chip 13 and the welding wire 14. The intermediate conductive terminals 180 are located on the interposer connection structure 270 and is electrically connected to the interposer connection structure 270. The intermediate conductive terminal 180 is, for example, a solder ball, but the disclosure is not limited thereto.

Unless there are other obviously contradictory or obviously different descriptions, the related descriptions of the components with the same reference numerals in the above embodiments are also applicable to the components with the same reference numerals in this embodiment, which will not be reiterated here.

In summary, the multi-chip package of the disclosure can shorten the power and/or signal transmission path in the multi-chip package, thereby improving the overall performance of the multi-chip package.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

In summary, the multi-chip package of the disclosure can shorten the power and/or signal transmission path in the multi-chip package, thereby improving the overall performance of the multi-chip package.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A multi-chip package, comprising:
    an interposer connection structure having a first surface and a second surface opposite to the first surface and including a conductive pattern, the conductive pattern comprising a first conductive pattern disposed on the first surface of the interposer connection structure;
    a conductive post disposed on the first surface of the interposer connection structure and electrically connected to the conductive pattern;
    a first lower semiconductor chip and a second lower semiconductor chip disposed side by side on the first surface of the interposer connection structure and electrically connected to the conductive pattern;
    a first upper semiconductor chip and a second upper semiconductor chip disposed side by side on the second surface of the interposer connection structure and electrically connected to the conductive pattern;
    a first encapsulant disposed on the first surface of the interposer connection structure and encapsulating at least portions of the conductive post, the first lower semiconductor chip, and the second lower semiconductor chip;
    a redistribution circuit structure disposed above the first encapsulant; and
    a bonding structure bonding the interposer connection structure and one or more of the first lower semiconductor chip, the second lower semiconductor chip, the first upper semiconductor chip, and the second upper semiconductor chip,
    wherein the first upper semiconductor chip overlaps with the first lower semiconductor chip and the conductive post in a direction perpendicular to the first surface of the interposer connection structure, and
    the second upper semiconductor chip overlaps with the first lower semiconductor chip and the second lower semiconductor chip in the direction perpendicular to the first surface of the interposer connection structure,
    wherein the first lower semiconductor chip includes a first lower connection conductor and the second lower semiconductor chip includes a second lower connection conductor,
    the first lower connection conductor and the second lower connection conductor are coupled to the first conductive pattern, and
    wherein the first lower semiconductor chip is spaced apart from the redistribution circuit structure with the first encapsulant therebetween,
    wherein a surface of the second lower semiconductor chip away from the interposer connection structure, a surface of the first encapsulant away from the interposer connection structure, and a surface of the conductive post away from the interposer connection structure are coplanar with each other and directly contact the redistribution circuit structure.

2. The multi-chip package according to claim 1, wherein the second lower semiconductor chip includes a conductive through-via structure and is electrically connected to the redistribution circuit structure.

3. The multi-chip package according to claim 1, wherein the conductive pattern further comprises:
    a second conductive pattern disposed on the second surface of the interposer connection structure,
    a conductive via pattern disposed between the first conductive pattern and the second conductive pattern and connecting the first conductive pattern and the second conductive pattern.

4. The multi-chip package according to claim 3, wherein a width of the conductive via pattern closer to the second conductive pattern is greater than a width of the conductive via pattern closer to the first conductive pattern.

5. The multi-chip package according to claim 3, wherein a width of the conductive via pattern closer to the second conductive pattern is smaller than a width of the conductive via pattern closer to the first conductive pattern.

6. The multi-chip package according to claim 3, wherein the first upper semiconductor chip includes a first upper connection conductor and the second upper semiconductor chip includes a second upper connection conductor, and the first upper connection conductor and the second upper connection conductor are coupled to the second conductive pattern.

7. The multi-chip package according to claim 1, wherein the bonding structure includes a bonding metal having a melting point of less than 200° C.

8. The multi-chip package according to claim 1, wherein at least one of the first upper semiconductor chip and the second upper semiconductor chip includes a conductive through-via structure, and the multi-chip package further comprises:
a top semiconductor chip located above the first upper semiconductor chip and the second upper semiconductor chip and electrically connected to the conductive through-via structure.

* * * * *